United States Patent
Taoka et al.

(10) Patent No.: US 6,343,370 B1
(45) Date of Patent: Jan. 29, 2002

(54) APPARATUS AND PROCESS FOR PATTERN DISTORTION DETECTION FOR SEMICONDUCTOR PROCESS AND SEMICONDUCTOR DEVICE MANUFACTURED BY USE OF THE APPARATUS OR PROCESS

(75) Inventors: Hironobu Taoka; Koichi Moriizumi, both of Tokyo (JP)

(73) Assignee: Mitsubishi Denki Kabusiki Kaisha, Yokyo (JP)

( * ) Notice: Subject to any disclaimer, the term of this patent is extended or adjusted under 35 U.S.C. 154(b) by 0 days.

(21) Appl. No.: 09/203,582

(22) Filed: Dec. 2, 1998

(30) Foreign Application Priority Data

| Dec. 5, 1997 | (JP) | 9-335711 |
| Jul. 27, 1998 | (JP) | 10-211522 |
| Oct. 9, 1998 | (JP) | 10-287975 |
| Nov. 27, 1998 | (JP) | 10-337710 |

(51) Int. Cl.[7] .............................................. G06F 17/50
(52) U.S. Cl. .............................. 716/21; 716/4; 700/110; 700/121
(58) Field of Search .................... 716/1–21; 700/97–98, 700/108–110, 121

(56) References Cited

U.S. PATENT DOCUMENTS

| 4,581,537 | A | | 4/1986 | Guillaume et al. ...... 250/491.1 |
| 5,530,372 | A | * | 6/1996 | Lee et al. .................... 324/758 |
| 5,553,274 | A | * | 9/1996 | Liebmann ..................... 716/21 |
| 5,663,893 | A | * | 9/1997 | Wampler et al. ............... 716/19 |
| 5,795,688 | A | * | 8/1998 | Burdorf et al. ................ 430/30 |
| 5,801,954 | A | * | 9/1998 | Le et al. ........................ 716/21 |
| 5,862,058 | A | * | 1/1999 | Samuels et al. ............... 716/21 |
| 5,879,844 | A | * | 3/1999 | Yamamoto et al. ........... 430/30 |
| 5,920,487 | A | * | 7/1999 | Reich et al. ................... 716/21 |
| 6,081,658 | A | * | 1/2000 | Reiger et al. .................. 716/21 |
| 6,154,714 | A | * | 1/2000 | Lepejian ...................... 702/118 |
| 6,078,738 | A | * | 6/2000 | Garza et al. ................... 716/21 |

FOREIGN PATENT DOCUMENTS

| JP | 60-201630 | 10/1985 | ........... H01L/21/30 |
| JP | 08-334888 | 12/1996 | ............. G03F/1/08 |

OTHER PUBLICATIONS

"Fast Chip Level OPC Method on Mask Database", by Hidetoshi Ohnuma, et al., SPIE vol. 3096, 1997, pp. 145–153.

"Simple Method of Correcting Optical Proximity for 0.35um Logic LSI Circuits", by Eiichi Kawamura, et al., Japanese Journal of Applied Physics, vol. 34, Dec. 1995, pp. 6547–6551.

"Automated Determination of CAD Layout Failures Through Focus: Experiment and Simulation", by Chris Spence, et al., SPIE vol. 2197, 1994, pp. 302–313.

* cited by examiner

Primary Examiner—Matthew Smith
Assistant Examiner—Phallaka Kik
(74) Attorney, Agent, or Firm—McDermott, Will & Emery

(57) ABSTRACT

A finished pattern that will be formed based on a design layout pattern in a semiconductor manufacturing process is predicted, and the outline of the predicted finished pattern is converted into a polygon. On the other hand, test reference patterns are formed based on the design layout pattern. A pattern distortion in the predicted finished pattern is detected by comparing the polygonized predicted finished pattern with the test referencepatterns. In converting the predicted finished pattern into a polygon, the number of apices of the polygon is reduced. Two kinds of test reference patterns are formed: an upper limit test reference pattern obtained by reducing the design layout pattern and defining an allowable upper limit and a lower limit test reference pattern obtained by enlarging the design layout pattern and defining an allowable lower limit.

20 Claims, 40 Drawing Sheets

FIG. 47
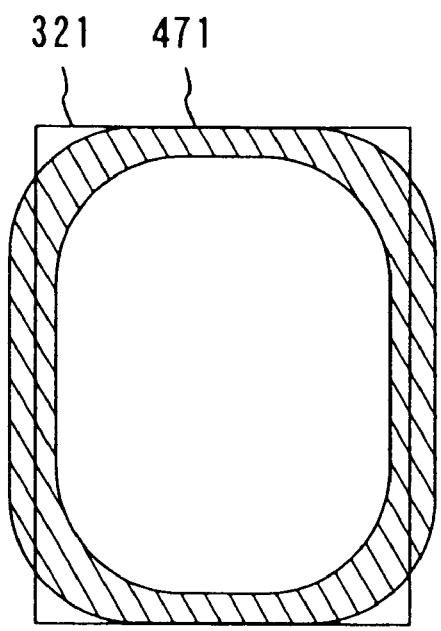 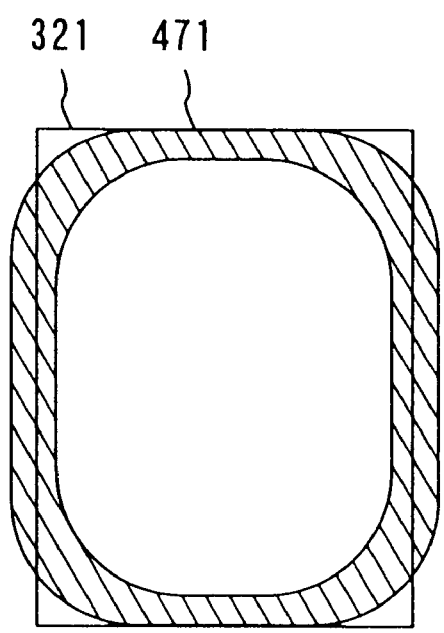

APPARATUS AND PROCESS FOR PATTERN DISTORTION DETECTION FOR SEMICONDUCTOR PROCESS AND SEMICONDUCTOR DEVICE MANUFACTURED BY USE OF THE APPARATUS OR PROCESS

BACKGROUND OF THE INVENTION

1. Field of the Invention

The present invention relates to a pattern distortion detecting apparatus and method for detecting a pattern distortion that may occur in pattern forming processes such as photolithography and etching used in semiconductor manufacture. More specifically, the invention relates to a pattern distortion detecting apparatus and method for detecting a portion where a pattern distortion out of an allowable range may occur by predicting patterns that will be formed in a semiconductor manufacturing process and by detecting differences between the predicted patterns and design layout patterns.

2. Background Art

At present, the design rules of semiconductor devices have reached the 0.2 μm level and this value is smaller than light source wavelengths (0.248 μm in the case of an excimer laser) of steppers for transfer of such patterns. Since the resolution performance deteriorates significantly in this circumstance, it is attempted to improve the resolution performance by using a special transfer technique such as a modified illumination technique.

Where the modified illumination is employed, the pattern fidelity deteriorates though the resolution performance is improved. This will be explained below with reference to FIG. 16, which shows an example of the optical proximity effect in pattern formation. More specifically, FIG. 16 shows how a dimension of resist patterns that are formed by using a modified illumination technique varies as the distance between adjacent patterns, i.e. the pitch, is changed for design layout patterns whose line width is fixed at 0.25 μm.

As seen from FIG. 16, the resist dimension sharply varies when the pitch is changed in a range of 0.5–1.0 μm. Our experiments showed that the amount of this variation, which depends on the process conditions, is 0.05 μm at the maximum. Such a large variation amount is not allowable in view of the dimensional accuracy required in forming 0.25 μm devices is within ±0.03 μm.

Also in etching processes, variations in pattern dimensions may occur due to differences in the density of miniaturized patterns.

The pitch inspection technique is one of the techniques that have been developed to solve the above problem. FIG. 17 shows an example of a pitch inspection method. In this pitch inspection method, patterns 161–164 having a particular line width L are extracted. Then, the sidelines 165 and 166 are extracted as a pair of side lines which has a particular distance S2 among a combination of a sideline of one of the patterns 161–164 and a sideline of another pattern that is adjacent to the former sideline. With the pitch defined as the sum of the line width of a pattern and the distance between adjacent sidelines, this method enables recognition as to whether there exists a pattern having a particular line width and pitch. If a pattern having a particular line width and pitch is detected, the layout patterns are modified when necessary.

A problem of the above pitch inspection method will be described below with reference to FIG. 18. According to the above method, the entirety of each of patterns 171, 172, 174, and 175 and part of a pattern 173 are extracted as patterns having a particular line width L1. Then, among the sidelines of the extracted patterns, sidelines 176, 177, and 179 are extracted as sidelines having a particular value S2 as a distance to the sideline of an adjacent pattern. However, among the extracted sidelines, the sideline 179 and a sideline 178 that is part of the sideline 176 are sidelines that should not be extracted. This is because a variation in pattern dimension as shown in FIG. 16 exceeds the allowable range when only patterns of the same line width are arranged adjacent to each other, a dimensional variation larger than the allowable range does not necessarily occur when a pattern width is large as in the case of the sideline 178. In the case of the sideline 179 of which opposite sideline is short, there does not occur a dimensional variation larger than the allowable range. The conventional pitch inspection method thus has a problem that it cannot avoid the above types of detection errors.

SUMMARY OF THE INVENTION

The present invention has been made to solve the above problems in the conventional art, and an object of the present invention is therefore to provide a pattern distortion detecting apparatus and method which can detect a pattern distortion with high accuracy without causing detection errors.

Another object of the present invention is to provide a pattern distortion detecting apparatus and method which can inspect the portions in remarkable variations of predicted finished pattern dimensions considering the variations of a plurality of optical conditions and a plurality of patterns forming process conditions.

A further object of the present invention is to provide a pattern distortion detecting apparatus and method which can detect a pattern distortion in an important part of a circuit with high accuracy, as well as being able to do the inspection considering, for example, a contrast of an optical intensity.

A further object of the present invention is to provide a pattern distortion detecting apparatus and method by which pattern distortion errors are obtained more accurately by generating a plurality of different predicted patterns according to different optical or process conditions and performing logical figure operation between these patterns and the design layout pattern reference layout pattern.

According to one aspect of the present invention, in a pattern distortion detecting method in a semiconductor manufacturing process, a predicted finished layout pattern is formed based on a design layout pattern or a inspection layout pattern. An outline or a outline of the predicted finished layout pattern is converted into a polygon to generate a polygonized predicted finished layout pattern. A pattern distortion in said predicted finished layout pattern is detected by logical figure operation of the input data of said polygonized predicted finished layout patterns only or of said polygonized predicted finished layout patterns and said design layout pattern or inspection layout pattern.

In the pattern distortion detecting method, the number of apices of the polygonized predicted finished layout pattern may be reduced.

In the pattern distortion detecting method, in the step of forming a test reference layout pattern, an upper limit test reference layout pattern for defining an allowable upper limit may be formed by enlarging the design layout pattern, and a lower limit test reference layout pattern for defining an allowable lower limit may be formed by reducing the design layout pattern.

In the pattern distortion detecting method, an amount of the pattern distortion may be calculated , where the pattern distortion is detected, based on a difference between the design layout pattern or a reference layout pattern and the predicted finished layout pattern.

In the pattern distortion detecting method, it may be detected whether the finished layout pattern shrinks or expands more than the design layout pattern by comparing the polygonized predicted finished layout pattern with the test reference layout pattern.

In the pattern distortion detecting method, a graphical operation may be performed between the pattern distortion of the predicted layout pattern and another design layout layer, and pattern distortion information may be selected based on a pattern distortion information selecting conditions.

In the pattern distortion detecting method, a plurality of predicted finished layout patterns may be formed based on a design layout pattern or a inspection layout pattern corresponding to a plurality of optical conditions and/or a plurality of pattern forming process conditions. Further, contrast information of the predicted finished pattern may be obtained based on a difference pattern between the plurality of predicted finished layout patterns.

In the pattern distortion detecting method, a highly defined polygonized predicted finished pattern may be formed by performing graphical operations between the polygonized predicted finished pattern and the design layout pattern or a reference layout pattern based on a finished pattern predicting specification.

In the pattern distortion detecting method, a plurality of polygonized predicted finished patterns are formed corresponding to a plurality of optical conditions and/or a plurality of pattern forming process conditions. A plurality of highly-defined predicted finished patterns are formed by performing graphical operations between each of a plurality of the polygonized predicted finished patterns and the design layout patterns or reference layout patterns. Further, the plurality of highly-defined predicted finished patterns are merged.

In the pattern distortion detecting method, a plurality of polygonized predicted finished patterns are formed corresponding to a plurality of optical conditions and/or a plurality of pattern forming process conditions. Further, graphical operations are performed among a plurality of the polygonized predicted finished patterns to output the result as a predicted finished layout pattern.

According to another aspect of the present invention, in a pattern distortion detecting method, a plurality of predicted finished layout patterns is formed based on a design layout pattern or a inspection layout pattern corresponding to a plurality of optical conditions and/or a plurality of pattern forming process conditions. Further, graphical operations are performed on a plurality of finished predicted patterns to detect regions different among a plurality of the finished predicted patterns.

According to still another aspect to the present invention, a pattern distortion detecting apparatus for a semiconductor manufacturing process includes finished pattern predicting means for predicting a finished pattern to be formed based on a design layout pattern. Predicted finished pattern polygonizing means is provided for converting an outline of the predicted finished pattern into a polygon to generate a polygonized predicted finished pattern. And, pattern distortion detecting means is provided for detecting a pattern distortion in the predicted finished pattern by logical figure operation of the input data of said polygonized predicted finished layout patterns only or of said polygonized pre- dicted finished layout pattern and said design layout pattern or inspection layout pattern.

According to still another aspect to the present invention, a computer program recorded media is provided which records a computer program readable by a computer, and which enables pattern distortion detection in a semiconductor manufacturing process as described above. That is, by the computer program read into a computer, a process is performed to form data of design layout pattern, inspection layout pattern or reference layout pattern in a memory area. Another process is performed to form a predicted finished layout pattern based on a design layout pattern or an inspection layout pattern. Another process is performed to convert an outline of said predicted finished layout pattern into a polygon to generate a polygonized predicted finished layout pattern. Further, still another process is performed to detect a pattern distortion in said predicted finished layout pattern by logical figure operation of the input data of said polygonized predicted finished layout patterns only or of said polygonized predicted finished layout patterns and said design layout pattern or inspection layout pattern.

Other and further objects, features and advantages of the invention will appear more fully from the following description.

BRIEF DESCRIPTION OF THE DRAWINGS

FIG. 47 shows a concrete example of a pattern in FIG. 32 as a result of decreasing its size by a method according to the eighth embodiment.

DETAILED DESCRIPTION OF THE PREFERRED EMBODIMENTS

This invention will be described in further detail by way of examples with reference to the accompanying drawings.

First Embodiment

Figure 1:
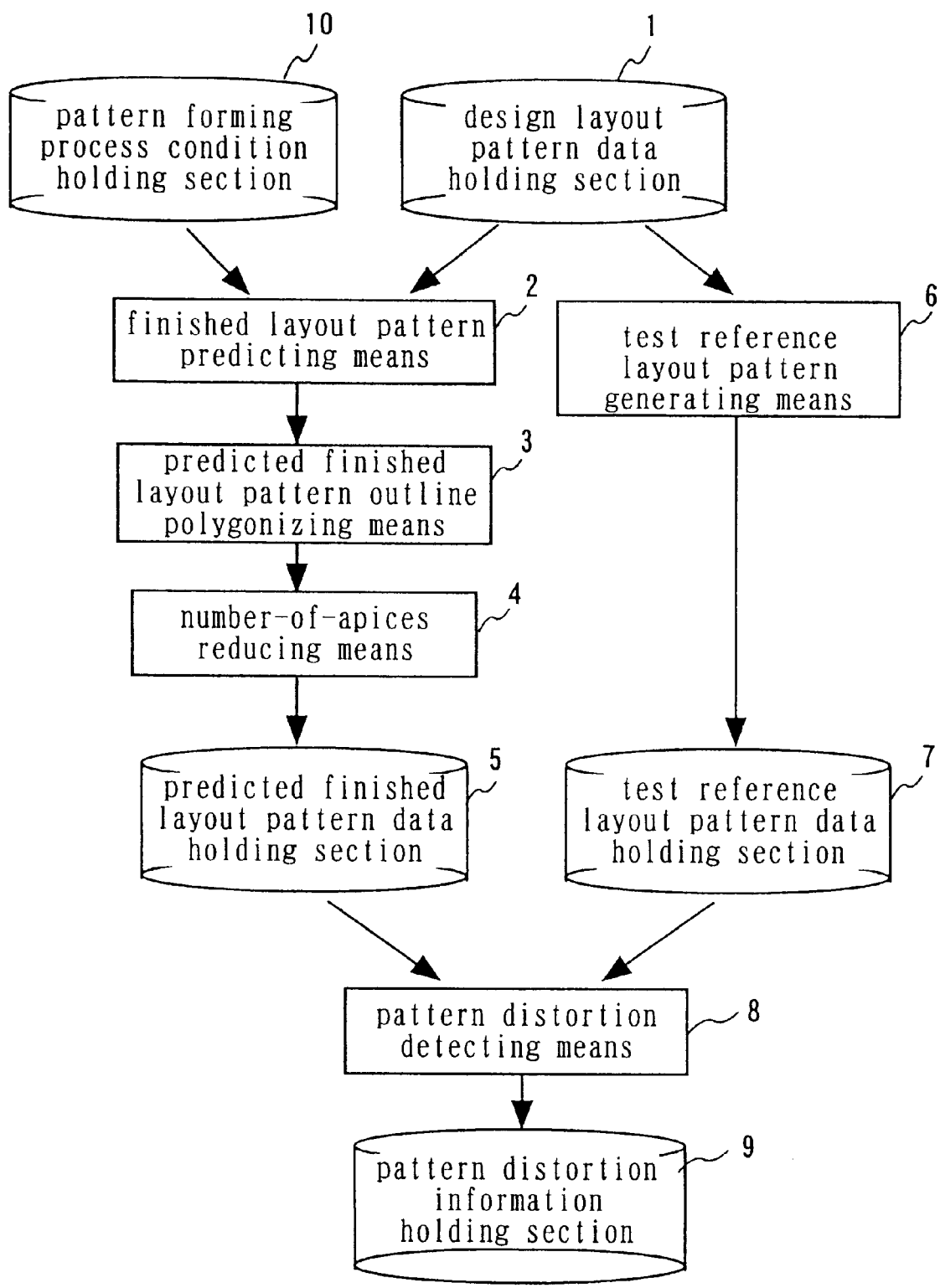
FIG. 1 is a block diagram showing the configuration of a pattern distortion detecting apparatus according to a first embodiment of the present invention.

FIG. 1 is a block diagram showing the configuration of a pattern distortion detecting apparatus according to a first embodiment of the invention. In FIG. 1, a design layout pattern data holding section 1 holds design layout patterns. A finished patterns predicting means 2 predicts, by a simulation or the like, shapes of finished patterns after a pattern transfer process and an etching process. A predicted finished pattern outlines polygonizing means 3 converts the outlines of the finished patterns into polygon data (in the forms of a list of apex coordinates) based on data that are output from the finished patterns predicting means 2. A number-of-apices reducing means 4 reduces the number of apices of each of the polygons that are output from the predicted finished pattern outlines polygonizing means 3 into a proper number of apices that can be handled by general CAD software. A predicted finished pattern data holding section 5 holds the polygon data that have been subjected to the number-of-apices reduction.

A test reference patterns generating means 6 generates reference patterns to be used for detecting a pattern distortion larger than an allowable range from the design layout pattern data. Reference numeral 7 denotes a test reference pattern data holding section. A pattern distortion detecting means 8 extracts a portion where a pattern distortion larger than the allowable range occurs by comparing the predicted finished patterns with the test reference patterns. Reference numerals 9 and 10 denote a pattern distortion information holding section and a patterns forming process conditions holding section, respectively.

The operation of the pattern distortion detecting apparatus having the above configuration will be hereinafter described with reference to FIGS. 2–9.

Figure 2:
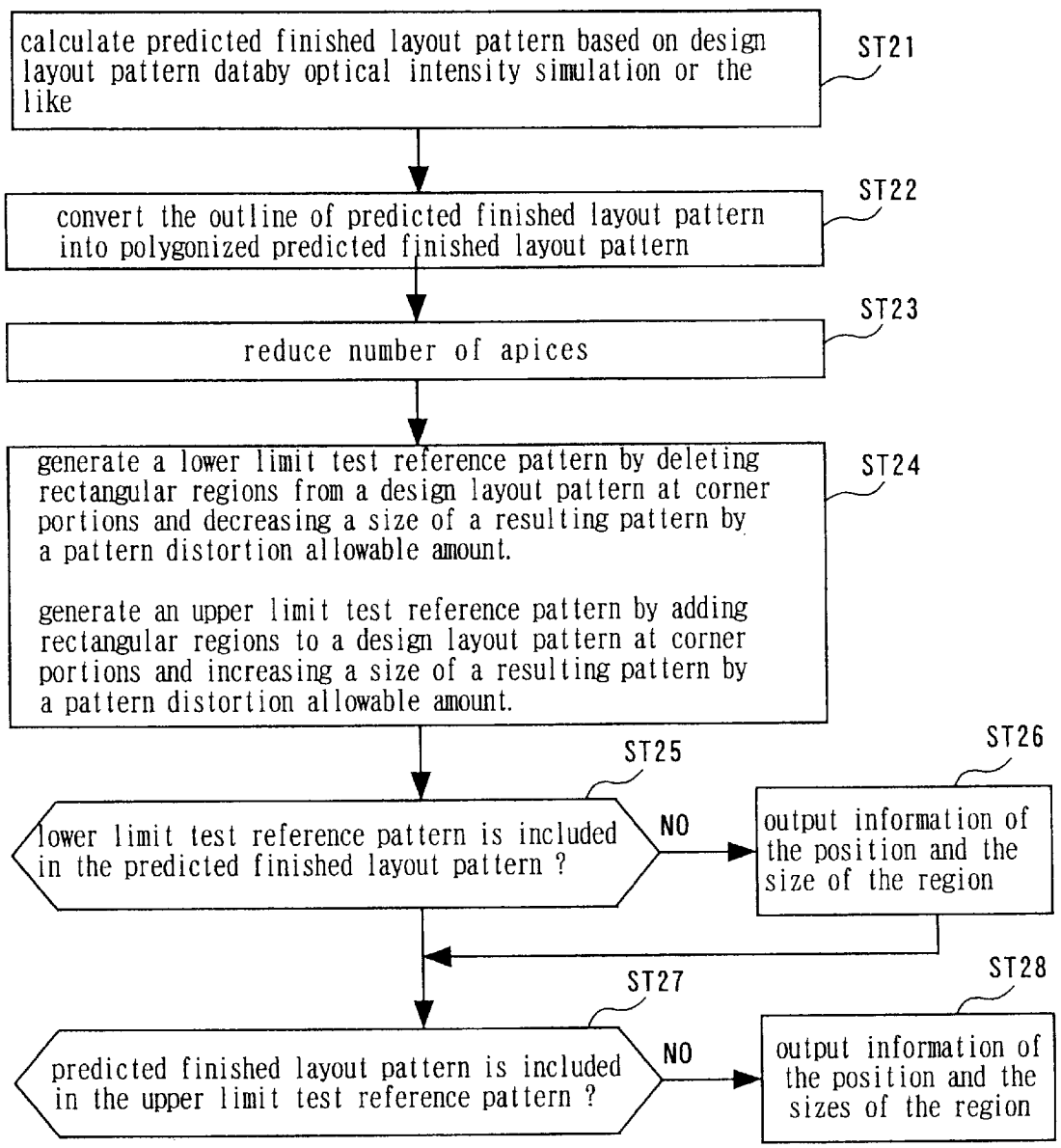
FIG. 2 is a flowchart showing the operation of the pattern distortion detecting apparatus according to a first embodiment of the present invention.
Figure 3:
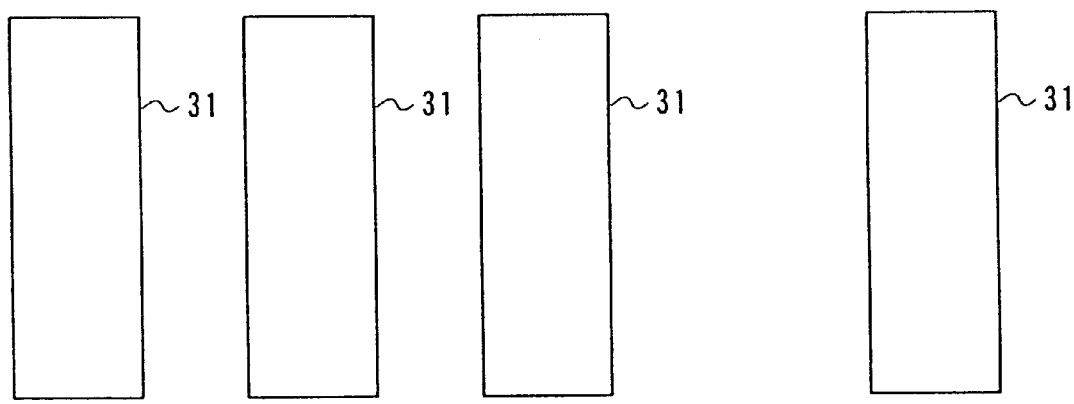
FIG. 3 shows design layout patterns.
Figure 4:
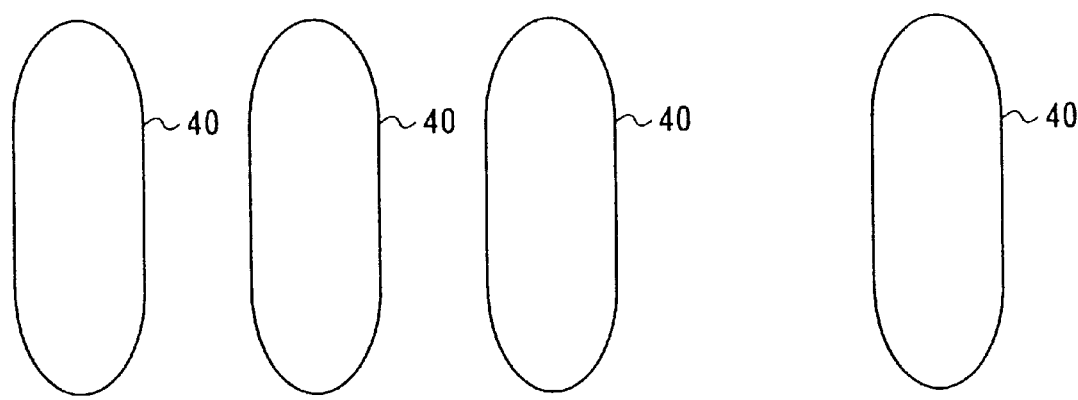
FIG. 4 shows predicted finished patterns.
Figure 5:
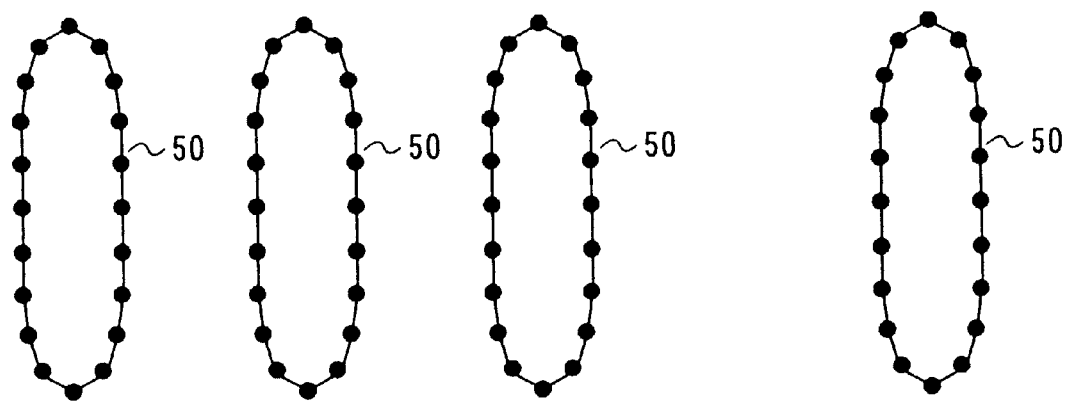
FIG. 5 shows polygon patterns.
Figure 6:
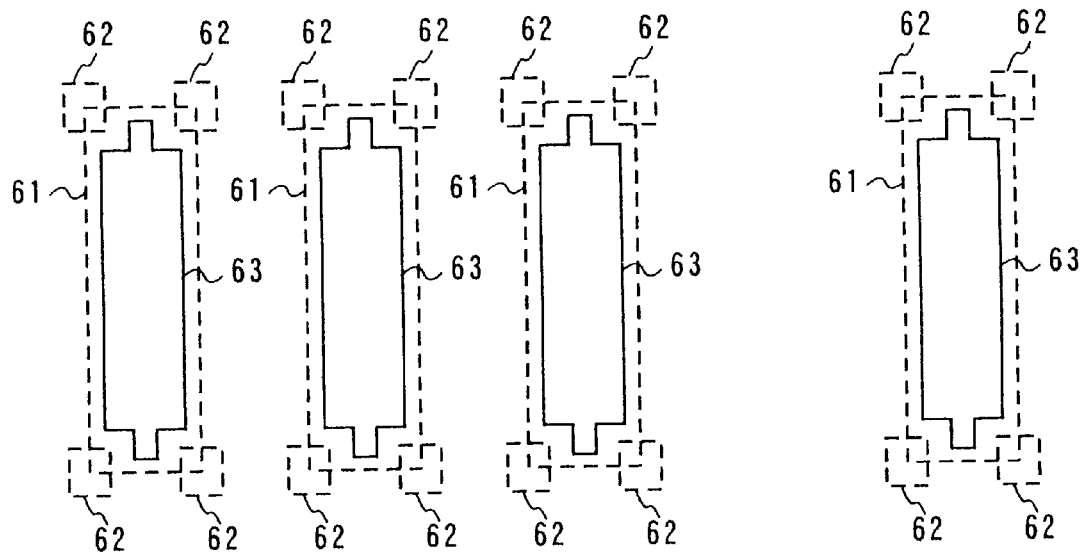
FIGS. 6 and 7 show formation of lower limit test reference patterns and upper limit test reference patterns.
Figure 7:
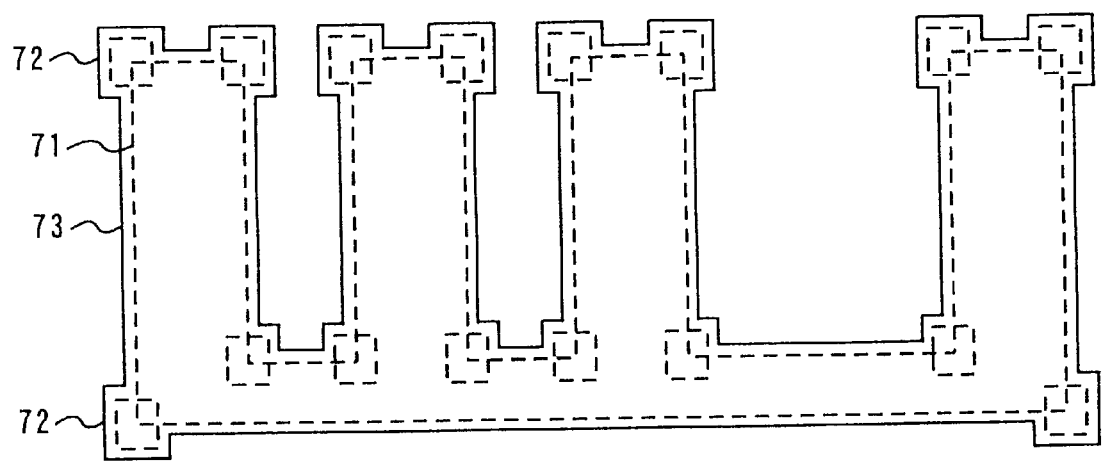
Figure 8:
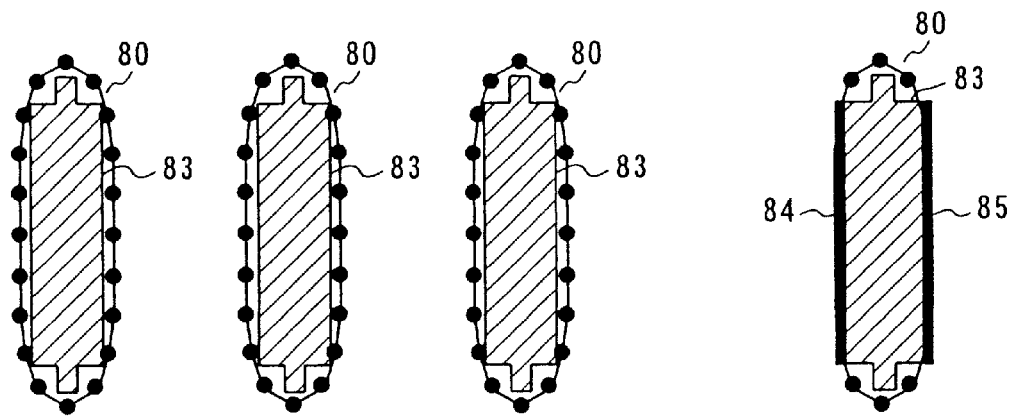
FIG. 8 shows comparison of lower limit test reference patterns with predicted finished patterns.
Figure 9:
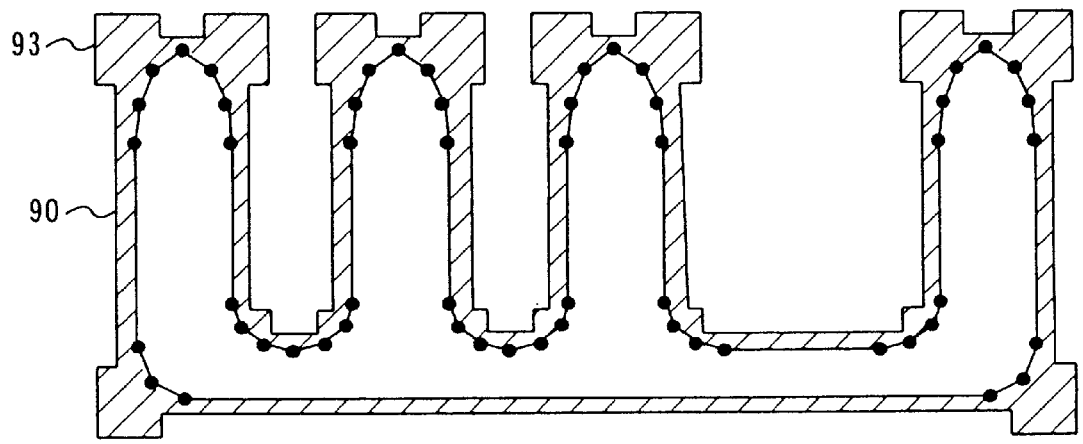
FIG. 9 shows comparison of upper limit test reference patterns with predicted finished patterns.

FIG. 2 is a flowchart showing the operation of the above pattern distortion detecting apparatus. FIG. 3 shows design layout patterns. FIG. 4 shows predicted finished patterns that are calculated based on the design layout patterns of FIG. 3 by fetching patterns forming process conditions. FIG. 5 shows polygon patterns obtained by polygonizing the outlines of the predicted finished patterns of FIG. 4. FIG. 6 shows a method for generating the lower limit test reference pattern data, and FIG. 7 shows a method for generating the upper limit test reference pattern data. FIGS. 8 and 9 show how lower limit test reference patterns and upper limit test reference patterns are formed, respectively. FIG. 8 compares lower limit test reference patterns with predicted finished patterns. FIG. 9 compares upper limit test reference patterns with predicted finished patterns.

The operation will be described below according to the flow of the flowchart of FIG. 2 while referring to the apparatus configuration of FIG. 1. First, at step ST21 in FIG. 2, the finished patterns predicting means 2 receives data of design layout patterns 31 (see FIG. 3) and patterns forming process conditions from the design layout pattern data holding section 1 and the patterns forming process conditions holding section 10, respectively, and calculates shapes of predicted finished patterns 40 (see FIG. 4) to be formed on a wafer by using an optical simulation or the like (step ST21 in FIG. 2). Usually, finished pattern shapes data have a bit-map data structure.

At step ST22, the predicted finished pattern outlines polygonizing means 3 converts the outlines of the pattern shapes into polygonized predicted finished patterns 50 (see FIG. 5) based on the predicted finished pattern shape and outputs apex coordinates.

The outlines of the polygonized predicted finished patterns 50 have an enormous number of apices. Therefore, at step ST23, the number-of-apices reducing means 4 reduces the number of apices to a value that can be handled by general CAD software (usually, about 200) by eliminating as many redundant apices as possible and dividing each polygon into rectangles and trapezoids. Predicted finished pattern data that have been subjected to such number-of-apices reduction are stored in the predicted finished pattern data holding section 5.

At step ST24, by using the design layout pattern data that are supplied from the design layout pattern data holding section 1, the test reference patterns generating means 6 generates two kinds of test reference pattern data to be used for extracting regions of the predicted finished patterns where a pattern distortion larger than the allowable range occurs.

The first one is lower limit test reference pattern data. FIG. 6 shows a method for generating the lower limit test reference pattern data. In FIG. 6, reference numerals 61–63 denote design layout patterns, rectangles, and lower limit test reference patterns, respectively.

First, the rectangles 62 having a predetermined size are generated at the corners of each design layout pattern 61. Portions obtained by ANDing the rectangles 62 and each design layout pattern 61 are removed from the latter. Finally, resulting patterns are reduced in size by a pattern distortion allowable value. Data of solid-line patterns 63 in FIG. 6 are lower limit test reference pattern data.

The second one is upper limit test reference pattern data. FIG. 7 shows a method for generating the lower limit test reference pattern data. In FIG. 7, reference numerals 71–73 denote design layout patterns, rectangles, and upper limit test reference patterns, respectively.

First, the rectangles 72 having a predetermined size are generated at the corners of each design layout pattern 71. Then, patterns obtained by ORing the rectangles 72 and each design layout pattern 71 are increased in size by a pattern distortion allowable value. Data of solid-line patterns 73 in FIG. 7 are upper limit test reference pattern data. The test reference pattern data thus obtained are stored in the test reference pattern data holding section 7.

At step ST25, the pattern distortion detecting means 8 compares the predicted finished patterns stored in the predicted finished pattern data holding section 5 with the lower limit test reference patterns stored in the test reference pattern data holding section 7.

FIG. 8 compares predicted finished patterns 80 and lower limit test reference patterns 83. As shown in FIG. 8, a pattern distortion larger than the allowable range occurs in regions 84 and 85 that are those portions of the lower limit test reference pattern 83 which are located outside the predicted finished pattern 80. Information of the positions and the sizes of the regions 84 and 85 is output at step ST26, and stored in the pattern distortion information holding section 9.

At step ST 27, the pattern distortion detecting means 8 compares the predicted finished patterns with the upper limit test reference patterns. FIG. 9 compares predicted finished patterns 90 and lower limit test reference patterns 93. As shown in FIG. 9, if the predicted finished patterns 90 are completely included in the respective upper limit test reference patterns 93, no pattern distortion larger than the allowable range occurs. On the other hand, if part of the predicted finished pattern 90 is located outside the upper limit, a distortion larger than the allowable range occurs. Therefore, information of the positions and the sizes of such a region is output at step ST28, and stored in the pattern distortion information holding section 9.

As described above, in the first embodiment, the design layout pattern data are directly compared with the highly accurately predicted finished patterns that have been calculated by an optical intensity simulation or the like. Therefore, a pattern distortion can be detected with high accuracy particularly in connection with the pattern line width.

Namely, the pattern distortion caused in the semiconductor manufacturing process may be predicted, and the portion which exceeds the allowable pattern limit may be detected.

In the pattern distortion detecting apparatus and method of the first embodiment, by virtue of the number-of-apices reducing means and step for reducing the number of apices, a general-purpose design rule check program can be used for the generation of test reference patterns and the comparison between the test reference patterns and predicted patterns.

In the pattern distortion detecting apparatus and method of the first embodiment, pattern distortion upper limit test reference patterns and pattern distortion lower limit test reference patterns are formed separately and a pattern distortion is detected through comparison with the upper limit test reference patterns and the lower limit test reference patterns. Therefore, a pattern distortion can be detected by separately setting a pattern distortion upper limit value and a pattern distortion lower limit value.

In the pattern distortion detecting apparatus and method of the first embodiment, test reference patterns are deformed so as not to detect a pattern distortion at pattern corner portions. Therefore, only a pattern distortion relating to a pattern line width that is required to be highly accurate can be detected with high accuracy.

Further, test reference patterns are generated merely by generating rectangles at the corners, performing graphical operations on the rectangles and design layout patterns, and then executing a sizing process. Therefore, a general-purpose design rule check program can also be used for this purpose. Thus, the system can be constructed simply and easily.

For reference, some aspects of the first embodiment may be summarized as follows.

In a pattern distortion detecting method and apparatus in a semiconductor manufacturing process, a predicted finished layout pattern is formed based on a design layout pattern or a inspection layout pattern. An outline of the predicted finished layout pattern is converted into a polygon to generate a polygonized predicted finished layout pattern. A pattern distortion in said predicted finished layout pattern is detected by logical figure operation of the input data of said polygonized predicted finished layout pattern and said design layout pattern or inspection layout pattern. The logical figure operation may be a comparison operation between a polygonized predicted finished layout pattern and a reference layout pattern which is formed based on the design layout pattern.

In the first embodiment, a pattern distortion detecting apparatus as shown in FIG. I may be constituted by an electric computer system. A process of pattern distortion detecting may be recorded as an computer program in a recording media. And, method of pattern distortion detection may be carried out by a computer by reading out the computer program. This applies to other embodiment to be described below.

In the present application, "logical figure operation" means operation that is carried out by one or combination of operations such as AND, OR, NOT, XOR, sizing, inclusion relation processing among figure patters, contacting, corner portion processing, internal or external distance processing, etc, which can be operated as a general layout inspection tool.

Further for reference, in summarizing another aspect of the first embodiment, a pattern distortion detecting apparatus comprises finished pattern predicting means for predicting a finished pattern to be formed based on a design layout pattern in a semiconductor manufacturing process. Predicted finished pattern polygonizing means is provided for converting a outline of the predicted finished pattern into a polygon to generate a polygonized predicted finished pattern. Test reference pattern generating means is provided for generating a test reference pattern based on the design layout pattern. Pattern distortion detecting means is provided for detecting a pattern distortion in the predicted finished pattern by comparing the polygonized predicted finished pattern with the test reference pattern.

In another aspect, in the pattern distortion detecting apparatus, the predicted finished pattern polygonizing means comprises number-of-apices reducing means for reducing the number of apices of the polygonized predicted finished pattern.

In another aspect, in the pattern distortion detecting apparatus, the test reference pattern generating means generates an upper limit test reference pattern for defining an allowable upper limit by enlarging the design layout pattern and a lower limit test reference pattern for defining an allowable lower limit by reducing the design layout pattern.

In another aspect, in the pattern distortion detecting apparatus, the test reference pattern generating means generates the upper limit test reference pattern by adding rectangular regions having a predetermined size to the design layout pattern at corner portions thereof and increasing a size of a resulting pattern by a pattern distortion allowable amount.

In another aspect, in the pattern distortion detecting apparatus, the test reference pattern generating means generates the lower limit test reference pattern by deleting rectangular regions having a predetermined size from the design layout pattern at corner portions thereof and decreasing a size of a resulting pattern by a pattern distortion allowable amount.

Second Embodiment

Figure 10:
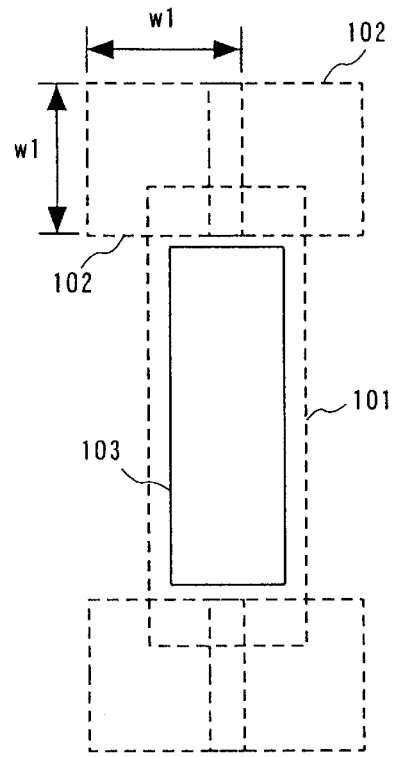
FIGS. 10 and 11 illustrate formation of a pattern distortion test reference pattern according to a second embodiment of the present invention.
Figure 11:
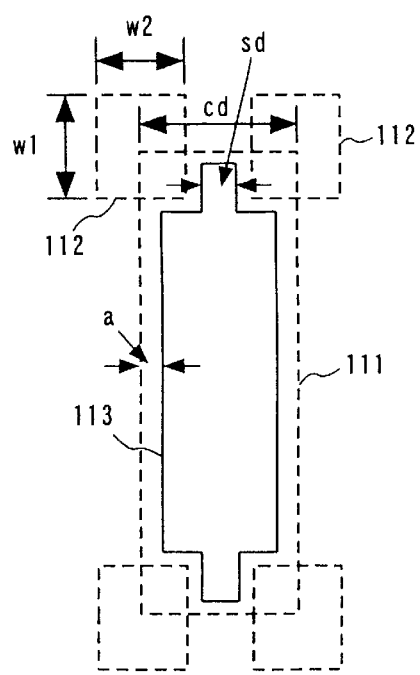

FIGS. 10 and 11 illustrate how a pattern distortion test reference pattern is formed according to a second embodiment of the invention. Specifically, FIG. 10 illustrates a problem that may arise in forming a test reference pattern in the first embodiment and FIG. 11 shows how a test reference pattern is formed in the second embodiment when a corner-to-corner distance of a pattern is small.

In the above-described first embodiment, to neglect pattern distortions at corner portions, a reference pattern is generated by generating rectangles having a predetermined size at corner portions of a design layout pattern and then performing graphical operations on the rectangles and the design layout pattern.

FIG. 10 illustrates a problem that may occur in such a case. In FIG. 10, reference numerals 101–103 denote a design layout pattern, rectangles, and a lower limit test reference pattern, respectively. As shown in FIG. 10, when each rectangle 102 is longer than the width of the design layout pattern 101, i.e., the length of its shorter sideline, the rectangles 102 overlap with each other and the lower limit test reference pattern 103 is made unduly small. This causes a problem that a pattern distortion on the shorter sidelines of a finished pattern is not detected.

To solve this problem, in the second embodiment, when two rectangles generated at corner portions of a design layout pattern in forming a test reference pattern contact or overlap with each other, the size of both rectangles are adjusted so that they are separated from each other by a preset value. This is shown in FIG. 11, in which reference numerals 111–113 denote a design layout pattern, rectangles, and a lower limit test reference pattern, respectively.

The above process will be formulated below with reference to FIG. 11.

The following notation is employed. The shortest corner-tocorner distance of the design layout pattern 111 is represented by cd, the sideline length of each generated rectangle 112 is represented by w1, the allowable pattern distortion amount is represented by a, the sideline length of each size-adjusted rectangle is represented by w2, and the minimum pattern width to be left of the lower limit test reference pattern 113 is represented by sd. When cd $\leq$ w1, the sideline length of each rectangle is changed to w2 according to Equation (1):

$$w2 = cd - 2 \times a - sd. \tag{Equation 1}$$

As described above, by adjusting the size of rectangles generated at corner portions of a design layout pattern, it becomes possible to detect, with high accuracy, also a pattern distortion of shorter sidelines of a pattern.

For reference, in summarizing one aspect of the second embodiment, in the pattern distortion detecting apparatus, the test reference pattern generating means generates the upper limit test reference pattern by adding rectangular regions, of which size is adjusted so that adjacent ones of the rectangular regions do not overlap with each other, to the design layout pattern at corner portions thereof and increasing a size of a resulting pattern by a pattern distortion allowable amount.

In another aspect, in the pattern distortion detecting apparatus, the test reference pattern generating means generates the lower limit test reference pattern by deleting rectangular regions, of which size is adjusted so that adjacent ones of the rectangular regions do not overlap with each other, from the design layout pattern at corner portions thereof and decreasing a size of a resulting pattern by a pattern distortion allowable amount.

Third Embodiment

Figure 12:
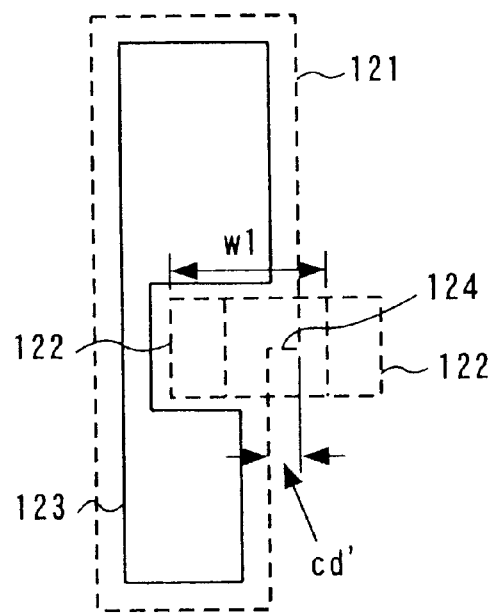
FIGS. 12 and 13 show formation of a pattern distortion test reference pattern according to a third embodiment of the present invention.
Figure 13:
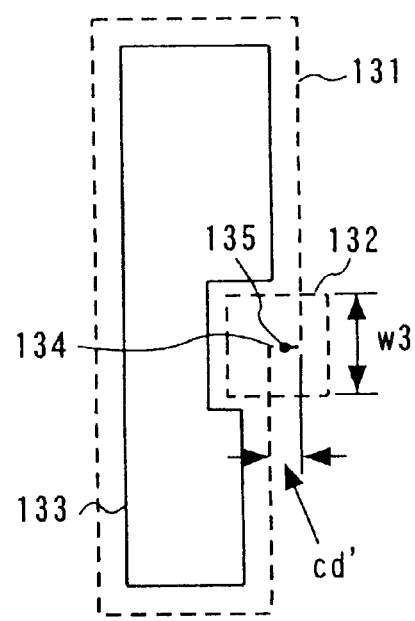

FIGS. 12 and 13 show how a pattern distortion test reference pattern is formed according to a third embodiment of the invention. FIG. 12 illustrates a problem that may arise in forming a test reference pattern in the first embodiment when a sideline of a pattern has a minute step, and FIG. 13 shows how a test reference pattern is formed in the third embodiment when a sideline of a pattern has a minute step.

In FIG. 12, reference numerals 121–124 denote a design layout pattern, a rectangle, a lower limit test reference pattern, and a minute step portion, respectively. As shown in FIG. 12, in the first embodiment, when the design layout pattern 121 has the minute step portion 124, an unduly large rectangle 122 for generation of a lower limit test reference pattern is formed at the minute step portion 124. With the lower limit test reference pattern 123 thus formed, a pattern distortion at and in the vicinity of the minute step portion cannot be detected.

To solve this problem, in the third embodiment, when a rectangle that is generated at a minute step portion of a design layout pattern in forming a test reference pattern becomes unduly large, the sideline length of the generated rectangle is adjusted in accordance with the corner-to-corner distance. This is shown in FIG. 13, in which reference numerals 131–134 denote a design layout pattern, a rectangle, a lower limit test reference pattern, and a minute step portion, respectively.

The above process will be formulated below with reference to FIG. 13.

When a corner-to-corner distance cd* of the minute step portion 134 of the design layout pattern 131 is smaller than a predetermined value, the sideline length of the generated rectangle 132 is adjusted in accordance with the corner-to-corner distance cd* and the rectangle 132 is located at the middle point 135 between the corners as shown in FIG. 13.

For example, an adjusted rectangular size w3 is calculated according to Equation (2):

$$w3 = k \times cd' + b \tag{Equation 2}$$

where k is a properly set coefficient and b is a properly set constant.

Although in the above example one rectangle enclosing the minute step portion and having a size that is reduced according to a certain criterion is set at the middle point of the step portion, it may be set anywhere between the two corners of the minute step portion.

Further, rectangular regions smaller than rectangular regions to be set at corner portions of a sideline may be set at both corner portions of a minute step portion so as to overlap with each other.

As described above, according to the third embodiment, also a pattern distortion at or in the vicinity of a minute step portion can be detected with high accuracy.

For reference, in summarizing one aspect of the third embodiment, in the pattern distortion detecting method, when the design layout pattern has a minute step portion in a sideline, the upper limit test reference pattern generating substep generates the upper limit test reference pattern by adding, to the design layout pattern at corner portions of the minute step potion, rectangular regions that are smaller than rectangular regions that are set at the corner portions of the sideline.

In another aspect, in the pattern distortion detecting method, when the design layout pattern has a minute step portion in a sideline, the lower limit test reference pattern generating substep generates the lower limit test reference pattern by deleting, from the design layout pattern at corner portions of the minute step potion, rectangular regions that are smaller than rectangular regions that are set at the corner portions of the sideline.

In another aspect, in the pattern distortion detecting method, when the design layout pattern has a minute step portion in a sideline, the upper limit test reference pattern generating substep generates the upper limit test reference pattern by adding a rectangular region having a predetermined size to the design layout pattern at an intermediate position of the minute step potion.

In another aspect, in the pattern distortion detecting method, when the design layout pattern has a minute step portion in a sideline, the lower limit test reference pattern generating substep generates the lower limit test reference pattern by deleting a rectangular region having a predetermined size from the design layout pattern at an intermediate position of the minute step potion.

Fourth Embodiment

Figure 14:
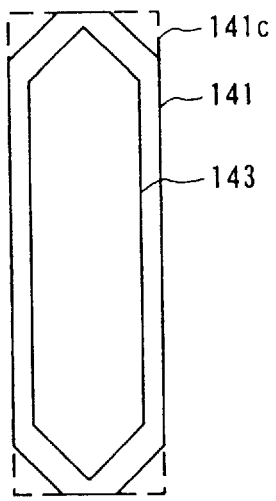
FIG. 14 illustrates formation of a pattern distortion test reference pattern according to a fourth embodiment of the present invention.

FIG. 14 illustrates how a pattern distortion test reference pattern is formed according to a fourth embodiment of the invention. In FIG. 14, reference numerals 141, 141c, and 143 denote a design layout pattern, its corner portions, and a lower limit test reference pattern, respectively.

In the first embodiment, to neglect pattern deformation at corner portions of a pattern, rectangles are generated at the corner portions and the corner portions are eliminated through graphical operations.

In contrast, in the fourth embodiment, as shown in FIG. 14, data of the lower limit test reference pattern 143 that enables neglect of the corner portions is generated by deleting the corner portions 141c of the design layout pattern 141 by cutting it obliquely and then reducing the size of a resulting pattern by a pattern distortion allowable value.

As described above, the fourth embodiment requires no graphical operations, making it possible to increase the processing speed.

For reference, in summarizing one aspect of the fourth embodiment, in the pattern distortion detecting method, the lower limit test reference pattern generating substep generates the lower limit test reference pattern by deleting corner portions of the design layout pattern by obliquely cutting the design layout pattern and decreasing a size of a resulting pattern by a pattern distortion allowable value.

Fifth Embodiment

Figure 15:
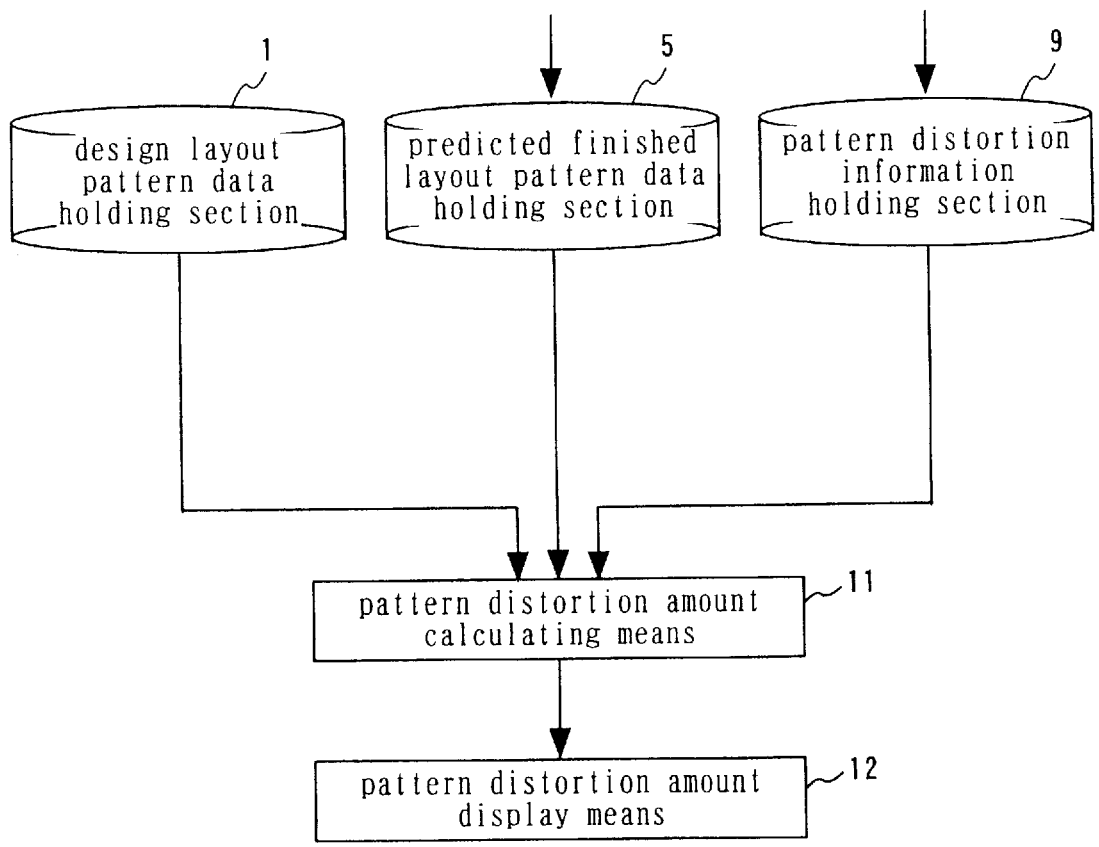
FIG. 15 is a block diagram showing the configuration of a pattern distortion detecting apparatus according to a fifth embodiment of the present invention.

FIG. 15 is a block diagram showing the configuration of a pattern distortion detecting apparatus according to a fifth embodiment of the invention. In FIG. 15, reference numerals 11 and 12 denote a pattern distortion amount calculating means and a pattern distortion amount display means, respectively, which are added to, i.e., combined with, the pattern distortion detecting apparatus of FIG. 1.

Referring to FIG. 15, the pattern distortion amount calculating means 11 acquires, from the pattern distortion information holding section 9, information of the positions of regions where a pattern distortion larger than the allowable range occurs. For each of those regions, the pattern distortion amount calculating means 11 compares design layout pattern data that is sent from the design layout pattern data holding section 1 with predicted pattern data that is sent from the predicted pattern data holding section 5, calculates their difference by graphical operations, and outputs a calculation result to the pattern distortion amount display means 11.

As described above, in the fifth embodiment, when a sideline of a pattern where a pattern distortion larger than the allowable range will occur is detected, a difference between design layout pattern data and predicted finished pattern data of a portion corresponding to the detected sideline is calculated by graphical operations and output, to report a distortion amount of the portion precisely.

As a result, the design layout pattern data can be corrected precisely. It is also possible to automatically correct the design layout pattern data.

Each of the above embodiments is directed to the case where a predicted finished pattern and a test reference pattern are compared with each other. However, in the present invention, it is also possible to check whether a difference between predicted finished patterns that are calculated from different design layout patterns or a difference between predicted finished patterns that are calculated under different pattern forming process conditions is within an allowable value.

For reference, in summarizing one aspect of the fifth embodiment, in the pattern distortion detecting apparatus, pattern distortion amount calculating means is provided for calculating an amount of the pattern distortion that has been detected by the pattern distortion detecting means based on a difference between the design layout pattern and the predicted finished pattern.

In the above first through fifth embodiments, the term "design layout pattern" may be named as "reference layout pattern", when the design layout pattern is used as a basis to form a test reference-pattern. In the present application, each term is used where appropriate.

Alternatively, in the above first through fifth embodiments, a prediction of a finished pattern is made based on a "design layout pattern". However, in practice, a pattern modified based on a "design layout pattern" may be used as a basis to predict a finished pattern in order to finally obtain a pattern substantially same with the "design layout pattern" or the "reference layout pattern". In this situation, the modified pattern may be called as an "inspection layout pattern". Further, the term "inspection layout pattern" may includes both a "design layout pattern" and the modified pattern where they are used as a basis to predict a finished pattern. In the present application, each term is used where appropriate.

The above first through fifth embodiments are presented for the purpose of detecting a pattern distortion occurred in the patterns forming process, and are to inspect the distorted portion larger than a certain level by searching a processed finished pattern from a design layout pattern, polygonizing the outline of the finished pattern, then performing a subtracting operation between the design layout pattern the size of which is increased or decreased and the finished pattern.

In this method, all of the detected results, in case that a difference between the design layout pattern and the processed finished pattern (except the corners) is larger than a prescribed value, are considered to be errors.

The following embodiments improve the above disadvantage, so that the more desirable detection can be achieved by distinguishing the errors into the ones occurred in unimportant parts of a circuit and the ones occurred in important parts of the circuit.

The following embodiments are also to be able to inspect the portions in remarkable variations of predicted finished pattern dimensions, considering the variations of a plurality of optical conditions and a plurality of patterns forming process conditions.

Further the following embodiments are not only to inspect the dimensions of the finished patterns but also to be able to detect a portion, that is an important part of the process, in which the errors tend to be occurred, considering a contrast of an optical intensity for example.

Sixth Embodiment

Figure 16:
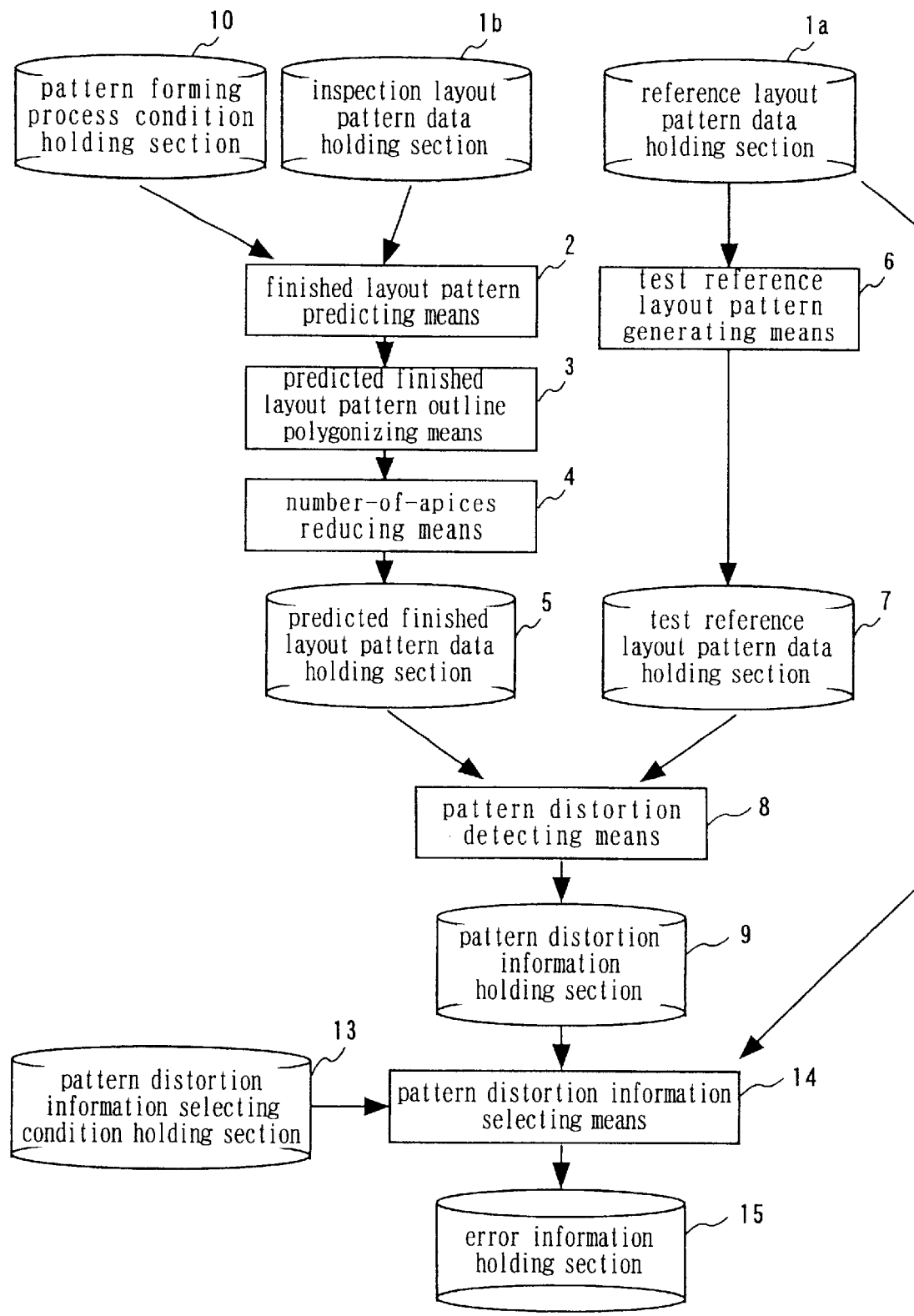
FIG. 16 shows the configuration of a pattern distortion detecting apparatus having a pattern distortion error selecting function according to the sixth and seventh embodiments.

FIG. 16 is a block diagram showing the configuration of a pattern distortion detecting apparatus according to a sixth embodiment of the present invention. In FIG. 16, reference numeral "1a" denotes a reference layout pattern data holding section which holds a reference layout pattern, and "1b" denotes an inspection layout pattern data holding section which holds an inspection layout pattern.

Reference numeral 13 denotes a pattern distortion information selecting conditions holding section which holds the selecting conditions for selecting the pattern distortion information being held in the pattern distortion information holding section 9, based on the given condition. Reference numeral 14 denotes a pattern distortion information selecting means for selecting the pattern distortion information from the pattern distortion information holding section 9, based on the selecting condition from the pattern distortion information selecting conditions holding section 13. And reference numeral 15 denotes an error information holding section for holding error information being output from the pattern distortion information selecting means 14. As one of the examples, the pattern distortion information selecting conditions maybe the data of other design layers used for a semiconductor manufacturing process, and the pattern distortion information selecting means 14 performs logical operation between the detected pattern distortion information and the other design layer data. Other part of this configuration is the same as that in FIG. 1.

It should be noted that this embodiment includes the pattern distortion information selecting means 14 to which the information and data are input from the pattern distortion information holding section 9, the reference layout pattern data holding section 1a and the pattern distortion information selecting conditions holding section 13.

In the configuration illustrated in FIG. 1 of the first embodiment, the data from the design layout pattern data holding section 1 are input to both of the finished patterns predicting means 2 and the test reference patterns generating means 6. On the other hand, in case of FIG. 16, the data from the inspection layout pattern data holding section 1b and the reference layout pattern data holding section 1a are input to the finished patterns predicting means 2 and the test reference patterns generating means 6, respectively. This configuration shows a general example and does not limit the present invention.

In the above configuration, the reference layout pattern is a design layout pattern which is not modified yet, and which is to be finally formed.

The inspection layout pattern may be either a pattern same with a layout pattern which is not modified, i.e. a pattern same with a reference layout pattern, or a modified pattern. The modified pattern means a pattern which is modified based on a design layout pattern to ultimately obtain a pattern, through a practical process, substantially same with a design layout pattern or a reference layout pattern.

Figure 17:
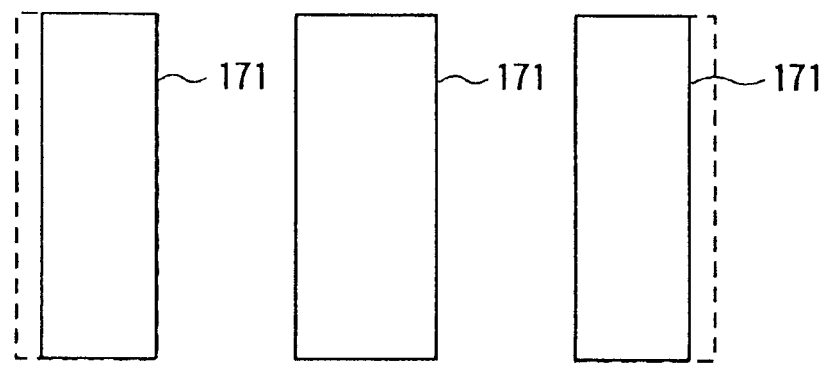
FIG. 17 shows a concrete example of correcting a line and space pattern as an inspection layout pattern.
Figure 18:
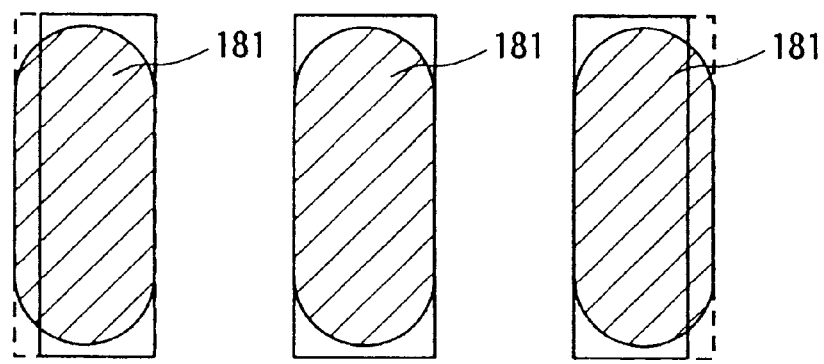
FIG. 18 shows a concrete example of finished pattern based on the inspection layout pattern of FIG. 17.
Figure 19:
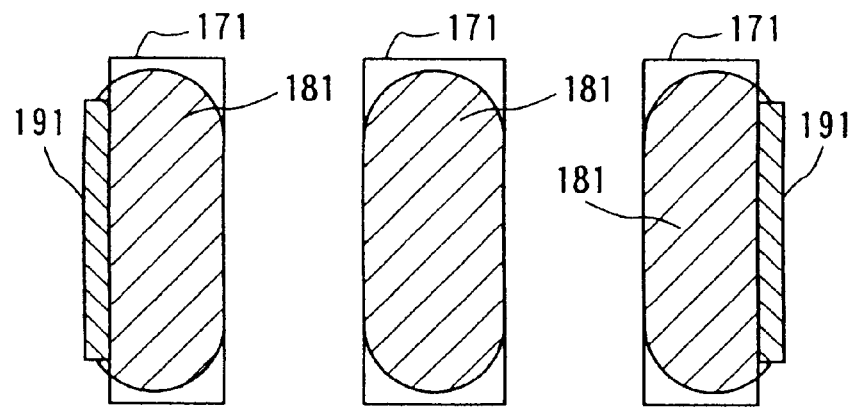
FIG. 19 shows a concrete example of error output when the finished pattern of FIG. 18 is compared with a design layout pattern being already corrected.

Now, this configuration will be explained based on a concrete example. FIG. 17 shows a line and space pattern as an inspection layout pattern 171. FIG. 18 shows a finished pattern 181 based on the inspection layout pattern 171 of FIG. 17. FIG. 19 shows an error output 191 caused by comparing the finished pattern 181 of FIG. 18 with the inspection layout pattern 171.

Figure 20:
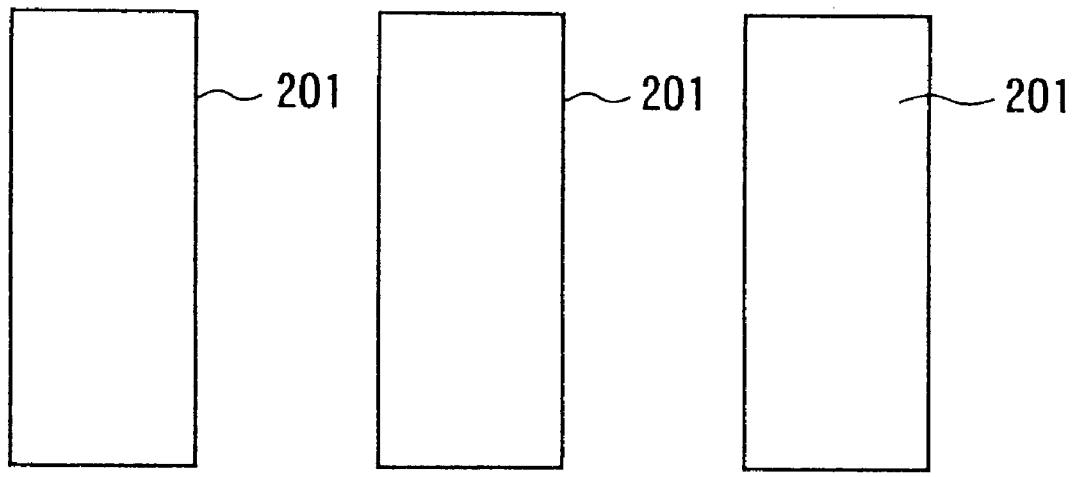
FIG. 20 shows a concrete example of a design layout pattern before its correction, as a reference layout pattern.
Figure 21:
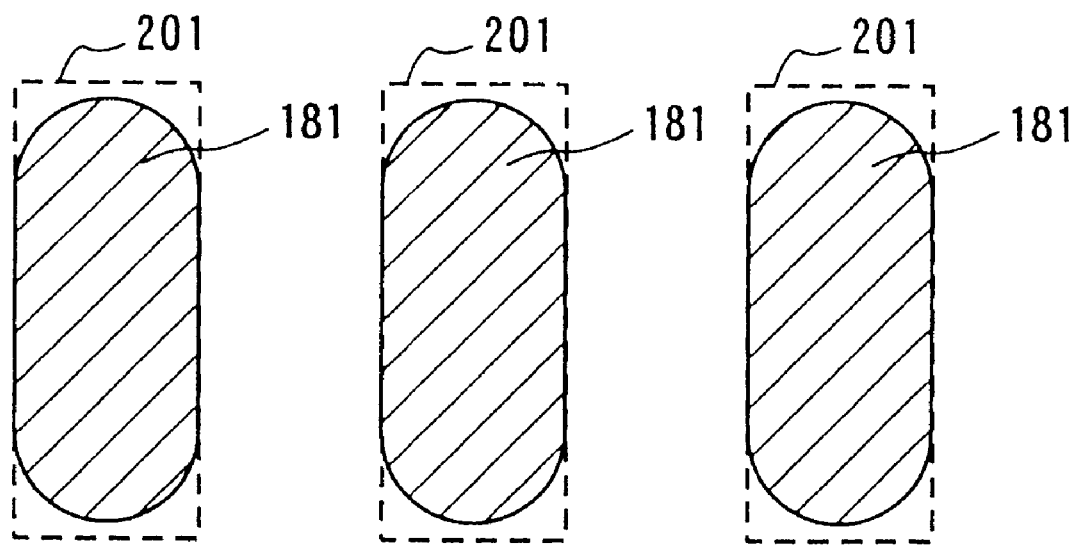
FIG. 21 shows a concrete example of error output when the finished pattern obtained from a corrected layout pattern is compared with a design layout pattern before its correction.

FIG. 20 shows a reference layout pattern (a design layout pattern before being modified) 201. FIG. 21 shows an error output in case of comparing the finished pattern 181 computed from the inspection layout pattern 171 with the reference layout pattern 201. As described above, the reference layout pattern 201 is modified to be the inspection layout pattern 171 so that the errors are not output, then the inspection layout pattern 171 is actually used for a pattern forming apparatus.

The above explanation is introduced to show that an inspection layout pattern may be used as one of the variations in FIG. 1 of the first embodiment, and is not essential for the sixth embodiment.

Then, a characteristic operation of the sixth embodiment will be explained.

Figure 22:
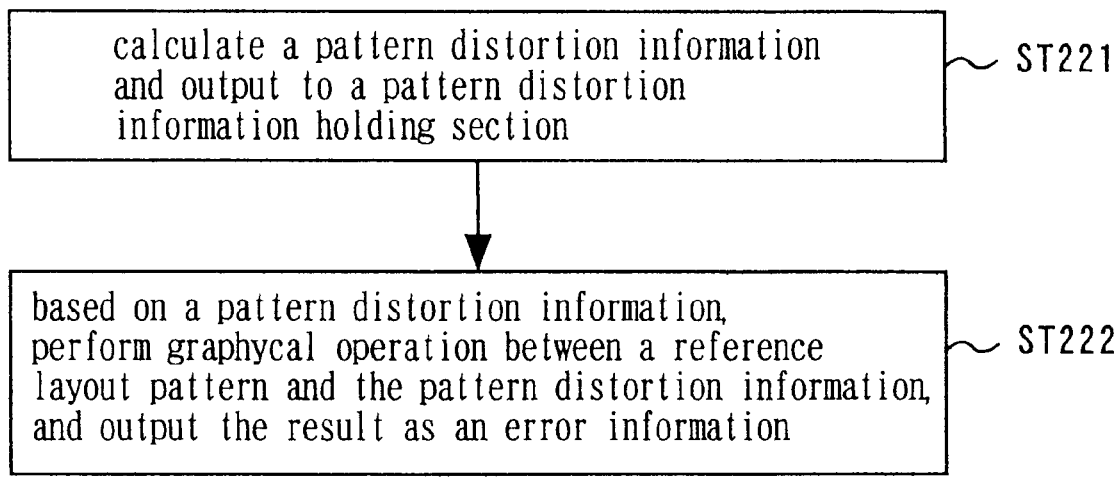
FIG. 22 is a flowchart for detecting a pattern distortion according to the sixth embodiment, that is, a flowchart for selecting errors by performing logical operation with other design layers.

FIG. 22 is a flowchart showing an operation of a pattern distortion detecting apparatus of FIG. 16. First, at step 221 (ST221) in FIG. 22, according to the pattern distortion detecting flow which is the same as described in FIG. 2 of the first embodiment including step 21 (ST21) to step 28 (ST28), a pattern distortion information is output to the pattern distortion information holding section 9 of FIG. 16.

Then at step 222 (ST222), based on the pattern distortion information selecting conditions from the pattern distortion information selecting conditions holding section 13, the pattern distortion information selecting means 14 performs graphical operation between the design layout pattern or reference layout pattern and the pattern distortion information to output the result as an error information to the error information holding section 15. For example, the errors are selected by performing a logical operation with one of other design layers.

Figure 23:
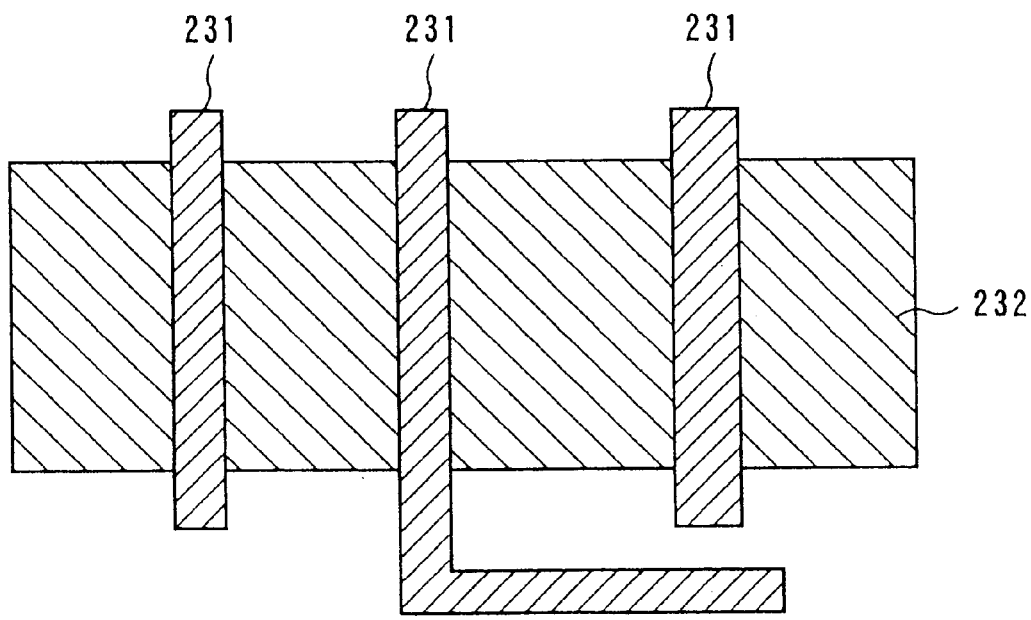
FIG. 23 shows a concrete example of a finished pattern obtained from a corrected layout pattern.

The above operation will be explained with a concrete example. FIG. 23 shows an example of a design layout pattern. In FIG. 23, reference numeral 231 denotes a gate of a transistor, and 232 denotes an active region.

Figure 24:
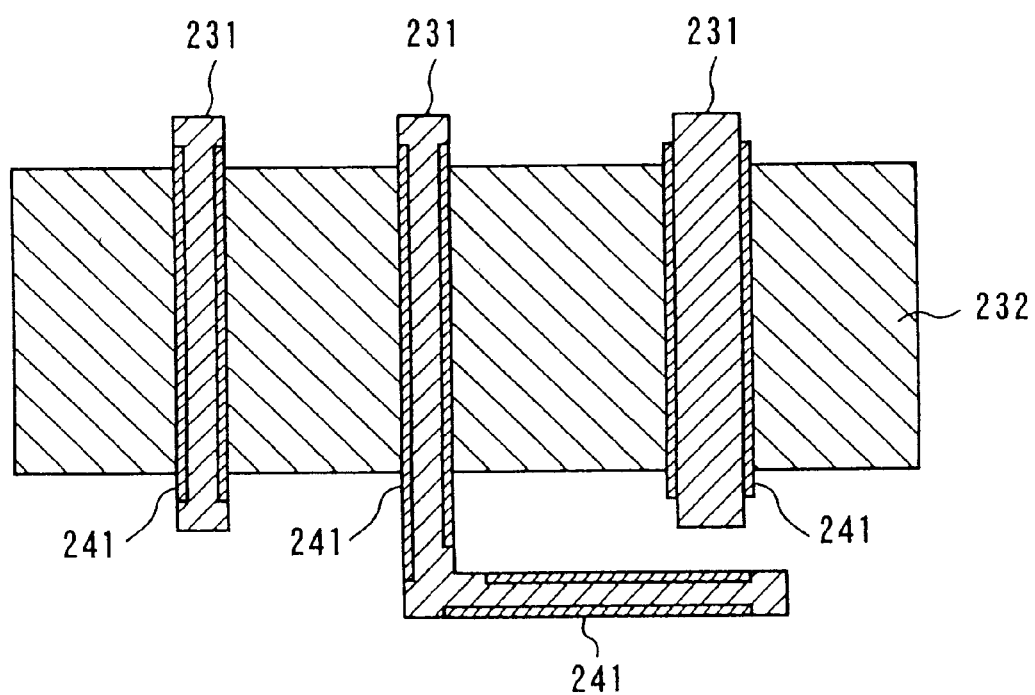
FIG. 24 shows a concrete example of error output according to the sixth embodiment, as a comparison with FIG. 23.

FIG. 24 shows, for a comparison, an example of an error output which is produced in inspecting the pattern distortion with the gate lead 231 as an input pattern according to the method of the first embodiment. In FIG. 24, reference numeral 231 denotes a gate of a transistor, 232 denotes an active region, and 241 denotes a pattern distortion error. In FIG. 24, the dimension of the error 241 on the active region 232 is important in the circuit design in order to define the transistor characteristics, but other parts are not required to have high accuracy in this circuit design. Therefore, it is required to provide a function which selects these errors depending on their circuit design importance.

Figure 25:
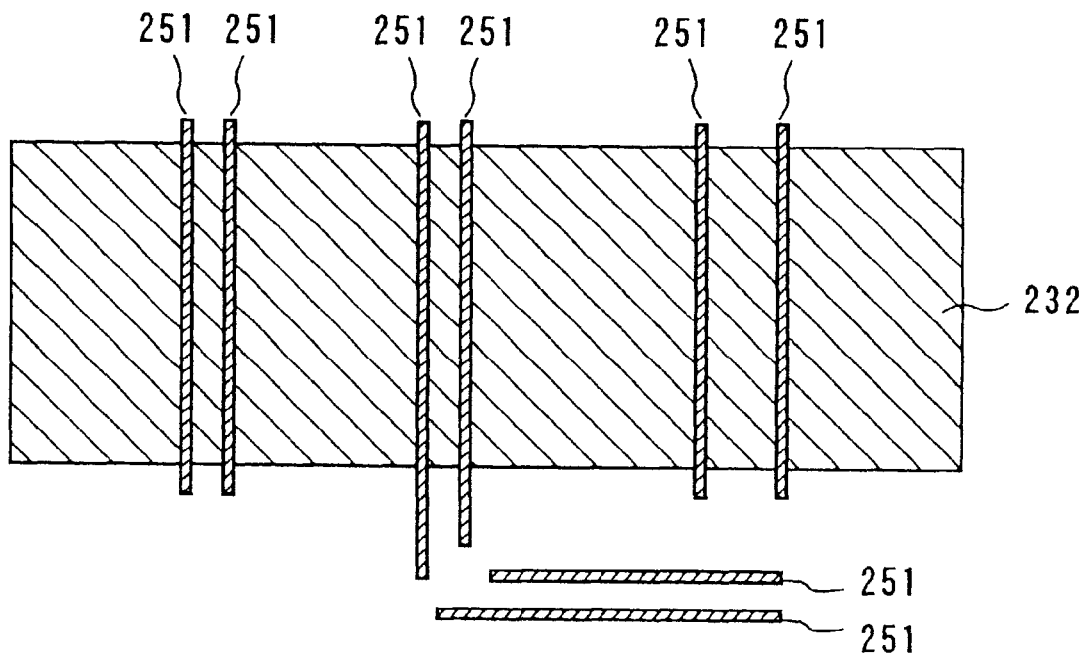
FIG. 25 shows a concrete example of a process for detecting a pattern distortion according to the sixth embodiment.

FIG. 25 shows an error output example as a result of performing the pattern distortion inspection according to the sixth embodiment. In FIG. 25, reference numeral 232 denotes an active region, and 251 denotes an error output from the pattern distortion information holding section 9 at step 221 (ST221) in FIG. 22.

In the sixth embodiment, the error selection depending on its circuit design importance is performed such that the pattern distortion information selecting conditions holding section 13 of FIG. 16 outputs the pattern distortion information selecting condition which commands to "perform AND operation between the error and the active region", to the pattern distortion information selecting means 14.

Based on the input condition, the pattern distortion information selecting means 14 performs operation which is "to perform AND operation between an error and an active region" to be able to select only an error presented on the active region.

Figure 26:
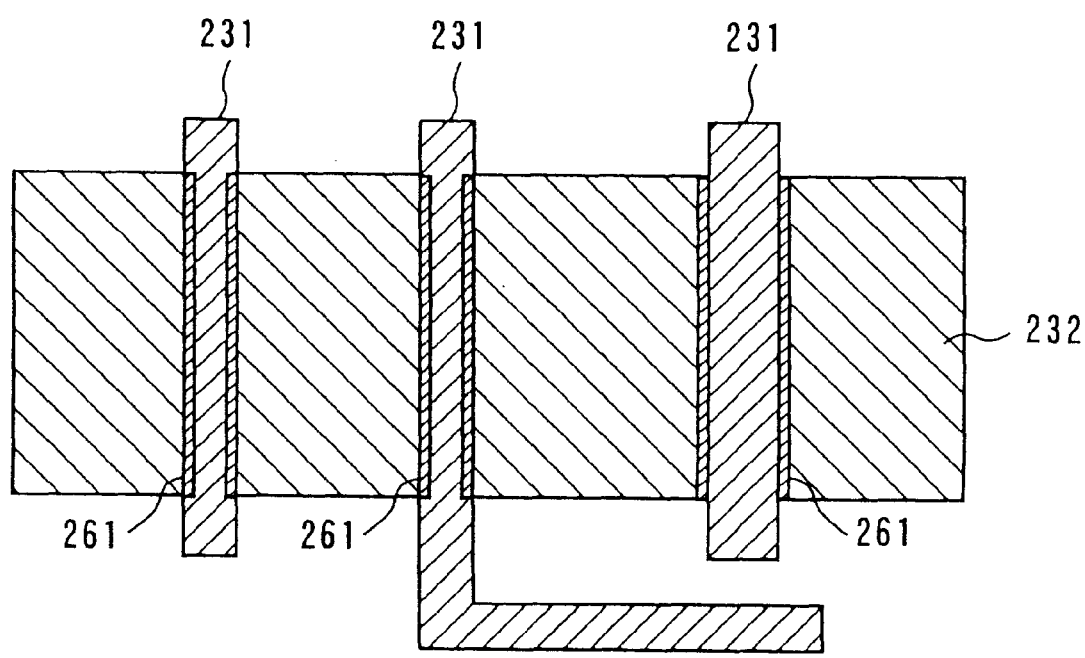
FIG. 26 shows a concrete example of a result of detecting a pattern distortion according to the sixth embodiment.

FIG. 26 shows the errors which are selected as described above and are output to the error information holding section 15. In FIG. 26, reference numeral 231 denotes a gate of a transistor, 232 denotes an active region, and 261 denotes an error selected depending on its importance.

As described above, according to this embodiment, it is possible to select and detect the error which is important in the circuit design.

As described above, according to this embodiment, it is possible to predict the pattern distortion caused in the semiconductor pattern forming process, and to detect the portion of pattern distortion larger than the allowable range.

Further, the pattern distortion detecting method and apparatus can be provided that can select the errors by logical operation on other design layers and the pattern distortion errors.

Therefore, a pattern distortion error selecting function for selecting the error importance can be provided. That is, performing the selection of the detected pattern distortion errors enables to detect the important errors with high fidelity.

For reference, in summarizing one aspect of the sixth embodiment, in the pattern distortion detecting apparatus, pattern distortion information selecting means is provided for performing logical operation between the pattern distortion in the design layout pattern and other design layers.

In another aspect, in the pattern distortion detecting apparatus, selecting of the importance level of the pattern distortion is performed by the logical operation.

Seventh Embodiment

In the seventh embodiment, a pattern distortion detecting apparatus of FIG. 16 described in the sixth embodiment is also used.

The operation will next be explained.

Figure 27:
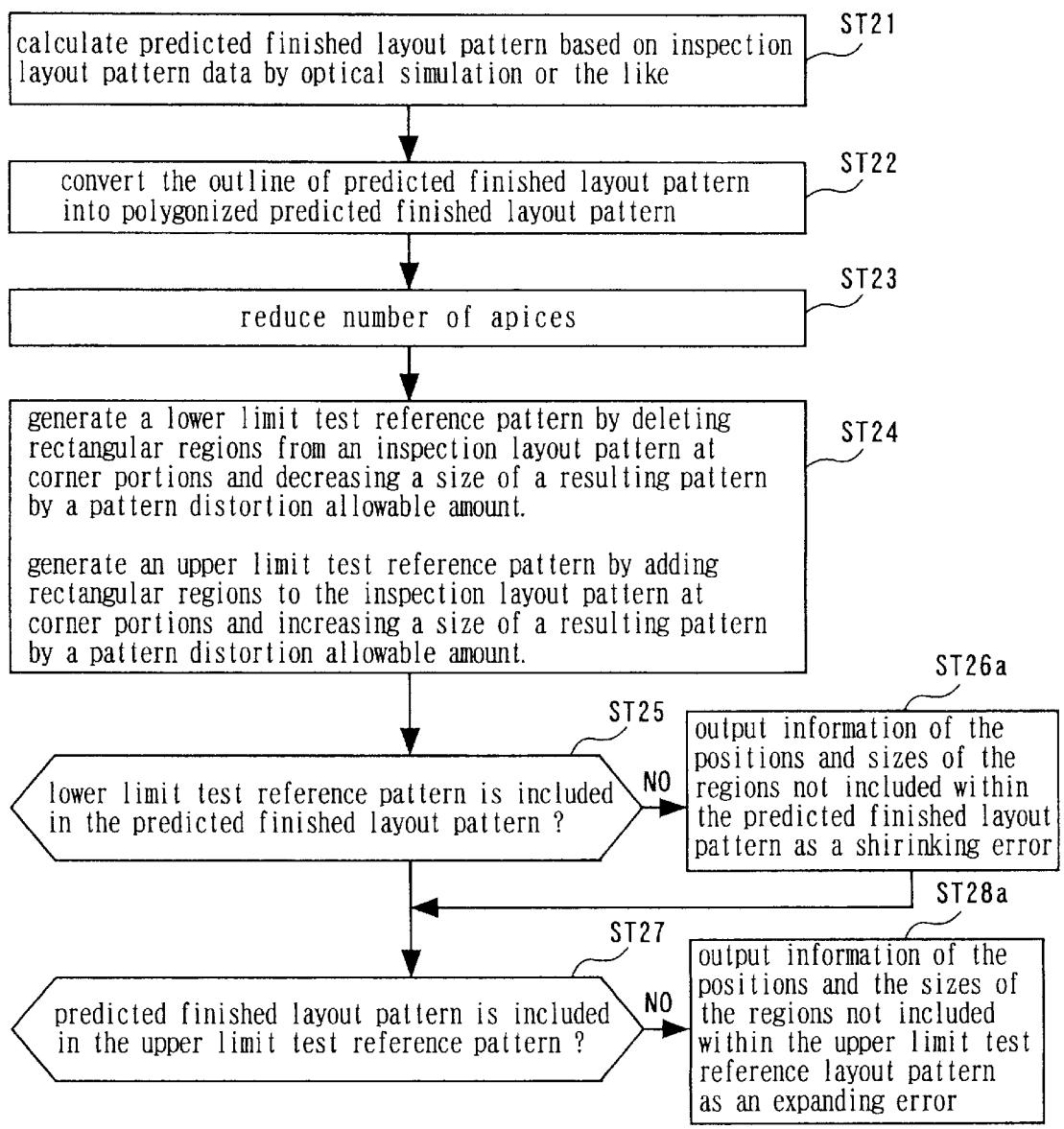
FIG. 27 is a flowchart showing a pattern distortion detection according to the seventh embodiment, that is, a flowchart for selecting the errors depending on the finished patterns being shrunk or enlarged.

FIG. 27 is a flowchart of error selection in the seventh embodiment. In this flowchart, step 26a (ST26a) and step 28a (ST28a) are different from those in the FIG. 2 of the first embodiment, and other parts are the same with FIG. 2. However, in FIG. 27, an inspection layout pattern is used in the step 21 (ST21), and a reference layout pattern is used in the step 24.

In FIG. 2 of the first embodiment, it is judged whether or not the lower limit test reference pattern data are completely included within the predicted finished pattern at step 25 (ST25), and information of the positions and the sizes of the regions not being included within the predicted finished pattern is output at step 26 (ST26). It is judged whether or not the predicted finished pattern is completely included within the upper limit test reference pattern at step 27 (ST27), and information of the positions and the sizes of such a region not being included within the upper limit test reference pattern is output at step 28 (ST28). The both outputs are sent to the same indication.

On the other hand, in this seventh embodiment, it is judged whether or not the lower limit test reference pattern data are completely included within the predicted finished pattern at step 25 (ST25), and information of the positions and the sizes of the regions not being included within the predicted finished pattern is output to a designated indication at step 26a (ST26a) as an error for shrinking. And it is Gag judged whether or not the predicted finished pattern is completely included with in the upper limit test reference pattern at step 27 (ST27), then information of the positions and the sizes of such a region not being included within the upper limit test reference pattern is output to another indication at step 28a (ST28a) as an error for expanding. That is, each of the outputs is sent to the individual indication to be independently displayed or colored.

In this way, in this embodiment, the errors detected at the step 26a (ST26a) and at the step 28a (ST28a) are respectively sent to the different output area. This is remarkably different from the first embodiment.

Figure 28:
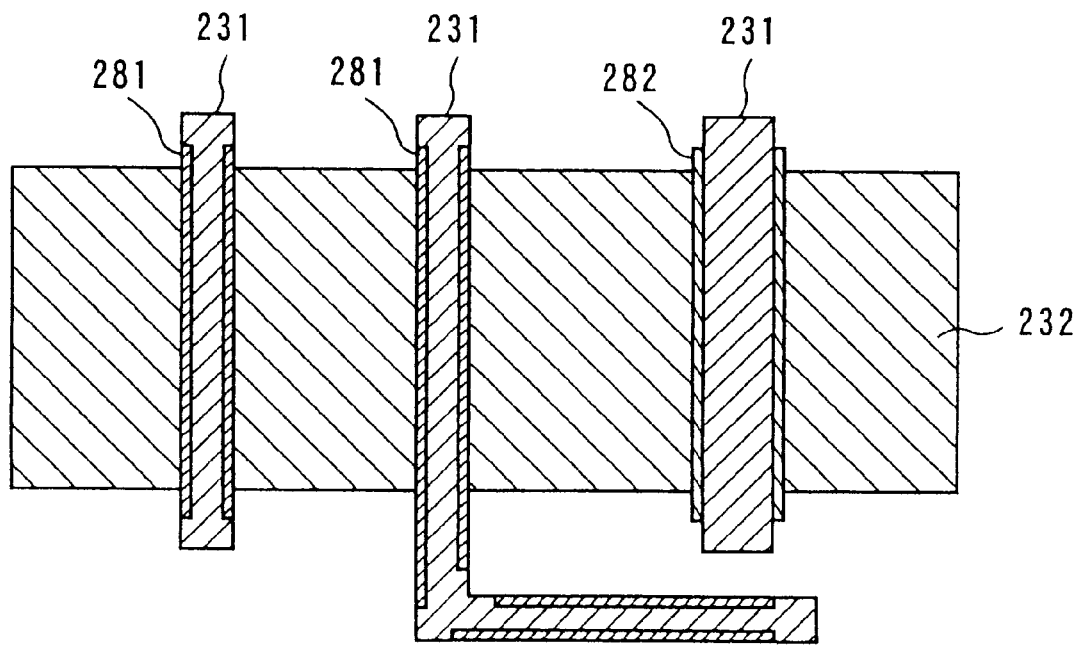
FIG. 28 shows a concrete example of a result of detecting a pattern distortion according to the seventh embodiment.

The above process in the flow will be explained with a concrete example. FIG. 28 shows a result of inspecting the gate lead pattern 231 of the transistor described in FIG. 23. In FIG. 28, reference numeral 231 denotes a gate lead of a transistor, 232 denotes an active region, 281 denotes an error region distorting the pattern to be shrunk, and 282 denotes an error region distorting the pattern to be expanded. Both errors are found to be individually output by the selecting operation. In this example, different colors are respectively described in different hatchings.

As described above, according to this embodiment, each of the pattern distortions which shrinks or expands the pattern is selected to be detected.

Figure 29:
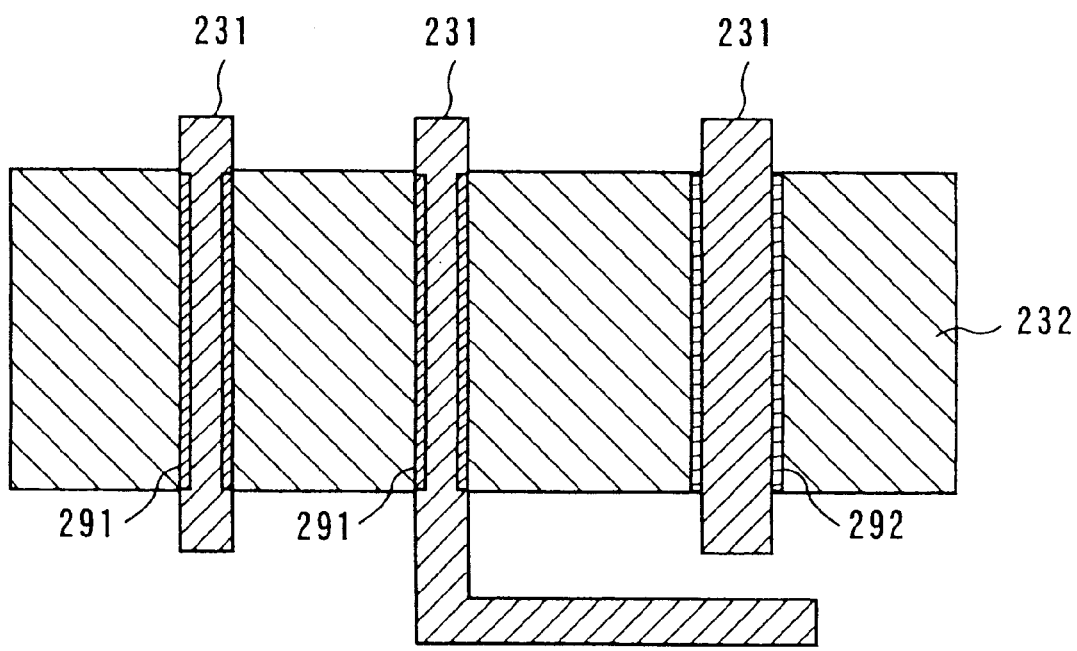
FIG. 29 shows another concrete example of a pattern distortion detection according to the seventh embodiment.

Further, FIG. 29 shows a result of process in which the sixth embodiment is combined with the seventh embodiment. In this case, the errors in the important positions of this circuit design are selected, and the error 291 which shrinks the pattern is distinguished from the error 292 which expands the pattern.

As described hereinabove, according to this embodiment, there is provided a pattern distortion detecting method and apparatus for selecting errors depending on whether the finished pattern shrinks or expands more than the design layout pattern.

For reference, in summarizing one aspect of the seventh embodiment, in the pattern distortion detecting apparatus, the pattern distortion detecting means selects and detects whether the finished pattern shrinks or expands more than the design layout pattern by comparing the polygonized predicted finished pattern with the test reference pattern.

Eighth Example

In each of the above described embodiments, positions at which the pattern distortion is large are detected by comparing the predicted finished pattern data with the design layout pattern data (or the reference layout data). However, there exists an important factor in this process as well as the size of the predicted pattern. That is a contrast.

Figure 30:
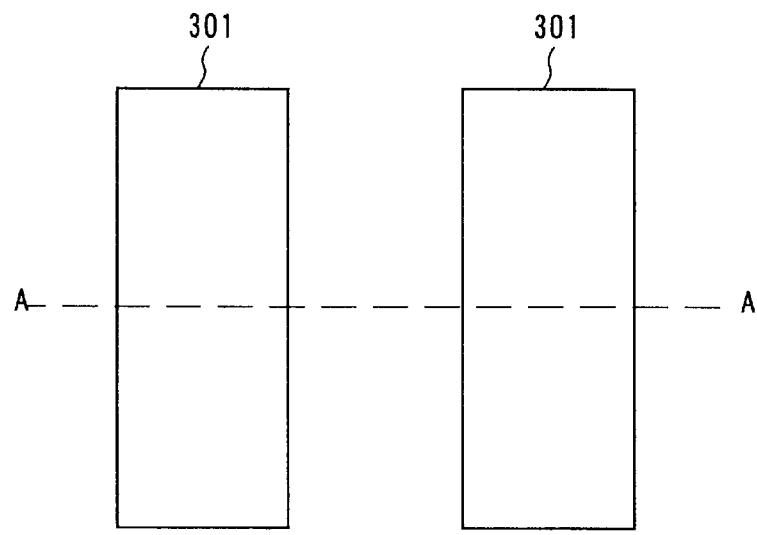
FIG. 30 shows a concrete example of an input layout pattern according to the eighth embodiment.
Figure 31:
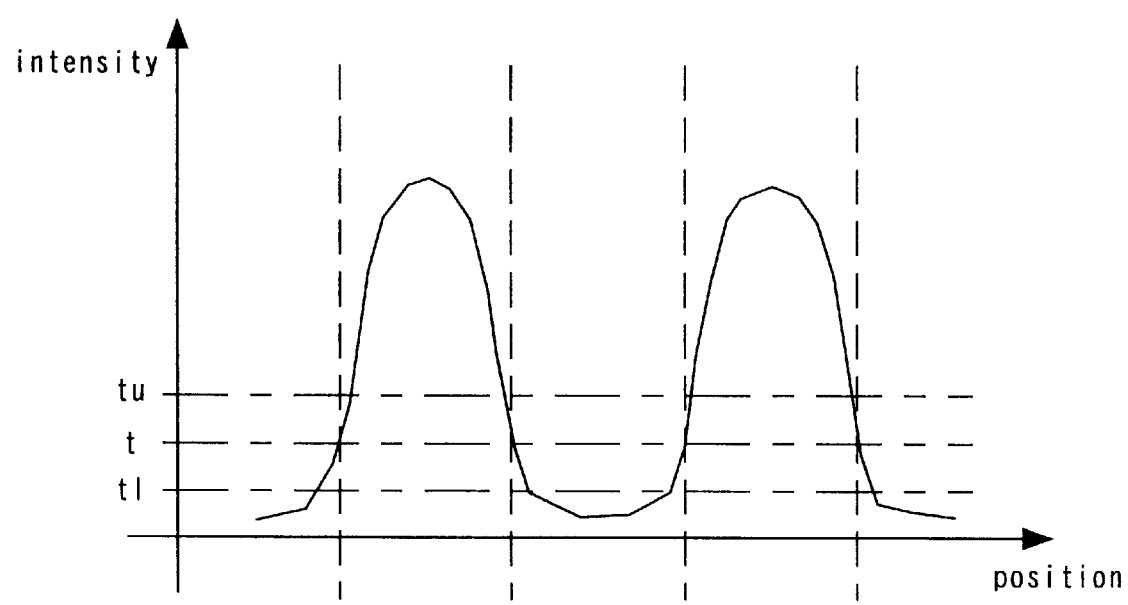
FIG. 31 shows a concrete example of an intensity distribution such as an optical intensity in FIG. 30.

FIG. 30 shows an example of a design layout pattern 301. FIG. 31 shows a distribution of the optical intensity, resist solubility calculated from the optical intensity or etching rate, relating to the position on the dotted line A—A in FIG. 30. A horizontal axis denotes the positions at the dotted line A—A in FIG. 30, and a vertical axis denotes an optical intensity or so on. Similarly, FIG. 32 shows another design layout pattern 321, and FIG. 33 shows a intensity graph for the position on the dotted line B—B in FIG. 32 as the same as FIG. 31.

Figure 32:
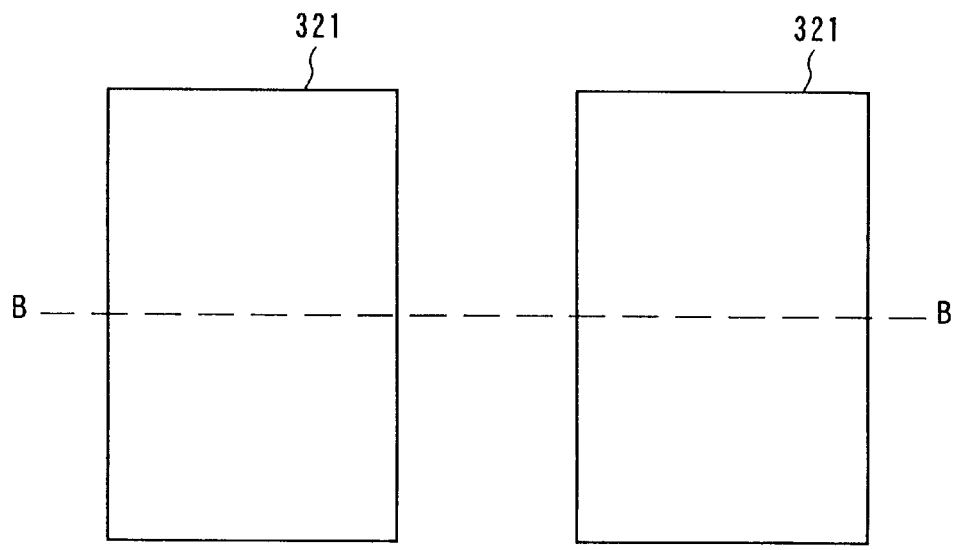
FIG. 32 shows another concrete example of an input layout pattern according to the eighth embodiment.
Figure 33:
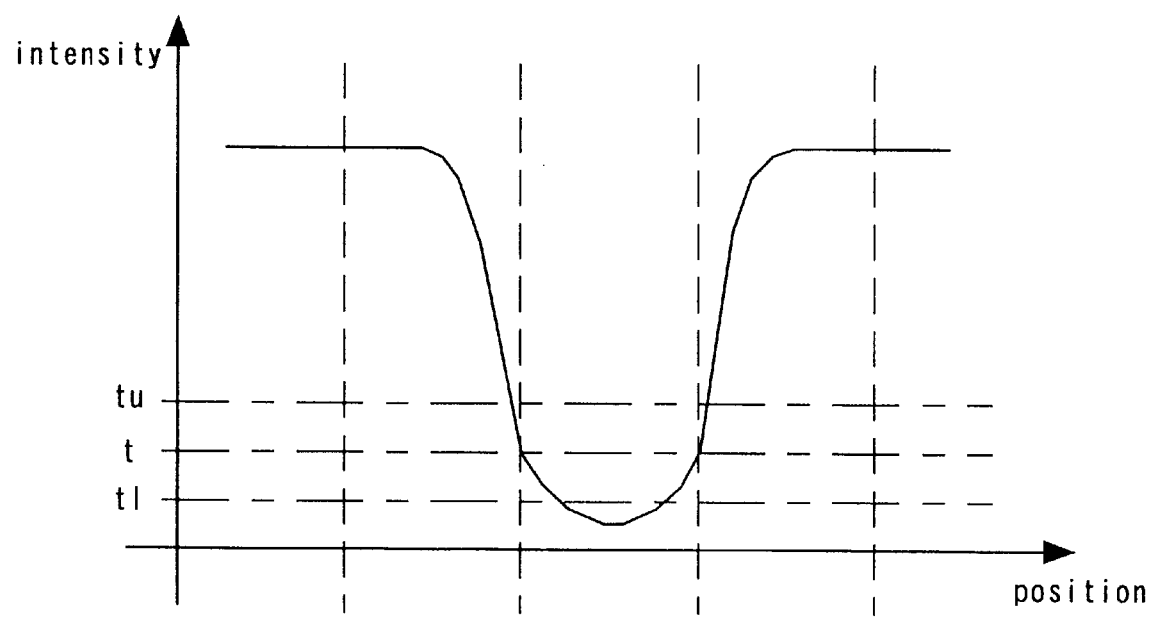
FIG. 33 shows a concrete example of an intensity distribution such as an optical intensity in FIG. 32.
Figure 34:
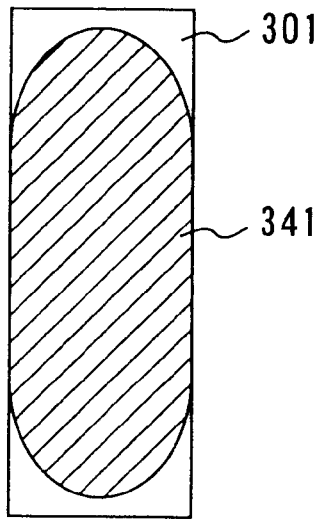
FIG. 34 shows an inspection result of a design layout pattern of FIG. 30 according to the first embodiment, as a comparison.
Figure 35:
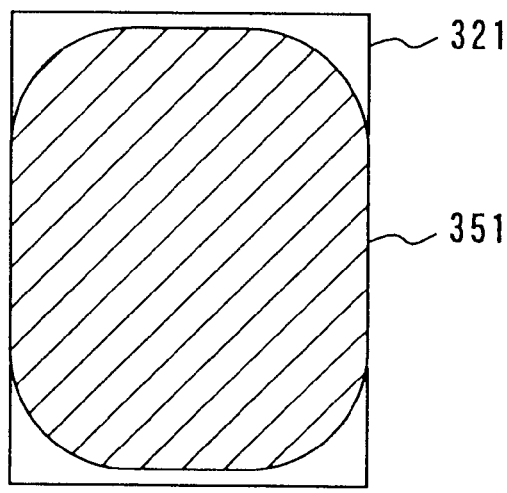
FIG. 35 shows an inspection result of a design layout pattern of FIG. 32 according to the first embodiment, as a comparison.

In the inspection for the pattern distortion according to the first embodiment, a position corresponding to a certain intensity such as an intensity 't' in FIG. 31 or FIG. 33 is considered to be an edge of the finished pattern, so that the finished pattern is predicted and the portion in which the distortion between this pattern and the design layout pattern is large is detected. The results of inspecting the design layout patterns in FIG. 30 and FIG. 32, according to the first embodiment, are respectively shown in FIG. 34 and FIG. 35. In FIG. 34, reference numeral 301 denotes a design layout pattern and 341 denotes a finished pattern predicted by the above described intensity t. In FIG. 35, reference numeral 321 denotes a design layout pattern and 351 denotes a finished pattern predicted by the above described intensity 't'. In both of FIG. 34 and FIG. 35, the amount of the gap between the finished pattern and the design layout pattern is not seen, so that the inspection results never show their difference.

Figure 36:
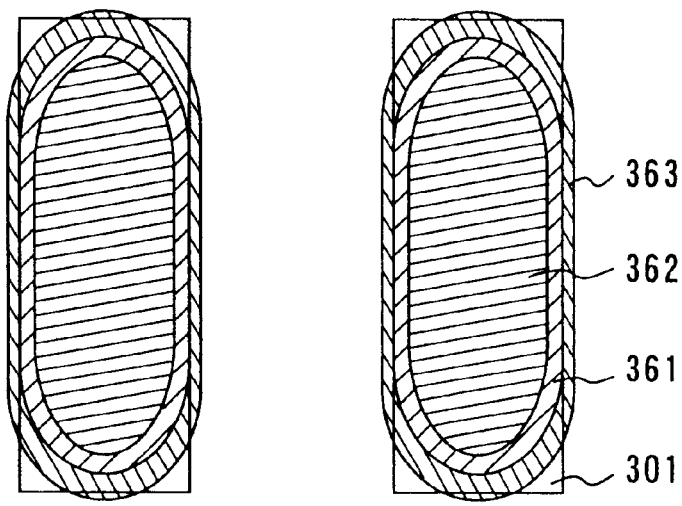
FIG. 36 shows a concrete example of a finished pattern corresponding to a design layout pattern in FIG. 30.

However, process conditions are often varied by some factors, and pattern edges defined by the intensity 't' of FIG. 31 or FIG. 33 are sometimes decided by the intensity 'tu' or 'tl'. FIG. 36 shows finished patterns, corresponding to the design layout pattern of FIG. 30, when the intensity which defines the pattern edge is changed. In FIG. 36, reference numeral 301 denotes a design layout pattern, reference numerals 361, 362 and 363 denote the finished patterns when their pattern edges are respectively decided by the intensities 't', 'tu' and 'tl'.

Figure 37:
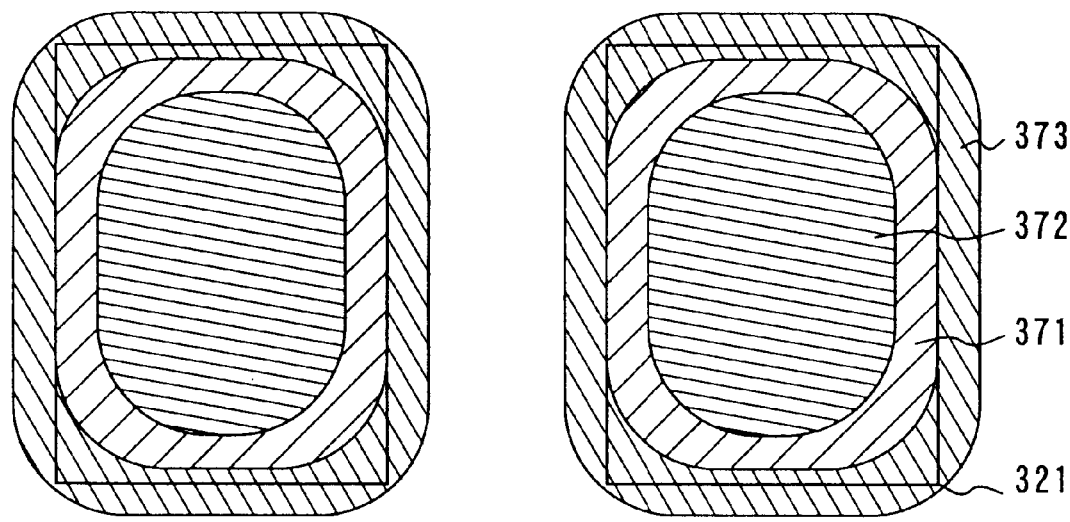
FIG. 37 shows a concrete example of a finished pattern corresponding to a design layout pattern in FIG. 32.

Similarly, FIG. 37 shows finished patterns corresponding to the design layout patterns in FIG. 32. In FIG. 37, reference numeral 321 denotes a design layout pattern, reference numerals 371, 372 and 373 denote the finished patterns when their pattern edges are considered to be respectively decided by the intensities 't', 'tu' and 'tl'. FIG. 37 shows that, comparing to FIG. 36, the variations between the sizes of the finished patterns are remarkable depending on the intensities which define the finished patterns. This is because the intensity contrast at the pattern edges in FIG. 37 is lower than that in FIG. 36, as understood by comparing the graph of FIG. 31 and that of FIG. 33. Since the finished state of the pattern is not good at the position where its contrast is low, it is necessary to inspect such a position. When the optical conditions are changed, the optical intensity distribution itself varies. When the defocus value, for example, among the optical conditions is changed, the optical intensity itself varies. In this case, it is also necessary to inspect the positions where the difference between the pattern variations is large. In the eighth embodiment, a pattern distortion detection which solves such a problem will be explained.

Figure 38:
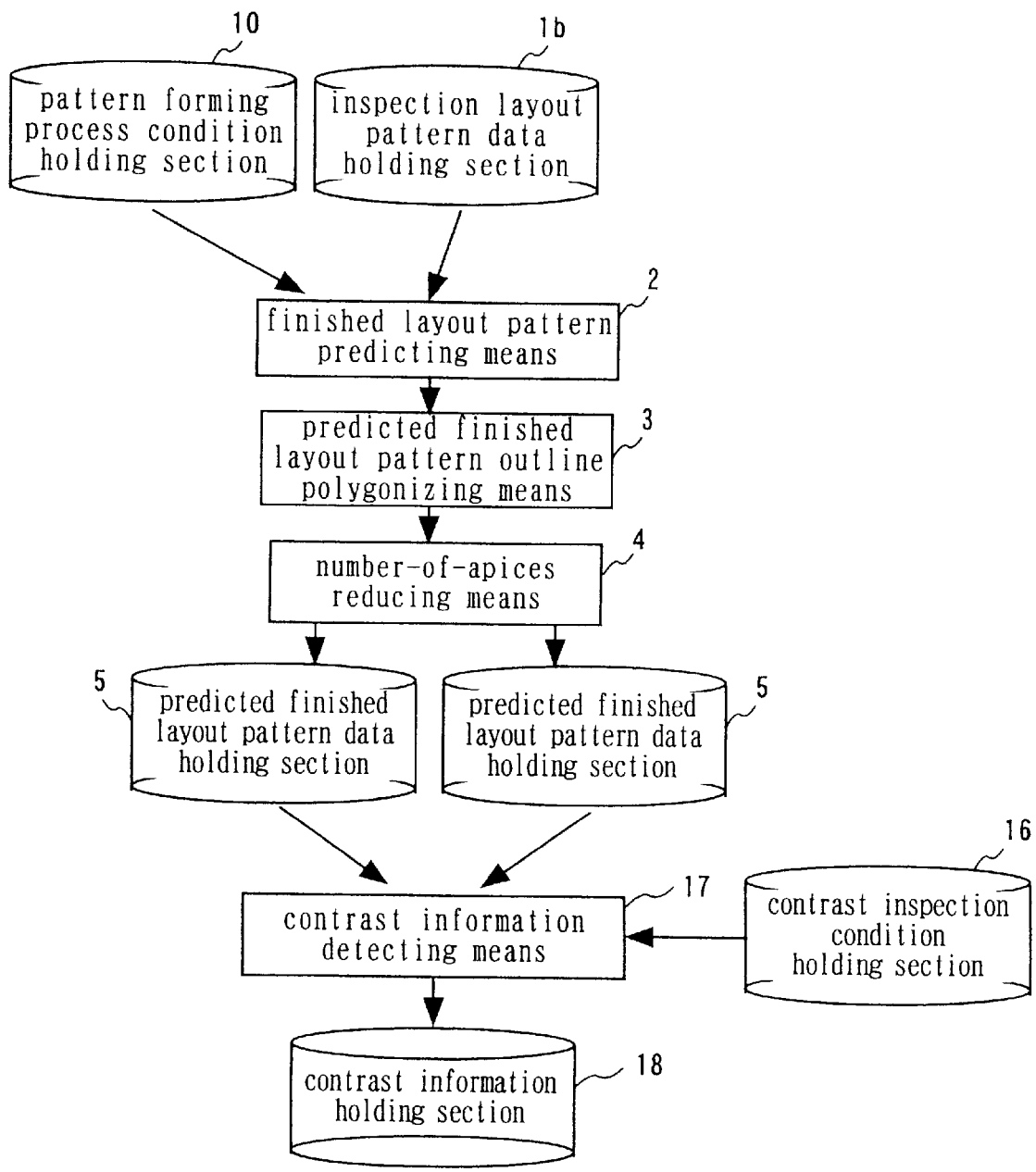
FIG. 38 shows a configuration of a pattern distortion detecting apparatus according to the eighth embodiment, that is, a configuration of a pattern distortion detecting apparatus having a contrast inspection function.

FIG. 38 is a block diagram showing the configuration of a pattern distortion detecting apparatus according to the eighth embodiment.

In FIG. 38, reference numeral 16 denotes a contrast inspecting conditions holding section for holding conditions which inspect the contrast of the pattern, 17 denotes a contrast information detecting means for detecting the contrast information of the pattern based on the contrast inspecting conditions, and 18 denotes a contrast information holding section for holding a result of inspection. Two or more predicted finished pattern data holding sections 5 are provided in the configuration, and FIG. 38 shows two predicted finished pattern data holding sections as an example.

The configuration of the eighth embodiment is different from that of the first embodiment. That is, a plurality of predicted finished pattern data holding sections 5 are provided which holds a plurality of predicted finished pattern data being predicted by a plurality of optical conditions or pattern forming process conditions such as a plurality of optical intensities. Further, the contrast information detecting means 17 which receives the contrast inspecting conditions from a contrast inspecting conditions holding section 16 is provided to output the information to the contrast information holding section 18. As a contrast inspecting condition, for example, a decreasing amount of the pattern which is defined to a certain value, that will be described hereinafter, may be adopted, and this value is held by the contrast information holding section 18.

Then, the operation will be explained.

Figure 39:
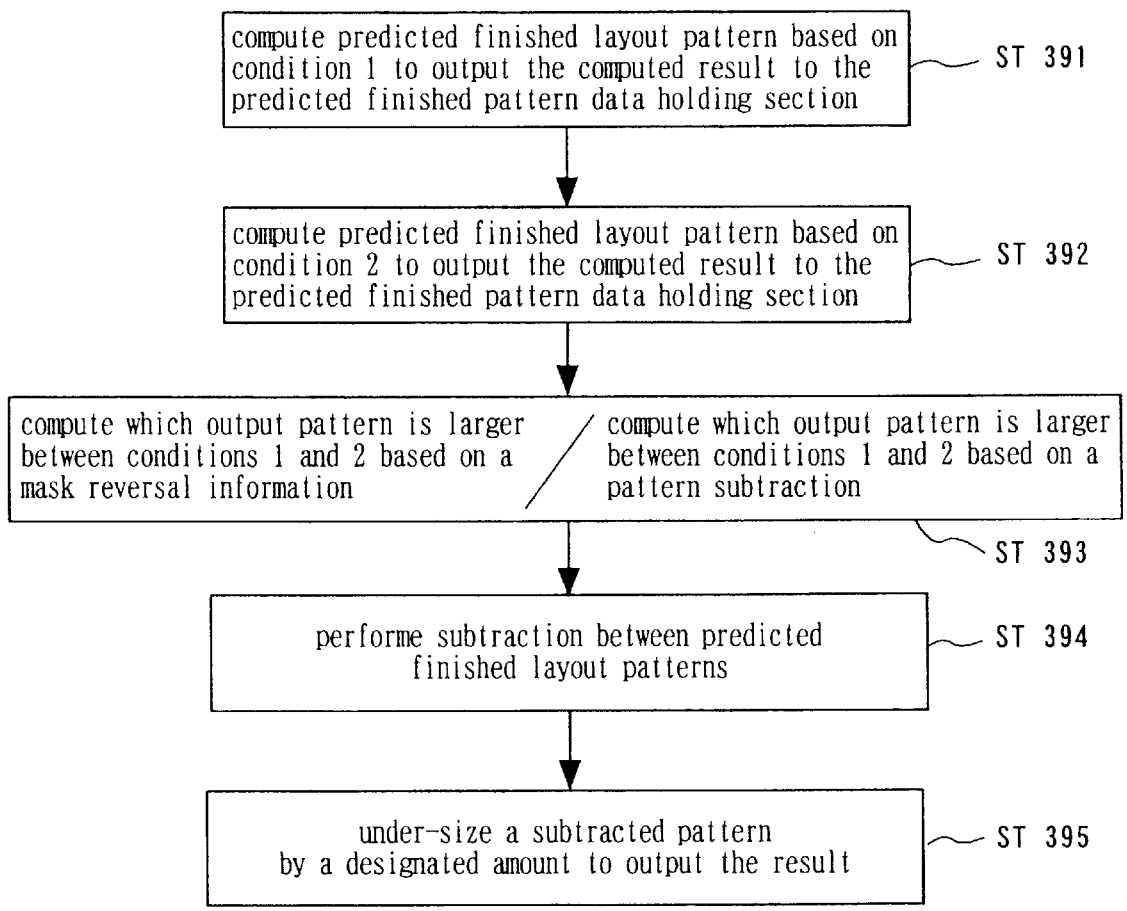
FIG. 39 is a flowchart showing a pattern distortion detection according to the eighth embodiment, that is, a flowchart for inspecting a contrast.

FIG. 39 is a flowchart showing an operation of a pattern distortion detecting apparatus of FIG. 38. At step 391 (ST391) and step 392 (ST392), predicted finished patterns are respectively computed based on each of the optical conditions or each of the pattern forming process conditions, to output the computed results to the predicted finished pattern data holding sections 5 respectively. At step 393 (ST393), the contrast information detecting means 17 decides that which one of the output patterns should be subtracted from the other one in the next step, based on the mask tone information or the inclusion relationship between the output patterns.

At step 394 (ST394), subtraction is performed between the predicted finished patterns. At step 395 (ST395), the size of the subtracted pattern is under-sized by a designated amount, corresponding to the inspecting conditions from the contrast inspecting conditions holding section 16, then the result is output to the contrast information holding section 18. In this way, a part with low contrast may be detected by under-sizing the subtracted pattern.

This embodiment will be concretely explained with an example hereinafter. When the inspecting layout patterns 301 of FIG. 30 are input, a predicted finished pattern 401 as described in FIG. 40 and a predicted finished pattern 411 as described in FIG. 41 are output at step 391 (ST391) and step 392 (ST392) respectively. In this case, an optical intensity of the exposure for pattern forming is changed as a plurality of optical conditions or pattern forming process conditions.

Figure 40:
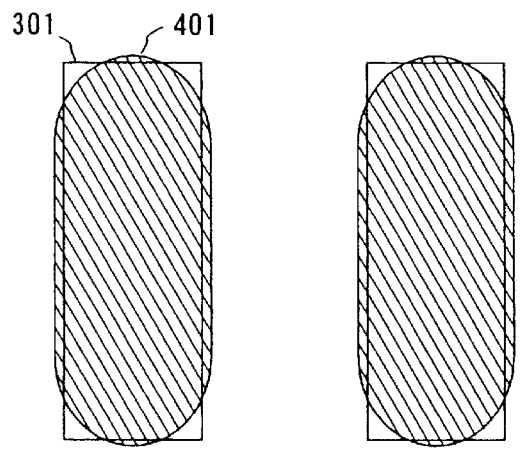
FIG. 40 shows a concrete example of a pattern in FIG. 30 processed by a method according to the eighth embodiment.
Figure 41:
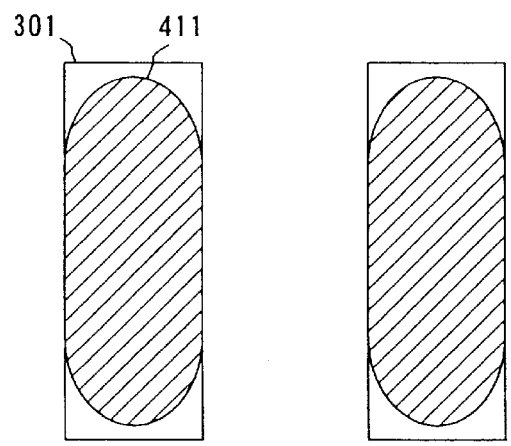
FIG. 41 shows a concrete example of a pattern in FIG. 30 processed by a different condition according to the method of the eighth embodiment.
Figure 42:
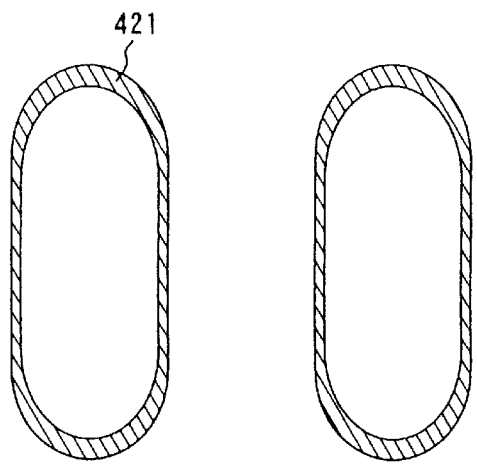
FIG. 42 shows a concrete example of a pattern in FIG. 30 as a result of subtraction operation, being processed by the method according to the eighth embodiment.
Figure 43:
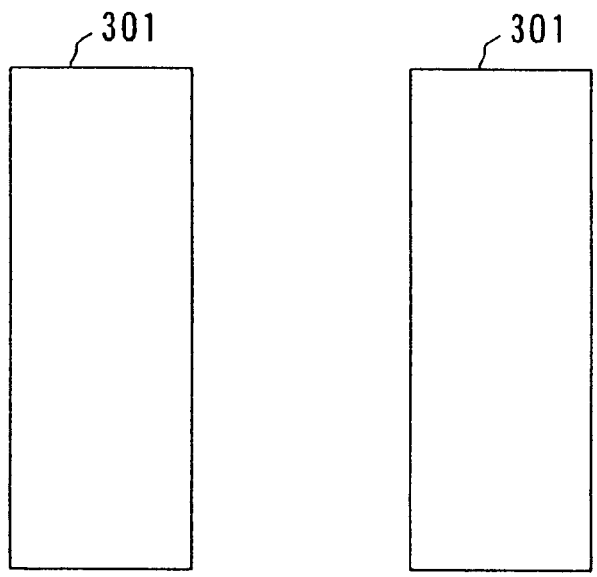
FIG. 43 shows a concrete example of a pattern in FIG. 30 as a result of decreasing its size by a method according to the eighth embodiment.

Then at step 393 (ST393), it is judged that the result of FIG. 41 is subtracted from the result of FIG. 40. FIG. 42 shows a pattern 421 which is a result of subtraction at step 394 (ST394). Further, the subtracted pattern is under-sized in order to detect a position where the contrast is low, and this result is as shown in FIG. 43. Since the positions with low contrast are not included, the under-sized pattern or error pattern is not output.

In this embodiment, "under-sizing" means that the outside of the pattern 421 of FIG. 42 (that is, the outside of the pattern 401 of FIG. 40) is shrunk by a certain amount, and the inside of the pattern 421 of FIG. 42 (that is, the outside of the pattern 411 of FIG. 41) is enlarged by a certain amount.

Figure 44:
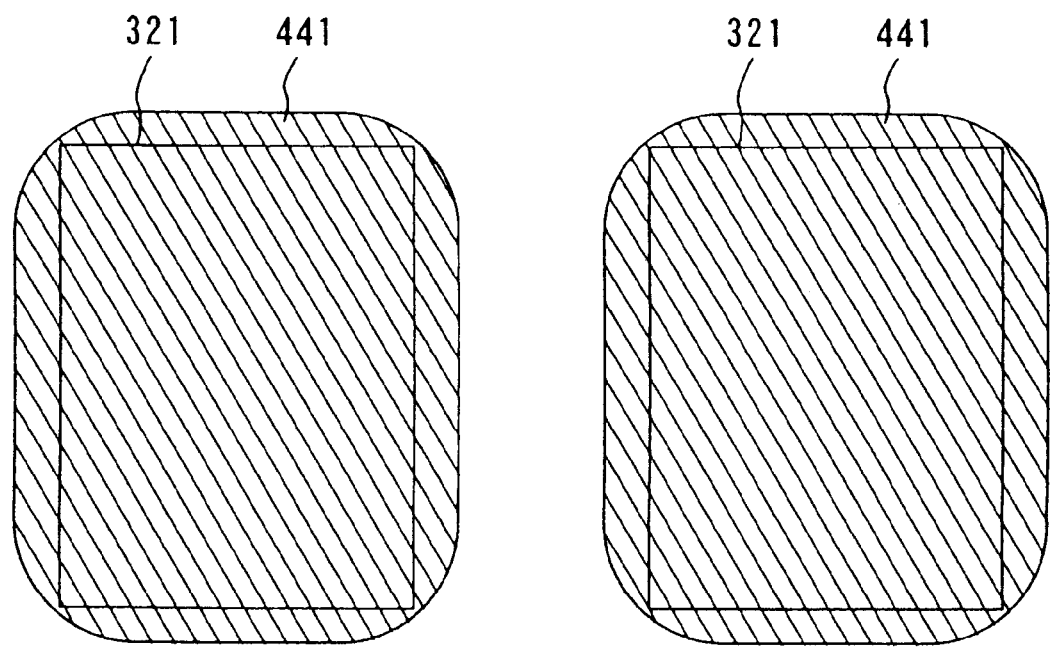
FIG. 44 shows a concrete example of a pattern in FIG. 32 processed by a method according to the eighth embodiment.
Figure 45:
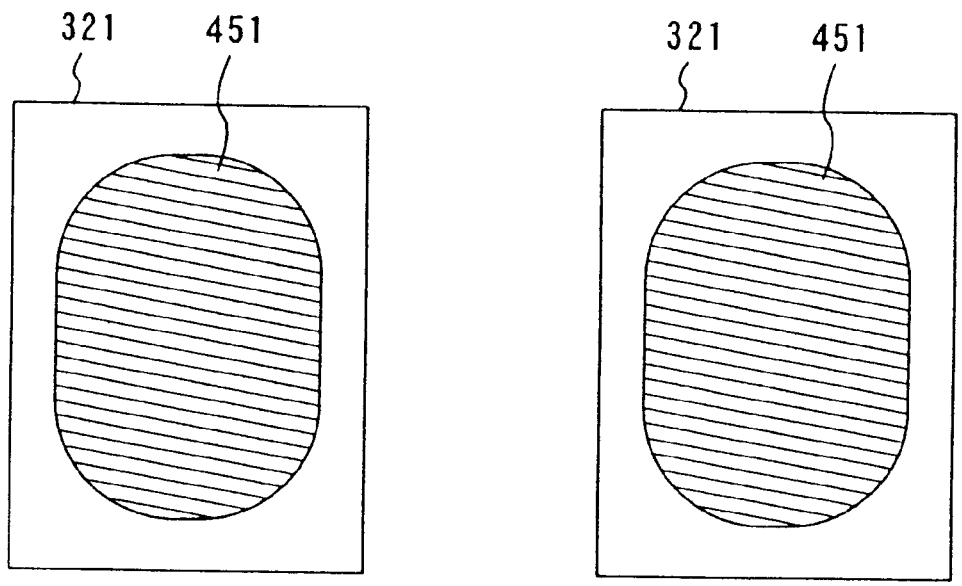
FIG. 45 shows a concrete example of a pattern in FIG. 32 processed by a different condition according to the method of the eighth embodiment.
Figure 46:
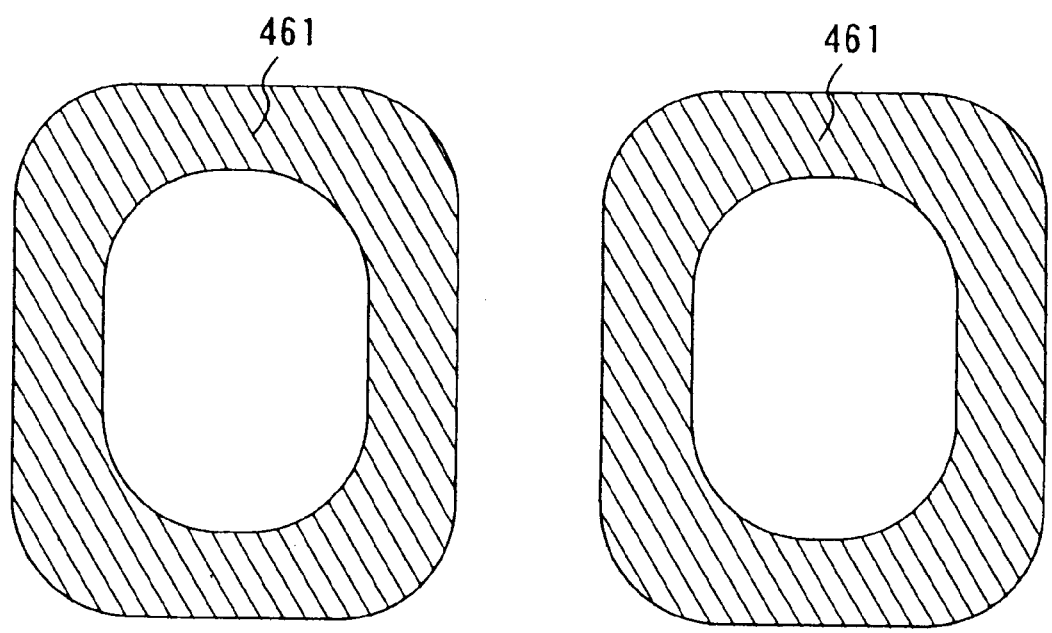
FIG. 46 shows a concrete example of a pattern in FIG. 32 as a result of subtraction operation, being processed by the method according to the eighth embodiment.

Similarly, when the inspecting layout patterns 321 of FIG. 32 are input, predicted finished pattern 441 as described in FIG. 44 and predicted finished pattern 451 as described in FIG. 45 are output at step 391 (ST391) and step 392 (ST392) respectively. This process advances from step 393 (ST393) to step 394 (ST394) at which the resulted pattern of FIG. 45 is subtracted from that of FIG. 44 to obtain a pattern 461 as described in FIG. 46. Then, the subtracted pattern is under-sized, and an error pattern 471 as described in FIG. 47 can be obtained.

As described above, according to this embodiment, a low contrast position in the predicted finished pattern may be detected where the process condition is poor.

As described above, according to this embodiment, a pattern distortion detecting method and apparatus is provided in which the predicted finished patterns are obtained corresponding to a plurality of optical conditions or pattern forming process conditions such as a plurality of optical intensities, subtraction between the predicted finished patterns is performed, the resulted pattern is under-sized by a certain amount to detect a position with low contrast, and the contrast is inspected.

For the above configuration, a pattern distortion detecting method and apparatus can further comprise a contrast inspecting function for outputting a pattern distortion error corresponding to a position where the contrast of the optical intensity is lower than a certain level.

In this way, this embodiment can inspect a position where the variations of the predicted finished pattern dimension are remarkable, considering the variations of a plurality of optical conditions or a plurality of pattern forming process conditions.

For reference, some aspects of the eighth embodiment may be summarized as follows.

In a pattern distortion detecting method and apparatus in a semiconductor manufacturing process, a predicted finished layout pattern is formed based on a design layout pattern or a inspection layout pattern. An outline of the predicted finished layout pattern is converted into a polygon to generate a polygonized predicted finished layout pattern. A pattern distortion in said predicted finished layout pattern is detected by logical figure operation of the input data of said polygonized predicted finished layout patterns. The logical figure operation may be a comparison operation between polygonized predicted finished layout patterns.

In the eighth embodiment too, a pattern distortion detecting apparatus may be constituted by an electric computer system. A process of pattern distortion detecting may be recorded as an computer program in a recording media. And, method of pattern distortion detection may be carried out by a computer by reading out the computer program. This applies to other embodiment to be described below.

Further for reference, in summarizing another aspect of the eighth embodiment, in the pattern distortion detecting apparatus, contrast information detecting means is provided for searching a plurality of predicted finished patterns by the finished pattern predicting means based on a plurality of optical conditions and/or a plurality of patterns forming process conditions, and for obtaining contrast information of the predicted finished pattern based on a difference between the plurality of predicted finished patterns.

In another aspect, in the pattern distortion detecting apparatus, the contrast information detecting means performs subtracting operation between the plurality of predicted finished patterns, and under-sizes an obtained figure by a designated amount to detect a low contrast part of the predicted finished pattern.

Ninth Embodiment

Figure 48:
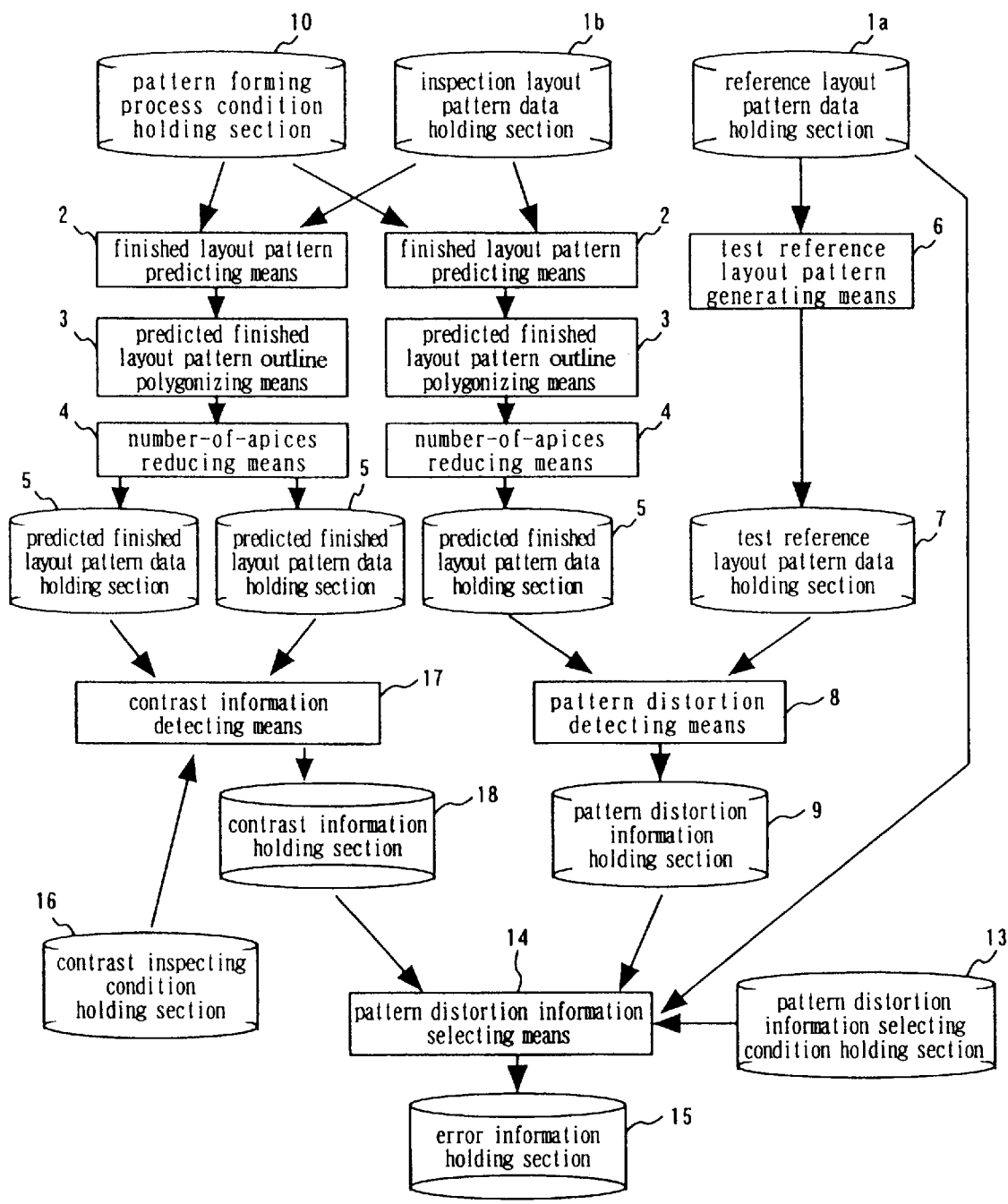
FIG. 48 shows a configuration of a pattern distortion detecting apparatus according to the ninth embodiment.

FIG. 48 is a combination of FIG. 16 and FIG. 38, and is a block diagram showing an example of configuration of a pattern distortion detecting apparatus including all of the functions explained in the sixth through eighth embodiments. A pattern distortion detecting apparatus having all of the functions of the sixth through eighth embodiments can be provided according to the above described explanations.

Although, in the above described sixth through ninth embodiments, only the detection of pattern distortion positions is explained, it is clearly understood that the design layout pattern data can be automatically corrected based on the detected result. Further, it is also clear that a pattern error depending on a contrast level may be selected, and the design layout pattern data can be automatically corrected by using the result.

Tenth Embodiment

In the pattern distortion detecting apparatus and method as illustrated in the respective embodiments above, as typically illustrated referring FIGS. 1 and 2 in the first embodiment, for example, a pattern distortion was inspected only by means of a single predicted finished pattern. Accordingly, highly accurate inspection is restricted when there are some differences in optical conditions or process conditions.

The respective embodiments described hereinafter are provided in order to solve the above problem. It is intended in the following embodiments to obtain pattern distortion errors more accurately by generating a plurality of different predicted patterns according to different optical or process conditions and performing graphical operation between these patterns and the design layout pattern (original layout pattern).

Figure 49:
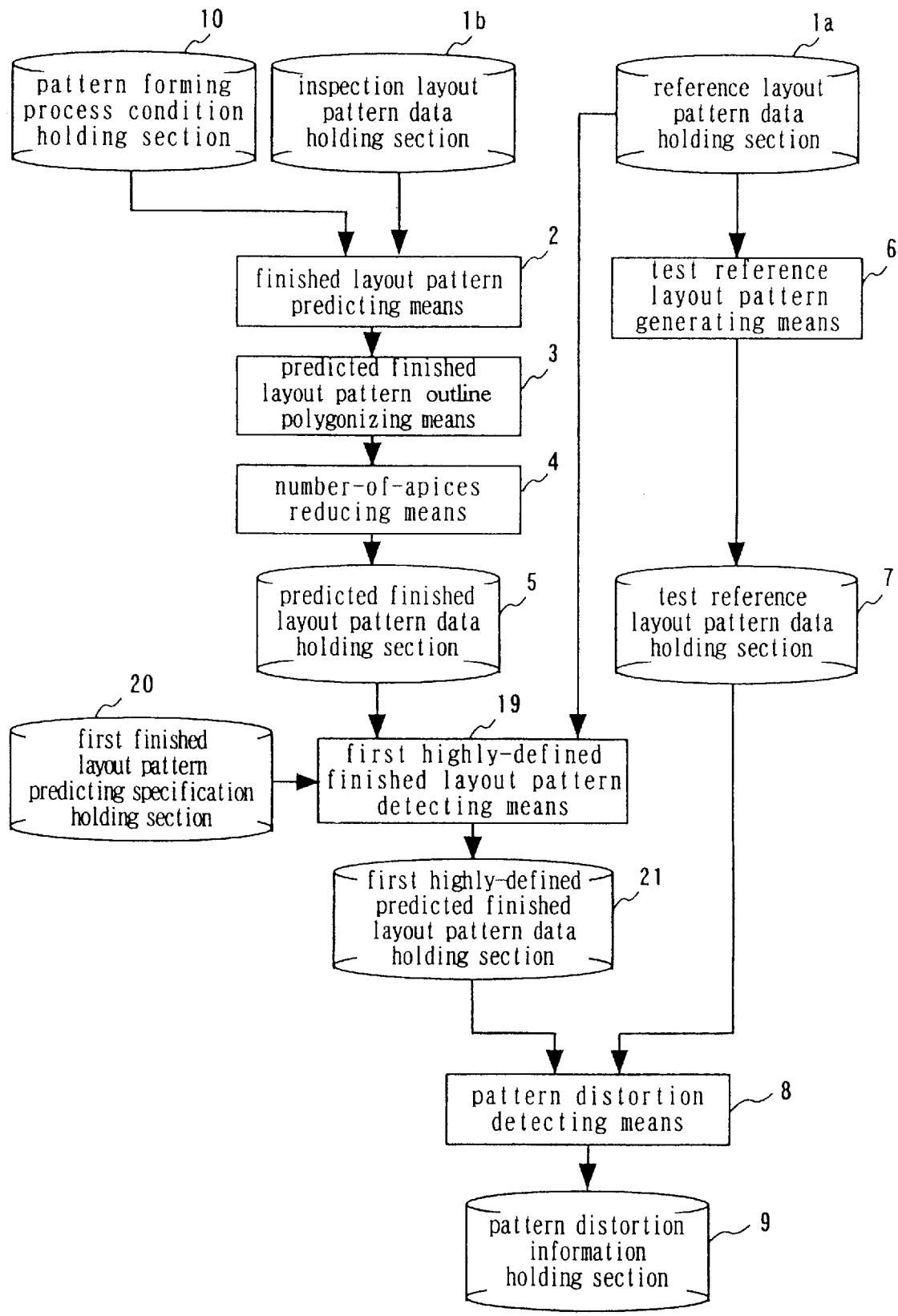
FIG. 49 is a block diagram showing the configuration of the pattern distortion inspecting apparatus according to a tenth embodiment of the invention.

FIG. 49 is a block diagram showing the configuration of a pattern distortion detecting apparatus according to a tenth embodiment of the present invention. Comparing FIG. 49 with FIG. 1, it is noticed that the design layout pattern data holding section 1 in FIG. 1 is separated into a reference layout pattern data holding section 1a and an inspection layout pattern data holding section 1b in FIG. 49. It has been shown, however, for the configuration in FIG. 16 in a sixth embodiment and is not novel for this embodiment.

The configuration in FIG. 49 is different from the configuration in FIG. 1 in the following points. First, the predicted finished pattern data holding section 5 is connected to a first highly-defined finished pattern detecting means 19. A first finished pattern predicting specification holding section 20 is connected as an input to the first highly-defined finished pattern predicting means 19, and a first highly-defined predicted finished pattern data holding section 21 is connected as an output. In addition, the reference layout pattern data holding section 1a is connected as an input to the first highly-defined predicted finished pattern detecting means 19. Further, an output of the first highly-defined prediction finished pattern data holding section 21 is connected to a pattern distortion detecting means 8.

Thus, the tenth embodiment is characterized in that it comprises the first highly-defined finished pattern predicting means 19 connected to the reference layout pattern data holding section 1a, the predicted finished pattern data holding section 5, and the first finished pattern predicting specification holding section 20 as inputs.

The operation will be hereinafter described.

Figure 50:
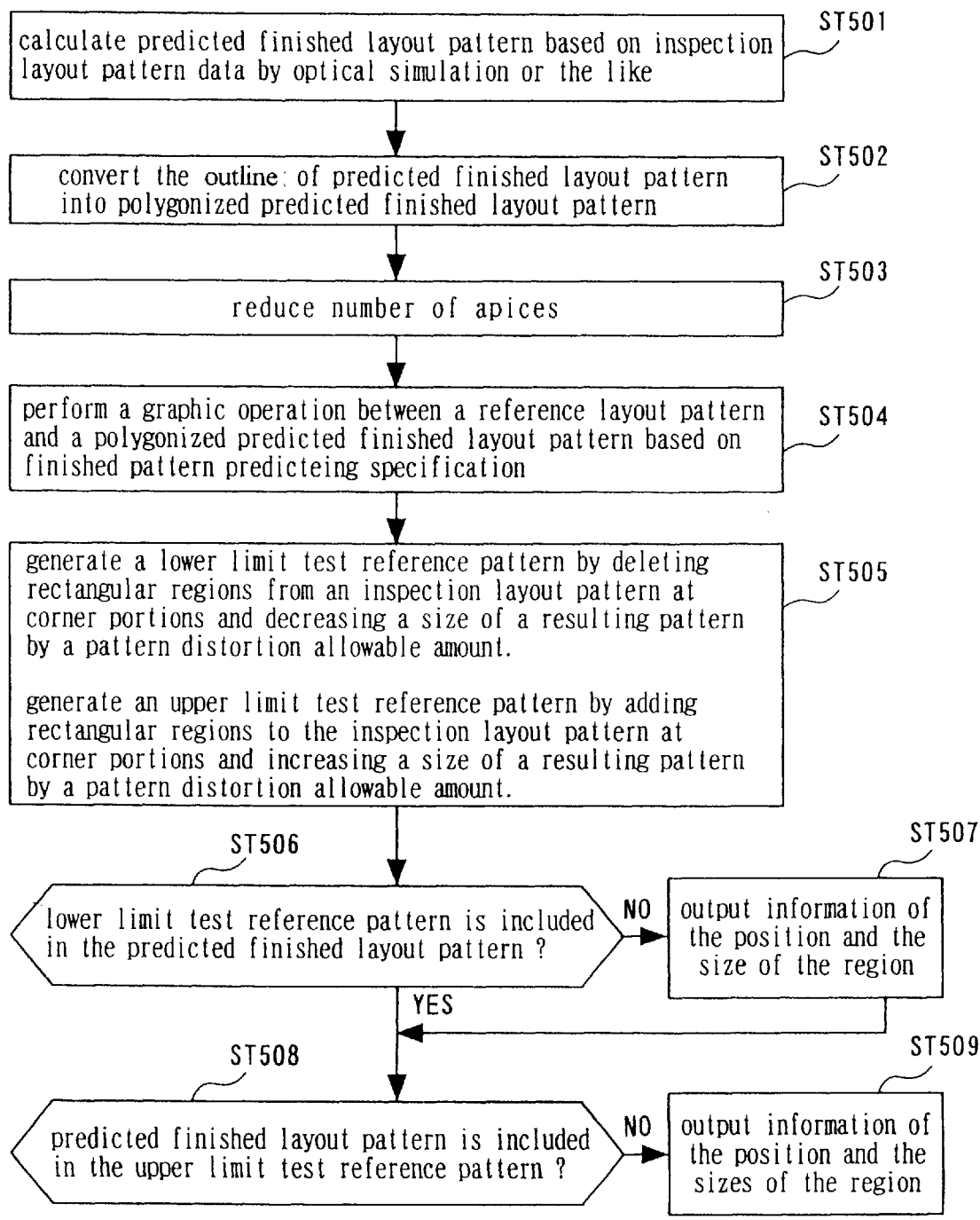
FIG. 50 shows a flow for the operation of the pattern distortion inspection according to a tenth embodiment of the invention.

FIG. 50 is a flowchart showing the operation of the pattern distortion detecting apparatus having the above constitution.

In the flow of FIG. 50, steps 501 (ST501) to 503 (ST503) are similar to steps 21 (ST21) to 23 (ST23) in FIG. 2 in the first embodiment. Steps 505 (ST505) and later in FIG. 50 are similar to steps 25 (ST25) and later in FIG. 2.

Step 504 (ST504) in FIG. 50 is characteristic of this embodiment. In step 504 (ST504), logical figure operations are performed between a design layout pattern (an original layout pattern) and the predicted layout patterns based on finished pattern predicting specification for refining a predicted finished pattern corresponding to a plurality of optical conditions and/or a plurality of pattern forming process conditions.

Here, the "finished pattern predicting specification" means a logic to perform logical figure operation between a reference layout pattern and a plurality of predicted finished layout patterns corresponding to a plurality of optical or pattern forming conditions.

In the first prediction of a finished pattern based on the first finished pattern predicting specification, logical figure operation is performed between a reference layout pattern and a single predicted finished pattern.

Again in the present application, "logical figure operation" means operation that is carried out by one or combination of operations such as AND, OR, NOT, XOR, sizing, inclusion relation processing among figure patters, contacting, corner portion processing, internal or external distance processing, etc, which can be operated as a general layout inspection tool.

Figure 51:
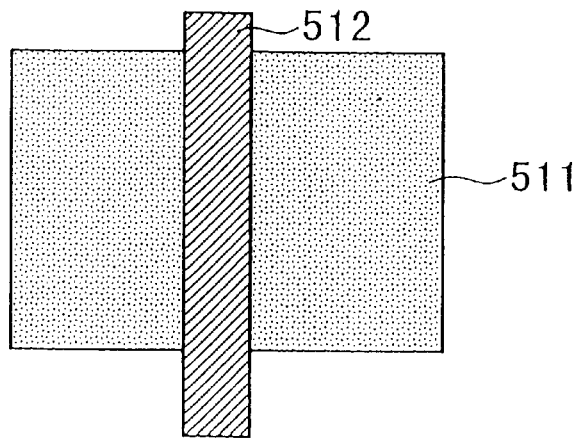
FIG. 51 shows concrete examples of input layout patterns according to the tenth and eleventh embodiments of the invention.

FIG. 51 shows a concrete example of an input layout pattern, that is, a design layout pattern.

Figure 52:
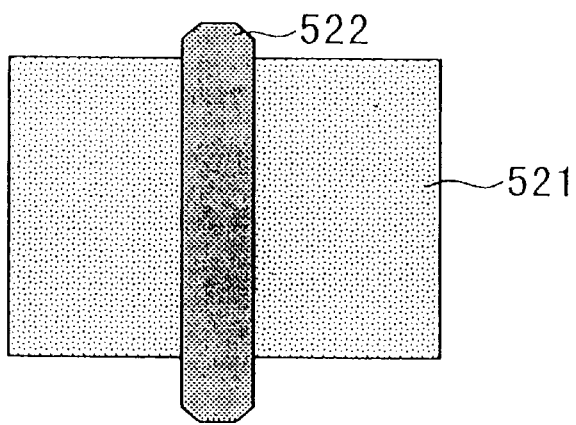
FIG. 52 shows an exemplified predicted finished pattern according to a first embodiment, etc., for comparison.

In FIG. 51, reference numeral 511 denotes an active area of a transistor and 512 a gate wiring of the transistor. The result of pattern prediction using the gate wiring 512 as an input by the method of the first embodiment, etc., is shown in FIG. 52. In FIG. 52, 521 denotes the same active area as in FIG. 51, and 522 is a predicted pattern using the gate wiring 512 in FIG. 51 as an input.

Figure 53:
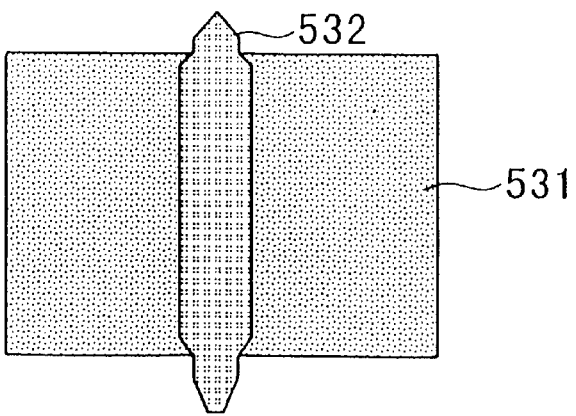
FIG. 53 shows an exemplified input layout pattern of FIG. 51 actually formed on a wafer.

With respect to an input layout pattern, a shape of a pattern actually formed on a wafer is shown in FIG. 53. In FIG. 53, 531 denotes the same active area as in FIG. 51, and 532 denotes a shape of a pattern of a gate wiring 512 in FIG. 51 actually formed on a wafer. A comparison between FIG. 52 and FIG. 53 shows that the shapes of parts not overlapping the active areas 521 and 531 are quite different.

An area of the gate wiring 522 is formed following formation of an area of the active area 521 in actual wafer processing. However, there is vertical differences in a normal line direction against a sheet plane between the inside and the outside of the active area 521 in an actual wafer. As a result, a pattern of the gate wiring area 522 formed differs between the inside and the outside of the active area 531 as shown in FIG. 53. Therefore, a function to change pattern predicting methods is required for parts under different conditions on layout, such as the inside and the outside of the active area 531.

Figure 54:
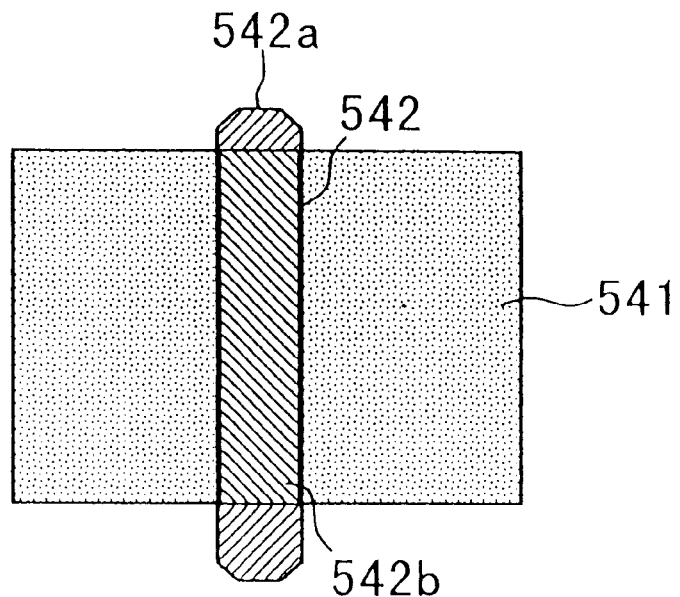
FIG. 54 shows a concrete example of pattern predicting specification according to a tenth embodiment of the present invention.

FIG. 54 is to explain a concrete example of pattern predicting specification of the tenth embodiment and shows the relationship between the predicted pattern for gate wiring and the active area (active areas 511, 521, and 531 in FIGS. 51–53).

In FIG. 54, reference numerals 541 and 542 denote an active area and a predicted pattern for the gate wiring and 542a shows a predicted pattern for the outside of the region 541 and 542b is that for the inside. The predicted patterns 542a and 542b can be obtained by NOT processing and AND processing of the predicted pattern 542 and the active area 541, respectively.

Figure 55:
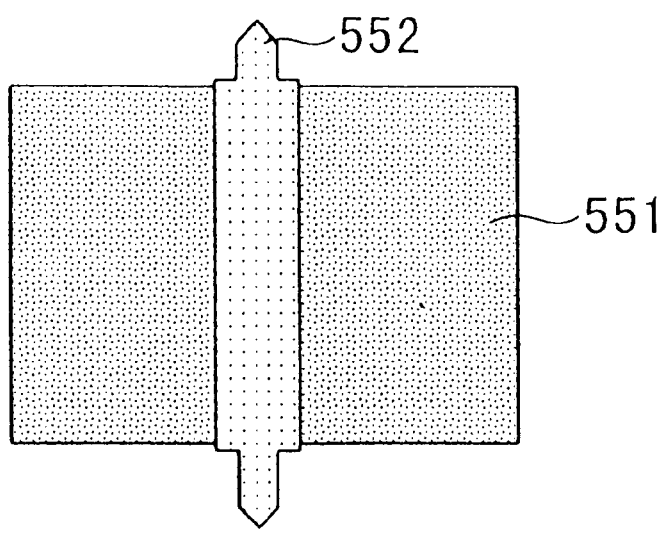
FIG. 55 shows an example of a predicted finished pattern according to a tenth embodiment of the present invention.

Here, the finished pattern predicting specification for graphical operation is set "to under-size the area of the predicted pattern 542a, and to merge (OR processing) the results and the predicted pattern 542b", which is supplied from the first finished pattern predicting specification holding section 20 to the first highly-defined finished pattern predicting means 19. Resultantly, the predicted pattern 552 as shown in FIG. 55 is obtained. The active area 551 in FIG. 55 is the same as that in FIGS. 51–53. Thus, FIG. 55 shows an example of a predicted finished pattern according to this embodiment.

As mentioned above, a predicted pattern close to the condition in FIG. 53 can be obtained by applying the finished pattern predicting specification to the flow in FIG. 50.

Although the area of the predicted pattern 542 is restricted and then logical figure operations between the predicted pattern 542 and the active area 541 are conducted in this embodiment, graphical operations can be performed for the predicted pattern 542 on a whole without restricting area.

As described above, in this embodiment, polygonized predicted finished pattern can be highly defined by performing logical figure operations between polygonized predicted finished patterns and a design layout pattern based on finished pattern predicting specification corresponding to a plurality of optical conditions and/or a plurality of pattern forming process conditions in the highly-defined finished pattern predicting means 19.

According to this embodiment, as mentioned above, finished patterns for the processes under partially different conditions can be predicted and pattern distortion can be inspected according to the prediction. In addition, it is apparent that this embodiment is effective for deformations of predicted patterns generally correlated to a layout as well as influence of the step portions.

For reference, in summarizing one aspect of the tenth embodiment, in the pattern distortion detecting apparatus, a refined finished pattern predicting means is provided to highly define the polygonized predicted finished pattern by performing graphical operations between the polygonized predicted finished pattern and the design layout pattern based on finished pattern predicting specification corresponding to a plurality of optical conditions and/or a plurality of pattern forming process conditions.

Eleventh Embodiment

Figure 56:
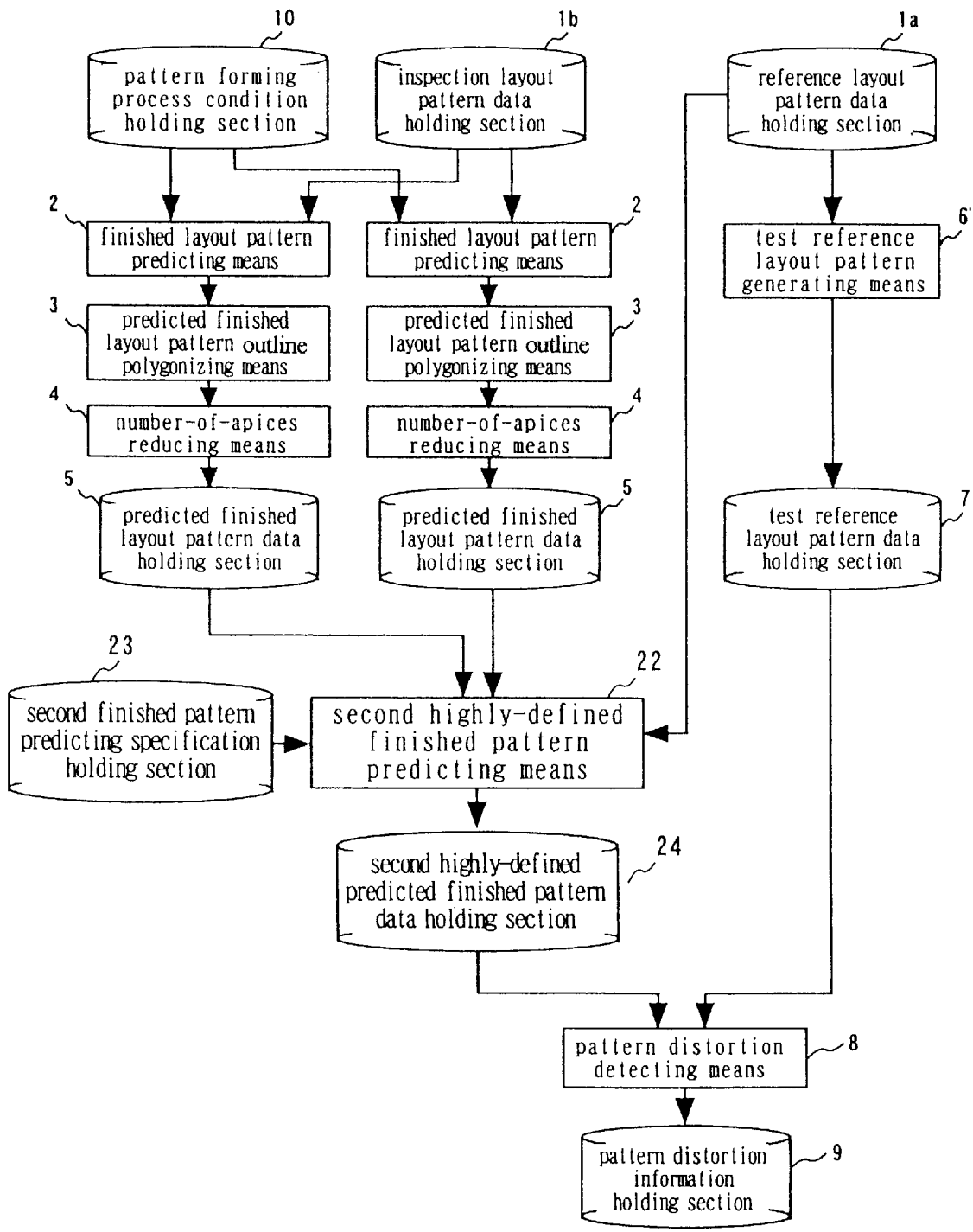
FIG. 56 is a block diagram showing the configuration of the pattern distortion inspecting apparatus according to the eleventh to thirteenth embodiments of the invention.

FIG. 56 is a block diagram showing the configuration of the pattern distortion detecting apparatus according to an eleventh embodiment of the present invention.

This configuration is different from that shown in FIG. 49 according to a tenth embodiment in the following points. First, in FIG. 56 according to this embodiment, there is provided multiple sets of the configuration from the finished patterns predicting means 2 to 4 the predicted finished pattern data holding section 5, that is, the finished pattern predicting means 2, the predicted finished pattern outlines polygonizing means 3, the number-of-apices reducing means 4, the predicted finished pattern data holding section 5, in FIG. 49. In FIG. 56, two sets are shown.

In FIG. 56, a second highly-defined finished pattern predicting means 22 is provided, to which a plurality of predicted finished pattern data holding section 5 are connected as a plurality of inputs. To the second highly-defined finished pattern predicting means 22, a second finished pattern predicting specification holding section 23 is connected as an input, and a second highly-defined predicted finished pattern data holding section 24 is connected as an output. The output of the second highly-defined predicted finished pattern data holding section 24 is connected to the pattern distortion detecting means 8. To the second highly-defined finished pattern predicting means 22, the reference layout pattern data holding section 1a is connected as an input.

The eleventh embodiment is characterized in that the second highly-defined finished pattern predicting means 22, to which the reference layout pattern data holding section 1a and a plurality of predicted finished pattern data holding section 5 and the second finished pattern predicting specification holding sections 23 are input, as mentioned above.

Then, the operation will be explained below.

Figure 57:
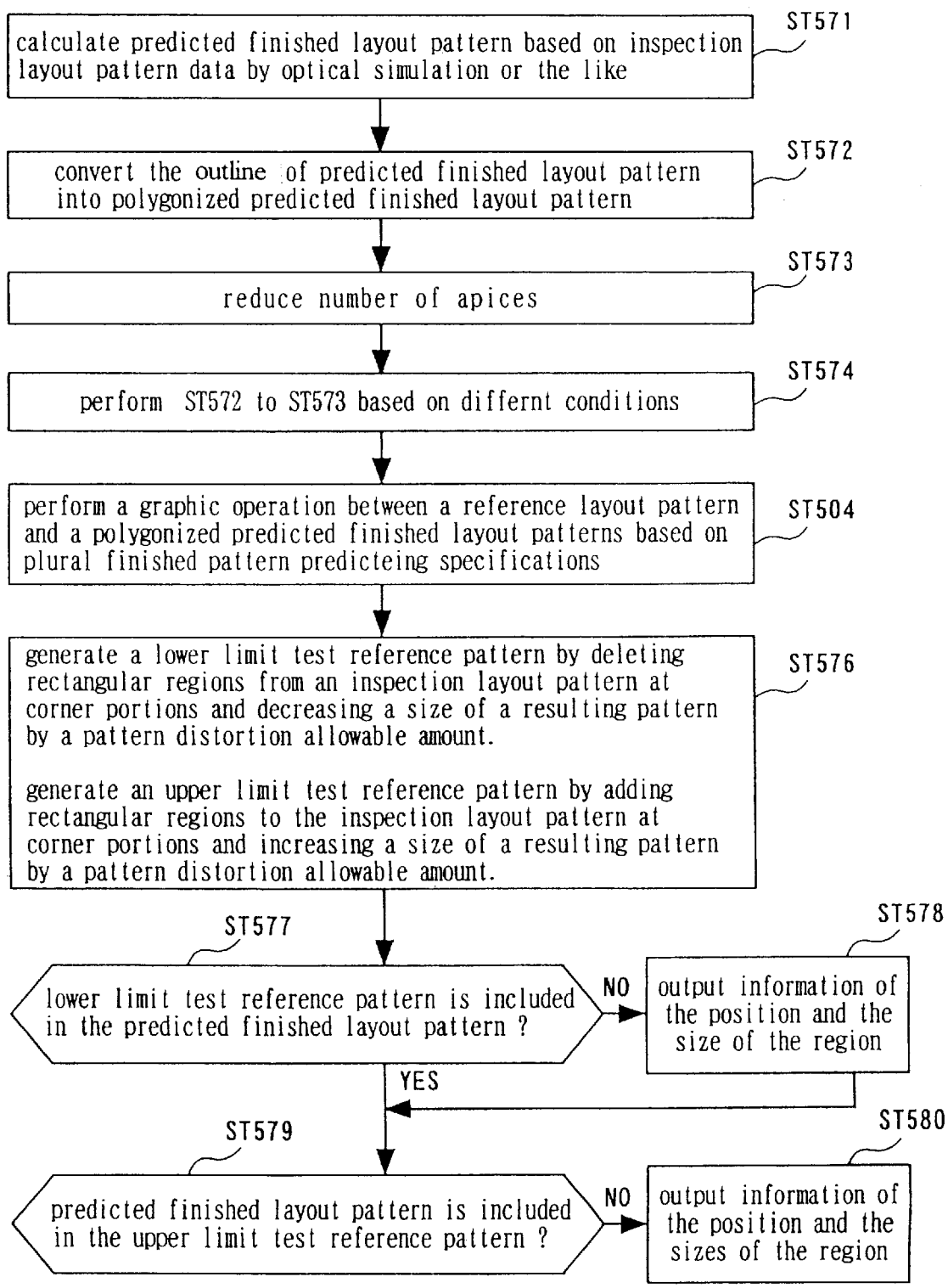
FIG. 57 shows a flow for the operation of the pattern distortion inspection according to the eleventh to thirteenth embodiments of the invention.

FIG. 57 is a flowchart showing the operation of pattern distortion detection according to this embodiment. Steps 571 (ST571) to 573 (ST573) inthe flowchart shown in FIG. 57 are similar to steps 501 (ST501) to 503 (ST503) in FIG. 50 of the tenth embodiment. In addition, steps 576 (ST576) or later in FIG. 57 are also similar to steps 505 (ST505) or later in FIG. 50.

Steps 574 (ST574) and 575 (ST575) in FIG. 57 are characteristic of this embodiment. A predicted finished pattern is obtained under one condition in FIG. 50 for the tenth embodiment, whereas a flow from step 571 (ST571) to step 573 (ST573) is repeated several times under a plurality of conditions, that is, corresponding to a plurality of optical conditions and/or pattern formation process conditions, in step 574 (ST574) in the flow of this embodiment.

A predicted finished pattern can be obtained by performing graphical operations on a plurality of finished patterns thus obtained, based on the second finished pattern specification based on the second finished pattern predicting specification supplied by the second finished pattern predicting specification holding section 23 in the second highly-defined finished pattern predicting means 22 in step 575 (ST575).

Figure 58:
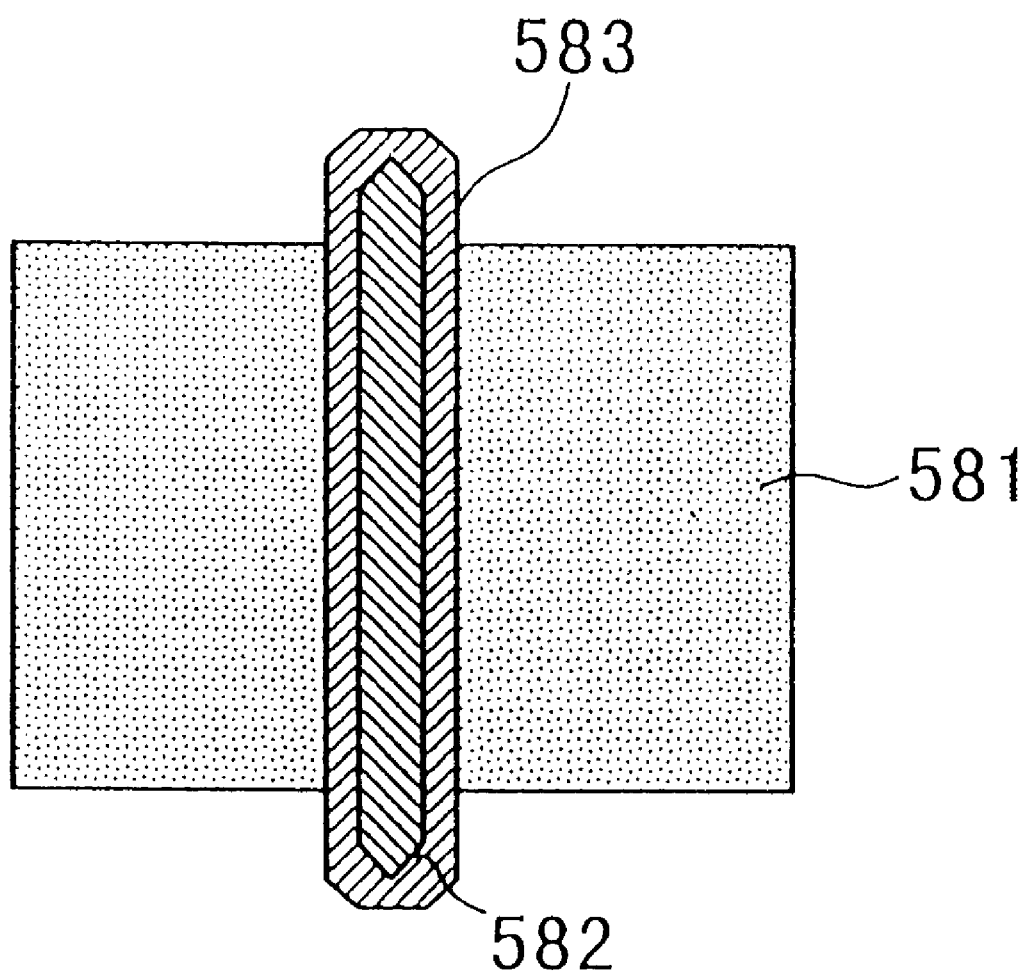
FIG. 58 illustrates the process of pattern prediction according to an eleventh embodiment of the present invention.

The operation will be described in detail below. FIG. 58 is to explain a process of pattern prediction according to this embodiment. When a gate wiring 512 in FIG. 51 is to be inspected, optical or process conditions differ between the inside and the outside of the active area 511, as mentioned above. FIG. 58 shows an example of pattern prediction performed under different conditions. The active area 581 in FIG. 58 is the same as the active area 511 in FIG. 51. Reference numeral 582 in FIG. 58 is a pattern predicted under the conditions for the outside of the active area 581, and 583 is a pattern predicted under the conditions for the inside of the active area 591.

After that, logical figure operations are conducted between each of the predicted finished patterns and the design layout pattern, based on the second finished pattern predicting specification from the second predicted pattern specification holding section 23, and the results are merged in the second highly-defined finished pattern predicting means 22.

When the second finished pattern predicting specification is set "to merge (OR processing) the results of AND processing of predicted patterns 583 and 581 and the results of NOT processing of predicted patterns 582 and 581," then the results similar to actual patterns as shown in FIG. 53 can be obtained.

As mentioned above, according to this embodiment, a highly-defined predicted finished pattern is generated by predicting a plurality of finished predicted patterns corresponding to a plurality of processes with partially different optical condition and/or pattern forming process conditions, performing graphical operations between the predicted patterns and a design layout pattern, and merging the results. This highly-defined predicted finished pattern thus obtained can be employed to perform inspection of pattern distortion more accurately than in the tenth embodiment. It is apparent that this embodiment is effective not only for influence of the step height but also for deformations of a predicted pattern generally correlated to a layout.

For reference, in summarizing one aspect of the eleventh embodiment, in the pattern distortion detecting apparatus, a highly-defined finished pattern predicting means is provided to generate a highly-defined predicted finished pattern by performing graphical operations between each of a plurality of polygonized predicted finished patterns generated corresponding to a plurality of optical conditions and/or a plurality of pattern forming process conditions and the design layout patterns based on preset finished pattern predicting specification and merging the results.

Twelfth Embodiment

A pattern distortion inspecting apparatus and an inspection flow in a twelfth embodiment are explained by means of the same figure as for the first embodiment. (The configuration of the pattern distortion inspecting apparatus and the inspection flow in the twelfth embodiment are the same as those in the eleventh embodiment.)

In the eleventh embodiment, graphical operations are conducted between each of a plurality of predicted finished patterns and a design layout pattern. On the other hand, in this twelfth embodiment, graphical operations are performed among a plurality of predicted finished patterns.

Figure 59:
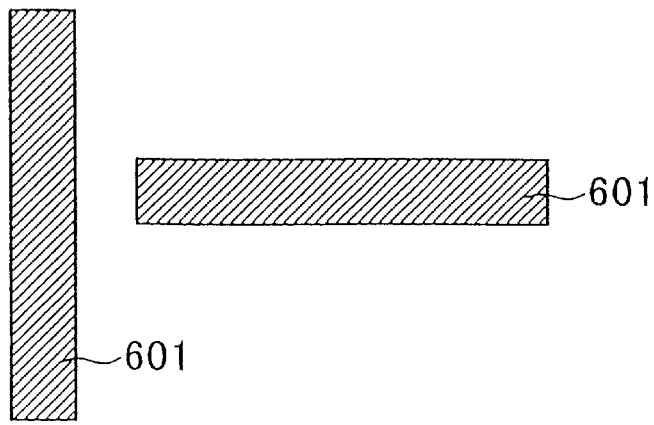
FIG. 59 shows a concrete example of an input layout pattern according to a twelfth embodiment of the present invention.
Figure 60:
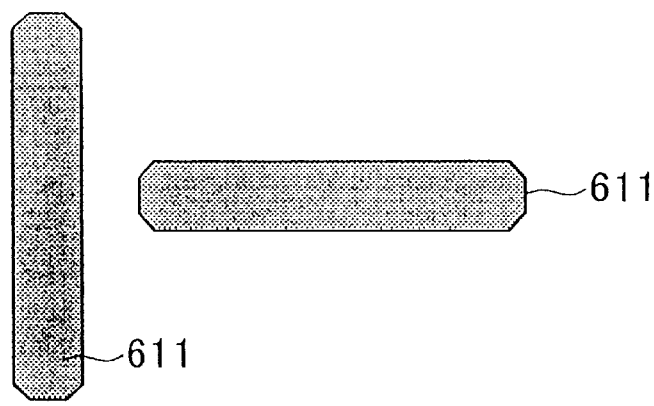
FIG. 60 is a pattern view illustrating the pattern predicting process according to a twelfth embodiment of the present invention.
Figure 61:
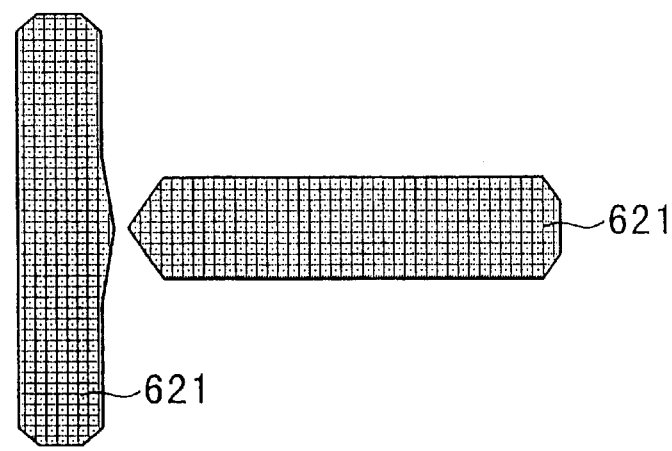
FIG. 61 is a pattern view illustrating the pattern predicting process according to a twelfth embodiment of the present invention.
Figure 62:
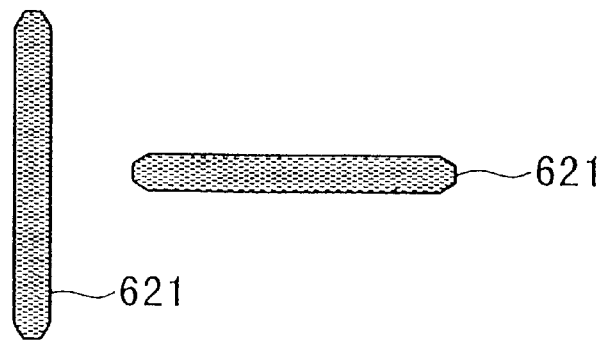
FIG. 62 is a pattern view illustrating the pattern predicting process according to a twelfth embodiment of the present invention.
Figure 63:
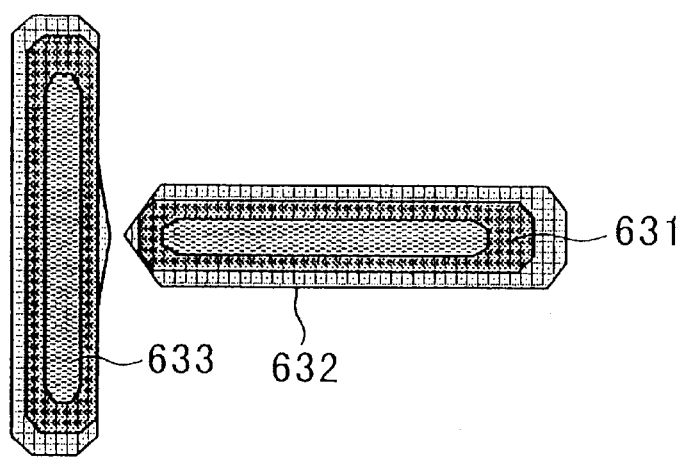
FIG. 63 is a synthesized pattern view illustrating a concrete example of pattern predicting specification according to a twelfth embodiment of the present invention.

FIG. 59 shows an input layout pattern, that is, a layout pattern to be subjected to inspection. FIGS. 60–62 show predicted finished patterns predicted under different conditions. FIG. 63 is provided to explain a concrete example of pattern predicting specification according to this embodiment, in which FIGS. 60–62 are overlapped.

When pattern distortion is to be inspected under a plurality of conditions, the most largely distorted predicted pattern is often obtained from throughout a plurality of conditions.

The smallest pattern can be obtained by AND processing of all predicted finished patterns (predicted pattern 633 in FIG. 63) and the largest pattern by OR processing of all predicted finished patterns (predicted pattern 632 in FIG. 63).

Figure 64:
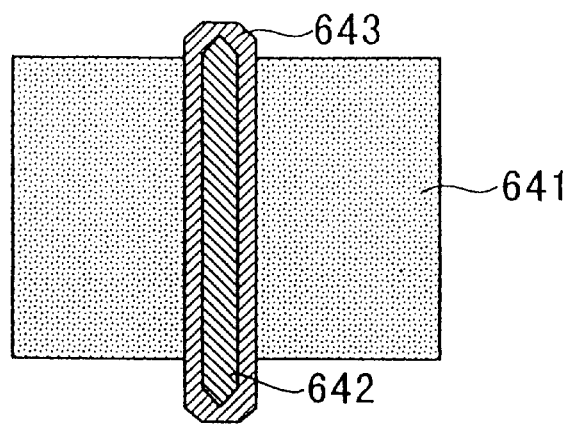
FIG. 64 shows a concrete example of pattern predicting specification according to a twelfth embodiment of the present invention.

Furthermore, according to the present invention, as shown in FIG. 64, more accurate prediction can be achieved by using a predicted finished pattern 641 in FIG. 64 of the active area 581 in place of the active area 581 in FIG. 58 of the eleventh embodiment and performing graphical operations between the predicted finished patterns and the predicted patterns 642 and 643. FIG. 64 is provided to illustrate a concrete example of pattern predicting specification according to this embodiment.

For reference, in summarizing one aspect of the twelfth embodiment, in the pattern distortion detecting apparatus, a highly-defined finished pattern predicting means is provided to perform graphical operations among a plurality of polygonized predicted finished patterns generated corresponding to a plurality of optical conditions and/or a plurality of pattern forming process conditions and outputting the results as a predicted finished pattern.

Thirteenth Embodiment

It is obvious that a similar effect can be obtained by the respective combinations of the tenth to twelfth embodiments. The configuration is the same as that shown in FIG. 56.

Although only detection of pattern distortion parts has been described in the tenth to thirteenth embodiments, it is obvious that design layout pattern data can be automatically corrected based on the detection results.

Fourteenth Embodiment

In the respective embodiments described hereinbefore, typically in the first embodiment for example, regions of the predicted finished patterns where there is a pattern distortion from the design layout pattern larger than the allowable range are detected by predicting the finished patterns from the design layout pattern and performing logical figure operations between the predicted finished patterns and the design layout pattern (See FIG. 1).

For example, in the sixth embodiment, regions of the predicted finished patterns where there is a pattern distortion from the reference layout pattern larger than the allowable range are detected by predicting the finished predicted patterns based on the inspection layout pattern and performing logical figure operations between the finished predicted patterns and the reference layout pattern (See FIG. 16).

However, in these embodiments, it is impossible to inspect how finished patterns differ among a plurality of different process conditions and/or a plurality of different inspection layout pattern generation methods.

The fourteenth embodiment described hereinafter is performed to improve the above situation. This embodiment is intended to inspect differences among the respective results obtained under various conditions by performing graphical operations on a plurality of finished predicted patterns generated under the various conditions to detect regions that are different among a plurality of the finished predicted patterns.

Figure 65:
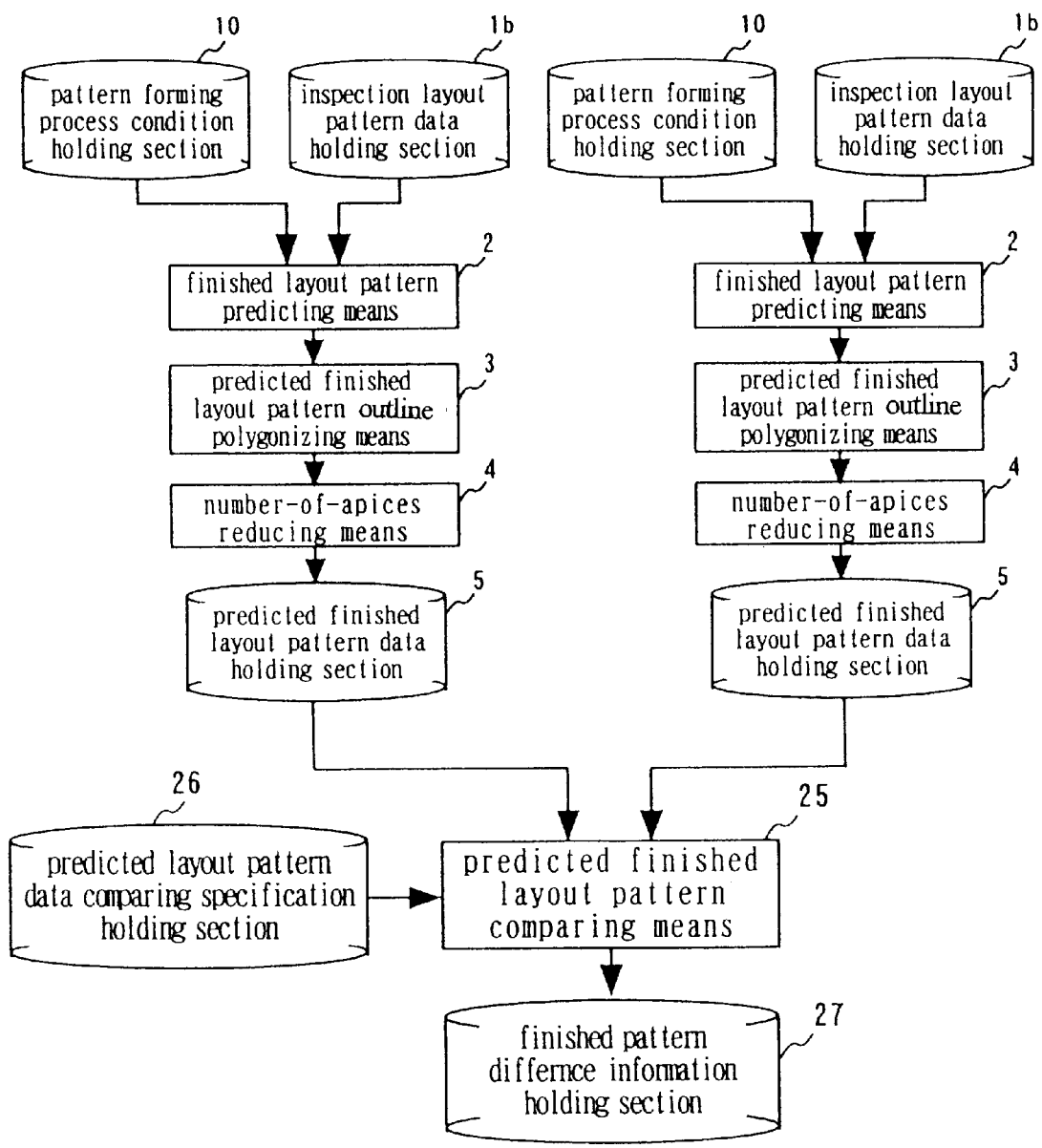
FIG. 65 is a block diagram showing the configuration of a pattern distortion detecting apparatus according to a thirteenth embodiment of the present invention.

FIG. 65 is a block diagram showing the configuration of the pattern distortion detecting apparatus according to the fourteenth embodiment.

Although the inspection layout pattern data holding section 1b, the pattern forming process conditions holding section 10, the finished pattern predicting means 2, the predicted finished pattern outlines polygonizing means 3, the number-of-apices reducing means 4, and the predicted finished pattern data holding section 5 in FIG. 65 are similar to those in FIG. 16, there are provide two sets in FIG. 65.

In addition, a predicted finished pattern comparing means 25 is newly connected to a plurality of predicted finished pattern data holding sections 5. To the predicted finished pattern comparing means 25, a predicted pattern data comparing specification holding section 26 is also connected as an input and a finished pattern difference information holding section 27 is connected as an output.

Thus, the fourteenth embodiment is characterized in that the predicted finished pattern comparing means 25 is incorporated, which is connected to a plurality of predicted finished pattern data holding sections 5 and the predicted finished pattern data comparing specification holding section 26 as its inputs.

The operation will be described below.

Figure 66:
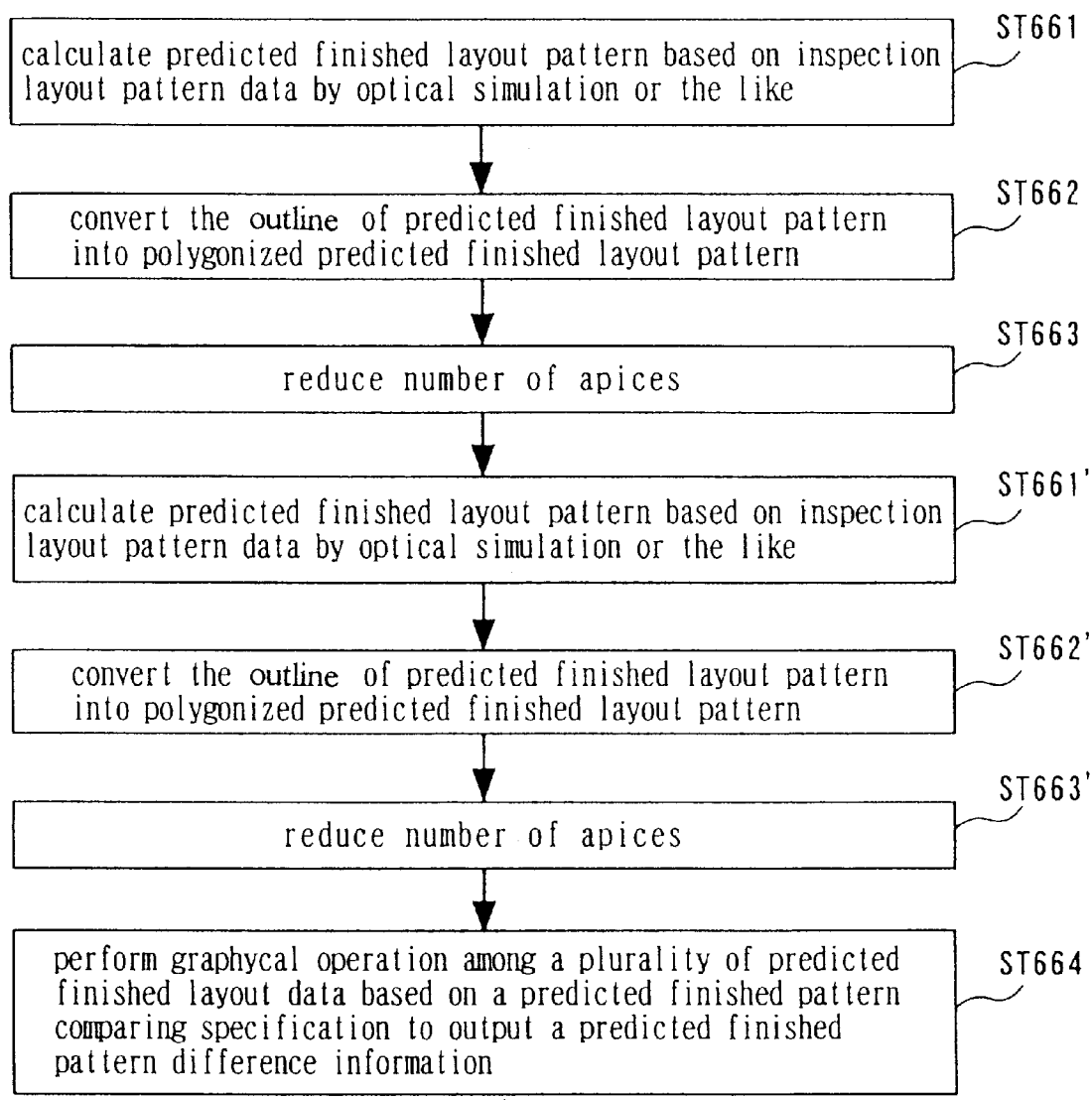
FIG. 66 is a flowchart showing the operation of the pattern distortion detecting apparatus according to a thirteenth embodiment of the present invention.
Figure 67:
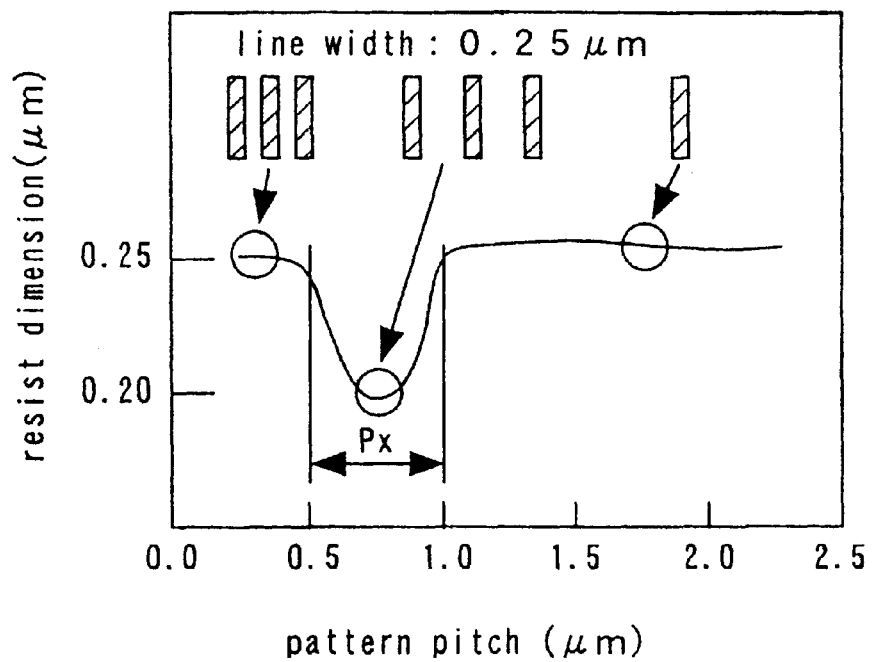
FIG. 67 shows an example of the optical proximity effect in pattern formation.
Figure 68:
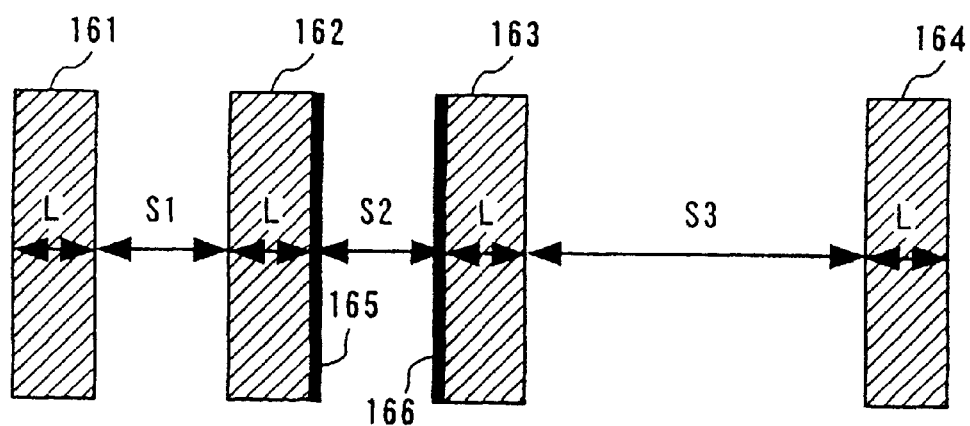
FIG. 68 shows an example of a pitch inspection method.
Figure 69:
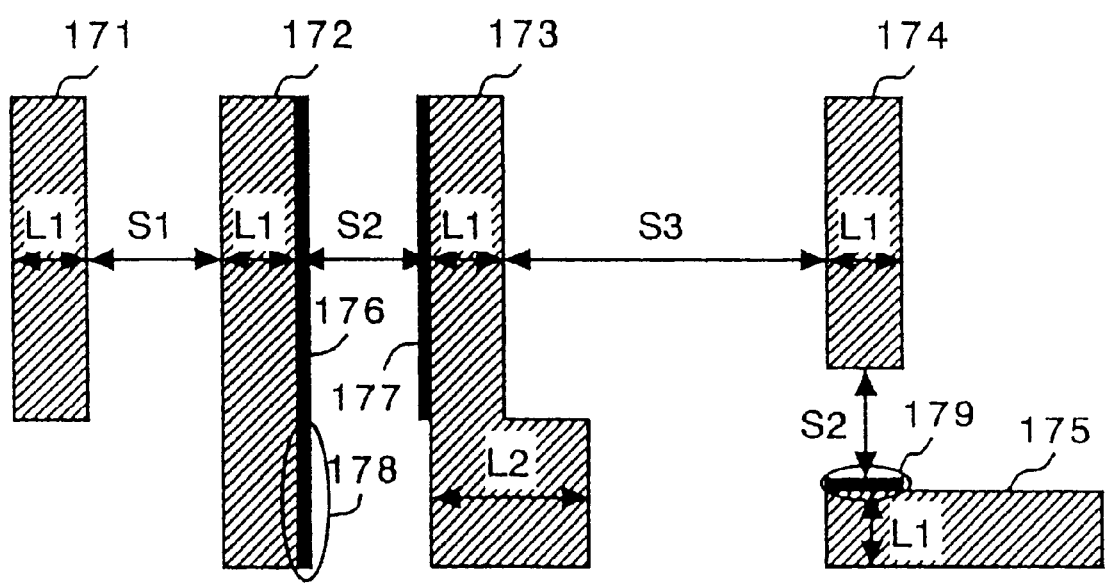
FIG. 69 shows a problem of the conventional pitch inspection method.

FIG. 66 is a flowchart showing the operation of the pattern distortion detecting apparatus having the above configuration. Steps 661 to 663 (ST661 to ST663) and steps 661' to 663' (ST661' jto ST663') in FIG. 66 are the same as steps 21 to 23 (ST21 to ST23) in FIG. 2. However, "the design layout pattern" for the step 21 in FIG. 2 should be read as "inspection layout pattern" in FIG. 66.

The steps 661 to 663 (ST661 to ST663) differ from the steps 661' to 663' (ST661' to ST663') only in the inspection layout pattern data or/and pattern forming process conditions respectively employed.

Then, in step 664 (ST664), graphical operations are performed among a plurality of predicted finished pattern data based on the predicted finished pattern comparing specification supplied from the predicted finished pattern data comparing specification holding section 26, and the results are output as the predicted finished pattern difference information and stored in the predicted finished pattern difference information holding section 27.

As mentioned above, the fourteenth embodiment is characterized in that it comprises a plurality of sets of the operation in the steps 661 to 663 (ST661 to ST663) and that it also comprises the step 664 (ST664) to detect differences by performing graphical operations among a plurality of predicted finished patterns thus obtained.

In other words, in this embodiment, XOR processing is performed between two finished pattern data and the results are output.

Next, a modification of this embodiment will be described.

A specific predicted finished pattern is selected, as one aspect for comparison among a plurality of predicted finished patterns, from a plurality of predicted finished patterns, and a test reference pattern is generated based on the selected pattern. The test reference pattern is compared with a plurality of predicted finished patterns, or graphical operations are performed among a plurality of predicted finished pattern data.

In this case, as test reference patterns, a upper limit test reference pattern to define the allowable upper limit larger than the specific predicted finished pattern and a lower limit test reference pattern to define the allowable lower limit smaller than the specific predicted finished pattern are generated. Then, the upper and lower test reference patterns are compared with a plurality of predicted finished patterns by NOT processing.

Since this process is similar to that described in the first embodiment referring to FIGS. 2 (ST24), 6, 7, etc., the detailed description is omitted.

As mentioned above, according to this embodiment, regions that are different among a plurality of predicted finished patterns can be detected. It is also apparent that different regions thus detected can be classified as described below.

It is possible to sort according to whether finished patterns are shrunk or expanded as compared with the inspection layout pattern, to sort pattern distortion information by logical operations between pattern distortion and other design layers, and to sort the importance of pattern distortion by the logical operations. Since these are already described in the sixth and seventh embodiments, they will not be explained further.

As mentioned above, according to this embodiment, regions that are different among the predicted pattern data can be detected by predicting a plurality of finished patterns corresponding to a plurality of different pattern forming process conditions and/or a plurality of inspection layout pattern data and performing graphical operations on a plurality of predicted finished pattern data thus predicted.

Incidentally, each of the above-described pattern distortion detecting apparatus and method of the present invention is effectively used for manufacture of a semiconductor device. In a semiconductor manufacturing process, many patterns are formed by a photolithography technique or the like and there are many pattern forming processes such as an etching process. The pattern distortion detecting apparatus and method of the invention can be used to accurately form ultra-fine patterns in those many pattern forming processes. Further, such a manufacturing process can produce a semiconductor device in which fine patterns with few distortions are formed.

The present invention is constituted as illustrated in each of the above embodiments, and the effects and advantages of the present invention may be summarized as follows.

The pattern distortion detecting apparatus and method of the present invention can detect a pattern distortion with high accuracy by comparing highly accurately predicted finished pattern data that are calculated by using an optical intensity simulation or the like with test reference pattern data that are generated from design layout pattern data.

A pattern distortion can be detected by directly comparing predicted finished pattern data with design layout pattern data. In particular, a pattern distortion can be detected with high accuracy in connection with the pattern line width.

In the pattern distortion detecting apparatus and method of the present invention, since the number of apices of predicted finished patterns is reduced, a general-purpose design rule check program can be used for the generation of test reference patterns and the comparison between the test reference patterns and predicted patterns.

In the pattern distortion detecting apparatus and method of the present invention, since pattern distortion upper limit test reference patterns and pattern distortion lower limit test reference patterns are formed separately, a pattern distortion can be detected with high accuracy by separately setting an allowable upper limit value and an allowable lower limit value.

In the pattern distortion detecting apparatus and method of the present invention, since test reference patterns are deformed so as not to detect a pattern distortion at pattern corner portions. Therefore, only a pattern distortion relating to a pattern line width that is required to be highly accurate can be detected with high accuracy.

In the pattern distortion detecting apparatus and method of the present invention, test reference patterns are generated merely by generating rectangles at the corners, performing graphical operations on the rectangles and design layout patterns, and then executing a sizing process. Therefore, a general-purpose design rule check program can also be used for this purpose. Thus, the system can be constructed simply and easily.

In the pattern distortion detecting apparatus and method of the present invention, since the size of rectangles generated at corner portions of a design layout pattern is adjusted in forming a test reference pattern, a pattern distortion of shorter sidelines of a pattern can also be detected with high accuracy.

In the pattern distortion detecting apparatus and method of the present invention, rectangular regions smaller than rectangular regions to be set at corner portions of a sideline are set at both corner portions of a minute step portion of a pattern in forming a test reference pattern. Therefore, also a pattern distortion at or in the vicinity of a minute step portion can be detected with high accuracy.

In the pattern distortion detecting apparatus and method of the present invention, a rectangular region smaller than rectangular regions to be set at corner portions of a sideline is set at a certain position between both corner portions of a minute step portion of a pattern in forming a test reference pattern. Therefore, also a pattern distortion at or in the vicinity of a minute step portion can be detected with high accuracy.

In the pattern distortion detecting apparatus and method of the present invention, since corner portions of a design layout pattern are deleted by cutting it obliquely in forming a test reference pattern, no graphical operations are required and hence the processing speed can be increased.

In the pattern distortion detecting apparatus and method of the present invention, for a portion of a pattern where a pattern distortion larger than the allowable range will occur, the pattern distortion can be calculated precisely by directly comparing design layout pattern data with predicted finished pattern data. A distortion amount of this portion can be reported precisely. Further, the design layout pattern data can be corrected precisely based on the reported distortion amount.

In the pattern distortion detecting apparatus and method of the present invention, the pattern distortion detecting process can judge whether the predicted pattern is shrunk or enlarged more than the design layout pattern, and the results are selected and detected. Therefore, it is possible to correct the design layout pattern data precisely.

It is possible to perform a logical operation between the pattern distortion and the other design layer, to select the pattern distortion information. Therefore, the design layout pattern data can be precisely corrected.

In the pattern distortion detecting apparatus and method of the present invention, the above described pattern distortions can be selected depending on their importance by the above described logical operation. Therefore, it is possible to correct the design layout pattern data precisely.

In the pattern distortion detecting apparatus and method of the present invention, it is possible to compute a plurality of predicted finished patterns under a plurality of optical conditions and/or a plurality of patterns forming process conditions to obtain the contrast information of the predicted finished patterns. Therefore, the design layout pattern data can be precisely corrected.

In the pattern distortion detecting apparatus and method of the present invention, it is possible to perform subtracting operation between a plurality of predicted finished patterns, and further to under-size the resulted pattern in order to detect a position with low contrast in the predicted finished pattern. Therefore, -the design layout pattern data can be precisely corrected.

In the pattern distortion detecting apparatus and the detecting method according to the present invention, a predicted finished pattern can be highly defined corresponding to process conditions, since graphical operations are performed between polygonized predicted finished patterns and a design layout pattern based on finished pattern predicting specification corresponding to a plurality of process conditions.

In the pattern distortion detecting apparatus and the detecting method according to the present invention, a predicted finished pattern can be highly defined corresponding to process conditions, since a plurality of polygonized predicted finished patterns are generated corresponding to a plurality of process conditions and graphical operations are performed between the polygonized predicted finished patterns and a design layout pattern.

In the pattern distortion detecting apparatus and the detecting method according to the present invention, a predicted finished pattern can be highly defined corresponding to process conditions, since a plurality of polygonized predicted finished patterns are generated corresponding to a plurality of process conditions and graphical operations are performed among a plurality of the predicted finished patterns.

In the pattern distortion detecting apparatus and the detecting method of the present invention, regions that are different among the predicted finished pattern can be detected by predicting a plurality of finished patterns corresponding to a plurality of pattern forming process conditions and/or a plurality of inspection layout pattern and performing graphical operations on a plurality of predicted finished pattern thus predicted in a manufacturing process for semiconductors.

In the pattern distortion detecting apparatus and the detecting method of the present invention, it is possible to inspect differences among the respective finished predicted patterns obtained under various conditions by performing graphical operations on a plurality of finished predicted patterns generated under the various conditions.

Further, it is possible to obtain a semiconductor device, by using any of the above described pattern distortion detecting apparatus and detecting method of the present invention in the pattern forming process of a semiconductor manufacturing, which is manufactured by a hyperfine pattern being formed precisely with little distortion.

Obviously many modifications and variations of the present invention are possible in the light of the above teachings. It is therefore to be understood that within the scope of the appended claims the invention may by practiced otherwise than as specifically described.

What is claimed is:

1. A pattern distortion detecting method in a semiconductor manufacturing process comprising the steps of:

forming a predicted finished layout pattern based on a design layout pattern or an inspection layout pattern;

converting an outline of said predicted finished layout pattern into a polygon to generate a polygonized predicted finished layout pattern;

detecting a pattern distortion in said predicted finished layout pattern by logical figure operation of input data of said polygonized predicted finished layout pattern or of said polygonized predicted finished layout pattern and said design layout pattern or inspection layout pattern;

forming a plurality of polygonized predicted finished patterns corresponding to a plurality of optical conditions and/or a plurality of pattern forming process conditions;

forming a plurality of highly-defined predicted finished patterns by performing graphical operations between each of a plurality of said polygonized predicted finished patterns and said design layout patterns or inspection layout patterns; and merging said plurality of highly-defined predicted finished patterns.

2. The pattern distortion detecting method according to claim 1, wherein the step of converting the outline of the predicted finished layout pattern into the polygon comprises a substep of reducing the number of apices of the polygonized predicted finished layout pattern.

3. The pattern distortion detecting method according to claim 1, wherein the step of detecting a pattern distortion includes a step of forming a test reference layout pattern based on said design layout pattern or a reference layout pattern, and a step of detecting a pattern distortion in said predicted finished layout pattern by comparing said polygonized predicted finished layout pattern with said test reference layout pattern, wherein said step of forming a test reference layout pattern comprises a substep of generating, as the test reference layout pattern, an upper limit test reference layout pattern for defining an allowable upper limit by enlarging the design layout pattern, and a substep of generating, as the test reference layout pattern, a lower limit test reference layout pattern for defining an allowable lower limit by reducing the design layout pattern.

4. The pattern distortion detecting method according to claim 3, wherein the substep of generating an upper limit test reference layout pattern generates an upper limit test reference pattern by adding rectangular regions having a predetermined size to the design layout pattern at corner portions thereof and increasing a size of a resulting test reference layout pattern by a pattern distortion allowable amount.

5. The pattern distortion detecting method according to claim 4, wherein the size of said rectangular regions is adjusted so that adjacent ones of the rectangular regions do not overlap with each other.

6. The pattern distortion detecting method according to claim 3, wherein the substep of generating a lower limit test reference layout pattern generates the lower limit test reference layout pattern by deleting rectangular regions having a predetermined size from the design layout pattern at corner portions thereof and decreasing a size of a resulting test reference layout pattern by a pattern distortion allowable amount.

7. The pattern distortion detecting method according to claim 6, wherein the size of the rectangular regions is adjusted so that adjacent ones of the rectangular regions do not overlap with each other.

8. The pattern distortion detecting method according to claim 1, further comprising the step of:
calculating an amount of the pattern distortion, where the pattern distortion is detected, based on a difference between said design layout pattern or a reference layout pattern and said predicted finished layout pattern.

9. The pattern distortion detecting method according to claim 1, wherein the step of detecting a pattern distortion further comprises a step of detecting whether the predicted finished layout pattern shrinks or expands more than the design layout pattern by comparing the polygonized predicted finished layout pattern with a test reference layout pattern.

10. The pattern distortion detecting method according to claim 1, further comprising the step of:
performing a graphical operation between the pattern distortion of the predicted layout pattern and another design layout layer and selecting pattern distortion information based on pattern distortion information selecting conditions.

11. The pattern distortion detecting method according to claim 1, further comprising the steps of:
forming a plurality of predicted finished layout patterns to be formed based on a design layout pattern or an inspection layout pattern corresponding to a plurality of optical conditions and/or a plurality of pattern forming process conditions; and
obtaining contrast information of the predicted finished pattern based on a difference in pattern between the plurality of predicted finished layout patterns.

12. The pattern distortion detecting method according to claim 11, further comprising the step of:
detecting a low contrast part of the predicted finished pattern by under-sizing the difference in pattern between the plurality of predicted finished layout patterns.

13. The pattern distortion detecting method according to claim 1, further comprising the step of:
forming a highly defined polygonized predicted finished pattern by performing graphical operations between said polygonized predicted finished pattern and said design layout pattern or a reference layout pattern based on a finished pattern predicting specification.

14. The pattern distortion detecting method according to claim 1, further comprising the steps of:
forming a plurality of polygonized predicted finished patterns corresponding to a plurality of optical conditions and/or a plurality of pattern forming process conditions; and
performing graphical operations among a plurality of said polygonized predicted finished patterns to output the result as a predicted finished layout pattern.

15. A semiconductor device manufactured by a manufacturing process including the pattern distortion detecting method as set forth in claim 1.

16. A pattern distortion detecting method comprising the steps of:
forming a plurality of predicted finished layout patterns based on a design layout pattern or an inspection layout pattern corresponding to a plurality of optical conditions and/or a plurality of pattern forming process conditions; and
performing graphical operation of a plurality of finished predicted patterns to detect differences in regions among a plurality of the finished predicted patterns.

17. The pattern distortion detecting method according to claim 16, further comprising the steps of:
forming a test reference layout pattern based on a specific one of the predicted finished patterns;
comparing each of the predicted finished patterns with said test reference layout pattern to detect a pattern distortion.

18. The pattern distortion detecting method according to claim 17, wherein said step of forming a test reference layout pattern includes the substeps of:
forming an upper limit test reference layout pattern to define an allowable upper limit larger than the specific predicted finished pattern by a prescribed amount; and
forming a lower limit test reference layout pattern to define an allowable lower limit smaller than the specific predicted finished pattern by a prescribed amount.

19. A pattern distortion detecting apparatus for a semiconductor manufacturing process comprising:
finished pattern predicting means for predicting a finished pattern to be formed based on a design layout pattern;
predicted finished pattern polygonizing means for converting an outline of the predicted finished pattern into a polygon to generate a polygonized predicted finished pattern;
a highly-defined finished pattern predicting means configured to receive a plurality of polygonized predicted finished patterns corresponding to a plurality of optical conditions and/or a plurality of pattern forming process conditions, configured to form a plurality of highly-defined predicted finished patterns by performing graphical operations between each of a plurality of said polygonized predicted finished patterns and said design layout patter, and configured to merge said plurality of highly-defined predicted finished patterns, and output a merged highly-defined finished pattern,
pattern distortion detecting means for detecting a pattern distortion in the merged highly-defined predicted finished pattern logical figure operation of said merged highly-defined predicted finished pattern and said design layout pattern.

20. A computer program recorded media recording a computer program readable by a computer which enables pattern distortion detection in a semiconductor manufacturing process, said computer program enabling the processing of:

forming data of design layout pattern, inspection layout pattern or reference layout pattern in a memory area, forming a predicted finished layout pattern based on a design layout pattern or an inspection layout pattern;

converting an outline of said predicted finished layout pattern into a polygon to generate a polygonized predicted finished layout pattern;

forming a plurality of polygonized predicted finished patterns corresponding to a plurality of optical conditions and/or a plurality of pattern forming process conditions;

forming a plurality of highly-defined predicted finished patterns by performing graphical operations between each of a plurality of said polygonized predicted finished patterns and said design layout pattern or inspection layout pattern;

merging said plurality of highly-defined predicted finished patterns; and detecting a pattern distortion using a highly-defined predicted finished pattern output in said mergings step.

* * * * *